United States Patent
Kotake et al.

(10) Patent No.: US 11,231,650 B2
(45) Date of Patent: Jan. 25, 2022

(54) CHEMICALLY AMPLIFIED NEGATIVE RESIST COMPOSITION AND RESIST PATTERN FORMING PROCESS

(71) Applicant: Shin-Etsu Chemical Co., Ltd., Tokyo (JP)

(72) Inventors: Masaaki Kotake, Joetsu (JP); Satoshi Watanabe, Joetsu (JP); Keiichi Masunaga, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 322 days.

(21) Appl. No.: 16/419,331

(22) Filed: May 22, 2019

(65) Prior Publication Data

US 2019/0361348 A1    Nov. 28, 2019

(30) Foreign Application Priority Data

May 25, 2018 (JP) .............................. JP2018-100564

(51) Int. Cl.
| | | |
|---|---|---|
| *G03F 7/038* | (2006.01) | |
| *C08F 212/14* | (2006.01) | |
| *C08F 220/30* | (2006.01) | |
| *G03F 7/004* | (2006.01) | |
| *G03F 1/60* | (2012.01) | |
| *G03F 7/16* | (2006.01) | |
| *G03F 7/20* | (2006.01) | |
| *G03F 7/32* | (2006.01) | |
| *G03F 7/38* | (2006.01) | |

(52) U.S. Cl.
CPC .......... *G03F 7/0382* (2013.01); *C08F 212/14* (2013.01); *C08F 220/30* (2013.01); *G03F 7/0045* (2013.01); *C08F 220/301* (2020.02); *G03F 1/60* (2013.01); *G03F 7/162* (2013.01); *G03F 7/168* (2013.01); *G03F 7/2004* (2013.01); *G03F 7/2006* (2013.01); *G03F 7/2037* (2013.01); *G03F 7/322* (2013.01); *G03F 7/38* (2013.01)

(58) Field of Classification Search
CPC .... G03F 7/0382; C08F 212/14; C08F 220/30; C07C 309/12; C07C 381/12
See application file for complete search history.

(56) References Cited

U.S. PATENT DOCUMENTS

| | | | |
|---|---|---|---|
| 8,361,693 B2 | 1/2013 | Masunaga et al. | |
| 8,900,791 B2 * | 12/2014 | Tsuchimura | C07C 309/39 430/270.1 |
| 9,075,306 B2 | 7/2015 | Takeda et al. | |
| 9,604,921 B2 * | 3/2017 | Domon | G03F 7/038 |
| 9,645,493 B2 * | 5/2017 | Domon | G03F 1/78 |
| 9,958,775 B2 * | 5/2018 | Tsuruta | G03F 7/0397 |
| 9,969,829 B2 * | 5/2018 | Domon | C08F 212/14 |
| 2006/0166133 A1 | 7/2006 | Koitabashi et al. | |
| 2016/0090355 A1 | 3/2016 | Domon et al. | |
| 2018/0039175 A1 | 2/2018 | Masunaga et al. | |

FOREIGN PATENT DOCUMENTS

| | | |
|---|---|---|
| EP | 1684118 A1 | 7/2006 |
| EP | 1975711 A1 | 10/2008 |
| EP | 2264525 A2 | 12/2010 |
| EP | 2328864 A1 | 6/2011 |
| JP | 2006-201532 A | 8/2006 |
| JP | 2006-215180 A | 8/2006 |
| JP | 2008-249762 A | 10/2008 |
| JP | 2009-53518 A | 3/2009 |
| JP | 2010-100604 A | 5/2010 |
| JP | 2011-022564 A | 2/2011 |
| JP | 5083528 B2 | 11/2012 |
| JP | 6248882 B2 | 12/2017 |
| TW | 201617313 A | 5/2016 |
| TW | 201812450 A | 4/2018 |

OTHER PUBLICATIONS

Machine translation of TW 2016-17313 (no date).*
Office Action dated Jul. 9, 2020, issued in counterpart TW Application No. 108117419 (11 pages).

* cited by examiner

*Primary Examiner* — Amanda C. Walke
(74) *Attorney, Agent, or Firm* — Westerman, Hattori, Daniels & Adrian, LLP

(57) ABSTRACT

A negative resist composition comprising an onium salt of arenesulfonic acid having a bridged ring-containing group and a base polymer is provided, the onium salt being capable of generating a bulky acid having an appropriate strength and controlled diffusion. When the resist composition is processed by lithography, a dot pattern of rectangular profile having high resolution and reduced LER is formed.

17 Claims, No Drawings

CHEMICALLY AMPLIFIED NEGATIVE RESIST COMPOSITION AND RESIST PATTERN FORMING PROCESS

CROSS-REFERENCE TO RELATED APPLICATION

This non-provisional application claims priority under 35 U.S.C. § 119(a) on Patent Application No. 2018-100564 filed in Japan on May 25, 2018, the entire contents of which are hereby incorporated by reference.

TECHNICAL FIELD

This invention relates to a chemically amplified negative resist composition and resist pattern forming process.

BACKGROUND ART

To meet the recent demand for higher integration in integrated circuits, formation of circuit patterns having a finer size is required. Acid-catalyzed chemically amplified resist compositions are most often used in forming resist patterns with a feature size of 0.2 μm or less. High-energy radiation such as UV, deep-UV or electron beam (EB) is used as the energy source for exposure of these resist compositions. In particular, while EB lithography is utilized as the ultra-fine microfabrication technique, it is also indispensable in processing a photomask blank to form a photomask for use in semiconductor device fabrication.

Polymers comprising a major proportion of aromatic structure having an acidic side chain, for example, polyhydroxystyrene are useful in resist materials for the KrF lithography. These polymers are not used in resist materials for the ArF lithography since they exhibit strong absorption at a wavelength of around 200 nm. These polymers, however, are expected to form useful resist materials for the EB and EUV lithography for forming patterns of finer size than the processing limit of ArF lithography because they offer high etching resistance.

Resist compositions for use in photolithography include positive ones in which exposed areas are dissolved away and negative ones in which exposed areas are left as a pattern. A viable composition is selected among them depending on the desired resist pattern. In general, the chemically amplified negative resist composition comprises a polymer which is normally soluble in an aqueous alkaline developer, an acid generator which is decomposed to generate an acid upon exposure to light, and a crosslinker which causes the polymer to crosslink in the presence of the acid serving as a catalyst, thus rendering the polymer insoluble in the developer (sometimes, the crosslinker is incorporated in the polymer). Typically a quencher is added for controlling the diffusion of the acid generated upon light exposure.

Typical of the alkali-soluble units to constitute polymers which dissolve in aqueous alkaline developer are units derived from phenols. A number of negative resist compositions of such type were developed, especially as adapted for exposure to KrF excimer laser light. These compositions have not been used in the ArF excimer laser lithography because the phenolic units are not transmissive to exposure light having a wavelength of 150 to 220 nm. Recently, these compositions are recognized attractive again as the negative resist composition for the short wavelength (e.g., EB or EUV) lithography capable of forming finer size patterns. Exemplary compositions are described in Patent Documents 1 to 3.

In the processing of photomasks, it is required that the profile of a resist pattern do not change depending on the time until PEB. The major factor causing such a change with time is the diffusion of acid generated upon exposure. Great efforts are made to address the problem of acid diffusion because the acid diffusion has a noticeable impact not only on the photomask processing, but also on the sensitivity and resolution of ordinary resist compositions.

Patent Documents 4 and 5 describe acid generators capable of generating bulky acids for controlling acid diffusion and reducing roughness. Since these acid generators are still insufficient to control acid diffusion, it is desired to have an acid generator capable of generating an acid with more controlled diffusion.

Patent Document 6 discloses a resist composition comprising a base resin to which a sulfonic acid to be generated upon light exposure is bound so that the acid diffusion is controlled. This approach of controlling acid diffusion by binding recurring units capable of generating acid upon exposure to a base polymer is effective in forming a pattern with minimal LER. However, a problem arises with respect to the solubility in organic solvent of the base polymer having bound therein recurring units capable of generating acid upon exposure, depending on the structure and proportion of such recurring units.

Patent Document 7 describes a sulfonium salt capable of generating an acid having a high pKa such as fluoroalkanesulfonic acid. Regrettably, the pattern obtained therefrom has substantial LER because unwanted crosslinking reaction takes place in the unexposed region. Even if acid diffusion is controlled, crosslinking reaction takes place in the unexposed region with a minor amount of acid diffused thereto.

CITATION LIST

Patent Document 1: JP-A 2006-201532 (US 20060166133, EP 1684118)
Patent Document 2: JP-A 2006-215180
Patent Document 3: JP-A 2008-249762 (U.S. Pat. No. 9,075,306, EP 1975711)
Patent Document 4: JP-A 2009-053518
Patent Document 5: JP-A 2010-100604 (U.S. Pat. No. 8,900,791, EP 2328864)
Patent Document 6: JP-A 2011-022564 (U.S. Pat. No. 8,361,693, EP 2264525)
Patent Document 7: JP 5083528
Patent Document 8: JP 6248882 (U.S. Pat. No. 9,604,921)

DISCLOSURE OF INVENTION

Recently, there is the demand for resist compositions capable of forming not only line-and-space (LS), isolated line (IL) and isolated space (IS) patterns of satisfactory profile, but also hole and dot patterns of satisfactory profile. Patent Document 8 describes an acid generator capable of generating a bulky acid with controlled diffusion, from which patterns having satisfactory resolution and roughness are obtainable, but the formation of hole and dot patterns is accompanied with corner rounding.

An object of the invention is to provide a chemically amplified negative resist composition comprising an onium salt capable of generating an acid having an appropriate strength and controlled diffusion, and a resist pattern forming process using the resist composition.

The inventors have found that an onium salt of arenesulfonic acid having a bridged ring-containing group generates a bulky acid which is controlled in diffusion, a pattern with high resolution and minimal LER is obtainable from a resist composition comprising the onium salt, and especially, a dot pattern of rectangular profile is obtainable by virtue of properly inhibited dissolution.

In one aspect, the invention provides a chemically amplified negative resist composition comprising (A) an acid generator containing an onium salt having the formula (A) and (B) a base polymer containing a polymer comprising recurring units having the formula (B1).

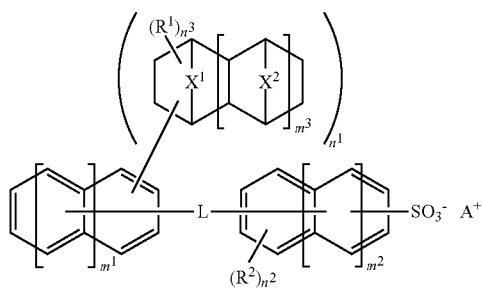

(A)

Herein $X^1$ and $X^2$ are each independently methylene, propane-2,2-diyl or ether bond; L is a single bond, ester bond, sulfonic acid ester bond, carbonate bond or carbamate bond; $R^1$ and $R^2$ are each independently a $C_1$-$C_{20}$ monovalent hydrocarbon group which may contain a heteroatom; $m^1$ and $m^2$ are each independently an integer of 0 to 2, $m^3$ is 0 or 1, $n^1$ is an integer satisfying $1 \leq n^1 \leq 5+2m^1$, $n^2$ is an integer satisfying $0 \leq n^2 \leq 4+2m^2$, $n^3$ is an integer satisfying $0 \leq n^3 \leq 8+4m^3$; $A^+$ is a sulfonium cation having the formula (A-A), an iodonium cation having the formula (A-B), or an ammonium cation having the formula (A-C):

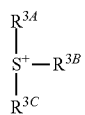

(A-A)

(A-B)

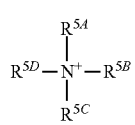

(A-C)

wherein $R^{3A}$, $R^{3B}$, $R^{3C}$, $R^{4A}$, $R^{4B}$, $R^{5A}$, $R^{5B}$, and $R^{5C}$ are each independently a $C_1$-$C_{20}$ monovalent hydrocarbon group which may contain a heteroatom, $R^{5D}$ is hydrogen or a $C_1$-$C_{20}$ monovalent hydrocarbon group which may contain a heteroatom, any two of $R^{3A}$, $R^{3B}$ and $R^{3C}$ or any two of $R^{5A}$, $R^{5B}$, $R^{5C}$ and $R^{5D}$ may bond together to form a ring with the sulfur or nitrogen atom to which they are attached.

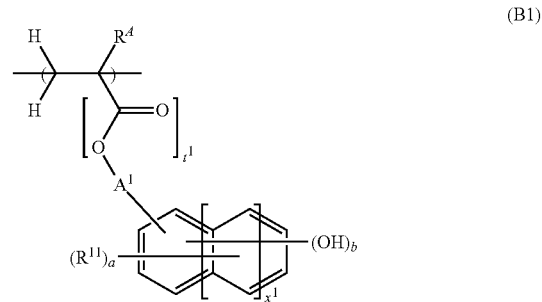

(B1)

wherein $R^A$ is hydrogen, fluorine, methyl or trifluoromethyl; $R^{11}$ is each independently halogen, an optionally halogenated $C_2$-$C_8$ acyloxy group, optionally halogenated $C_1$-$C_6$ alkyl group, or optionally halogenated $C_1$-$C_6$ alkoxy group; $A^1$ is a single bond or $C_1$-$C_{10}$ alkanediyl group in which an ether bond may intervene in a carbon-carbon bond; $t^1$ is 0 or 1, $x^1$ is an integer of 0 to 2, a is an integer satisfying $0 \leq a \leq 5+2x^1-b$, and b is an integer of 1 to 3.

In a preferred embodiment, the polymer further comprises recurring units of at least one type selected from recurring units having the formula (B2), recurring units having the formula (B3), and recurring units having the formula (B4).

(B2)

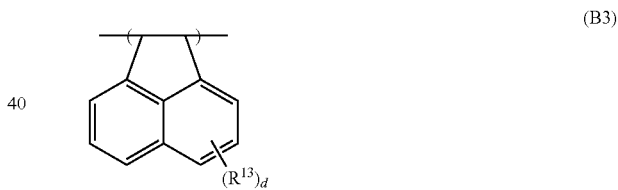

(B3)

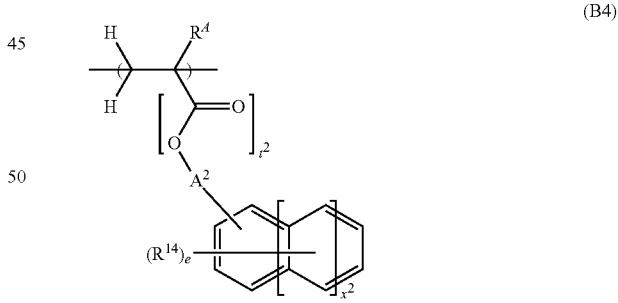

(B4)

Herein $R^A$ is as defined above; $R^{12}$ and $R^{13}$ are each independently hydroxyl, halogen, acetoxy, an optionally halogenated $C_1$-$C_8$ alkyl group, optionally halogenated $C_1$-$C_8$ primary alkoxy group, optionally halogenated $C_2$-$C_8$ secondary alkoxy group, optionally halogenated $C_2$-$C_8$ acyloxy group, or optionally halogenated $C_2$-$C_8$ alkylcarbonyloxy group; $R^{11}$ is an acetyl group, acetoxy group, $C_1$-$C_{20}$ alkyl group, $C_1$-$C_{20}$ primary alkoxy group, $C_2$-$C_{20}$ secondary alkoxy group, $C_2$-$C_{20}$ acyloxy group, $C_2$-$C_{20}$ alkoxyalkyl group, $C_2$-$C_{20}$ alkylthioalkyl group, halogen, nitro group or cyano group; $A^2$ is a single bond or $C_1$-$C_{10}$ alkanediyl group in which an ether bond may intervene in a carbon-carbon bond; c and d are each independently an integer of 0 to 4, e is an integer of 0 to 5, $x^2$ is an integer of 0 to 2, and $t^2$ is 0 or 1.

In a preferred embodiment, the polymer further comprises recurring units having the formula (B5).

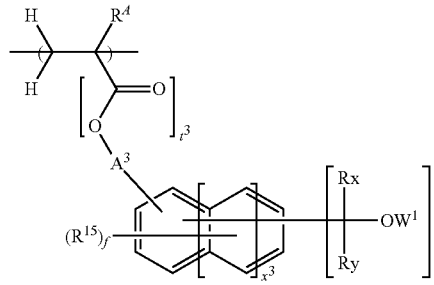
(B5)

Herein $R^A$ is as defined above; $A^3$ is a single bond or $C_1$-$C_{10}$ alkanediyl group in which an ether bond may intervene in a carbon-carbon bond; $R^{15}$ is each independently halogen, an optionally halogenated $C_2$-$C_8$ acyloxy group, optionally halogenated $C_1$-$C_6$ alkyl group, or optionally halogenated $C_1$-$C_6$ alkoxy group; $W^1$ is hydrogen, a $C_1$-$C_{10}$ aliphatic monovalent hydrocarbon group in which an ether bond, carbonyl moiety or carbonyloxy moiety may intervene in a carbon-carbon bond, or an optionally substituted monovalent aromatic group; Rx and Ry are each independently hydrogen, an optionally hydroxy or alkoxy-substituted $C_1$-$C_{15}$ alkyl group, or an optionally substituted monovalent aromatic group, excluding that both Rx and Ry are hydrogen at the same time, or Rx and Ry may bond together to form a ring with the carbon atom to which they are attached; $x^3$ is an integer of 0 to 2, $t^3$ is 0 or 1, f is an integer satisfying $0 \leq f \leq 5+2x^3-g$, and g is an integer of 1 to 3.

In a more preferred embodiment, the polymer further comprises recurring units of at least one type selected from units having the formulae (B6) to (B11).

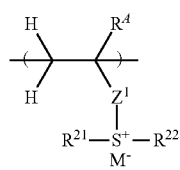
(B6)

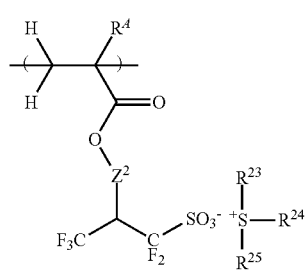
(B7)

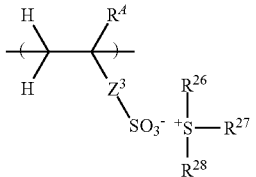
(B8)

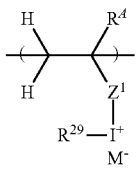
(B9)

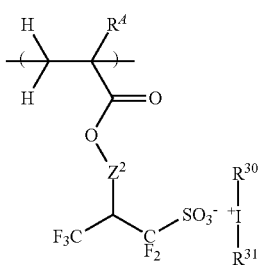
(B10)

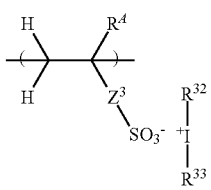
(B11)

Herein $R^A$ is as defined above; $Z^1$ is each independently a single bond, phenylene group, —O—$Z^{11}$—, —C(=O)—O—$Z^{11}$— or —C(=O)—NH—$Z^{11}$—, $Z^{11}$ is a $C_1$-$C_6$ alkanediyl, $C_2$-$C_6$ alkenediyl or phenylene group, which may contain a carbonyl, ester bond, ether bond or hydroxyl moiety; $Z^2$ is each independently a single bond or —$Z^{21}$—C(=O)—O—, $Z^{21}$ is a $C_1$-$C_{20}$ divalent hydrocarbon group which may contain a heteroatom; $Z^3$ is each independently a single bond, methylene, ethylene, phenylene, fluorinated phenylene, —O—$Z^{31}$—, —C(=O)—O—$Z^{31}$—, or —C(=O)—NH—$Z^{31}$—, $Z^{31}$ is a $C_1$-$C_6$ alkanediyl, $C_2$-$C_6$ alkenediyl or phenylene group, which may contain a carbonyl, ester bond, ether bond or hydroxyl moiety; $R^{21}$ to $R^{33}$ are each independently a $C_1$-$C_{20}$ monovalent hydrocarbon group which may contain a heteroatom, or $R^{21}$ and $R^{22}$ may bond together to form a ring with the sulfur atom to which they are attached, or any two of $R^{23}$, $R^{24}$ and $R^{25}$ may bond together to form a ring with the sulfur atom to which they are attached, any two of $R^{26}$, $R^{27}$ and $R^{28}$ may bond together to form a ring with the sulfur atom to which they are attached; and $M^-$ is a non-nucleophilic counter ion.

In a more preferred embodiment, the polymer comprises recurring units having the formula (B1-1), recurring units having the formula (B5-1), and recurring units having the formula (B7) or (B10):

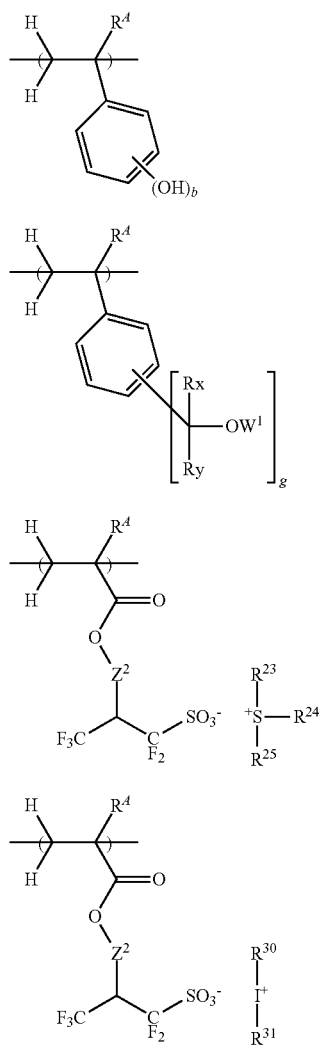

(B1-1)

(B5-1)

(B7)

(B10)

wherein $R^A$, $Z^2$, $R^{23}$, $R^{24}$, $R^{25}$, $R^{30}$, $R^{31}$, Rx, Ry, $W^1$, b, and g are as defined above.

In a preferred embodiment, the polymer comprises recurring units having the formula (B1) and recurring units having the formula (B5), but not recurring units having the formulae (B6) to (B11).

The resist composition may further comprise (C) a crosslinker. Alternatively, the resist composition is free of a crosslinker.

The resist composition may further comprise (D) a fluorinated polymer comprising recurring units having the formula (D1) and recurring units of at least one type selected from units having the formulae (D2), (D3), (D4), and (D5).

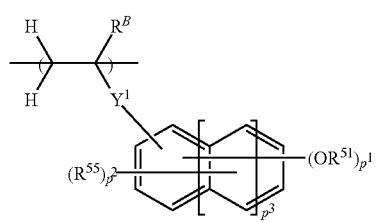

(D1)

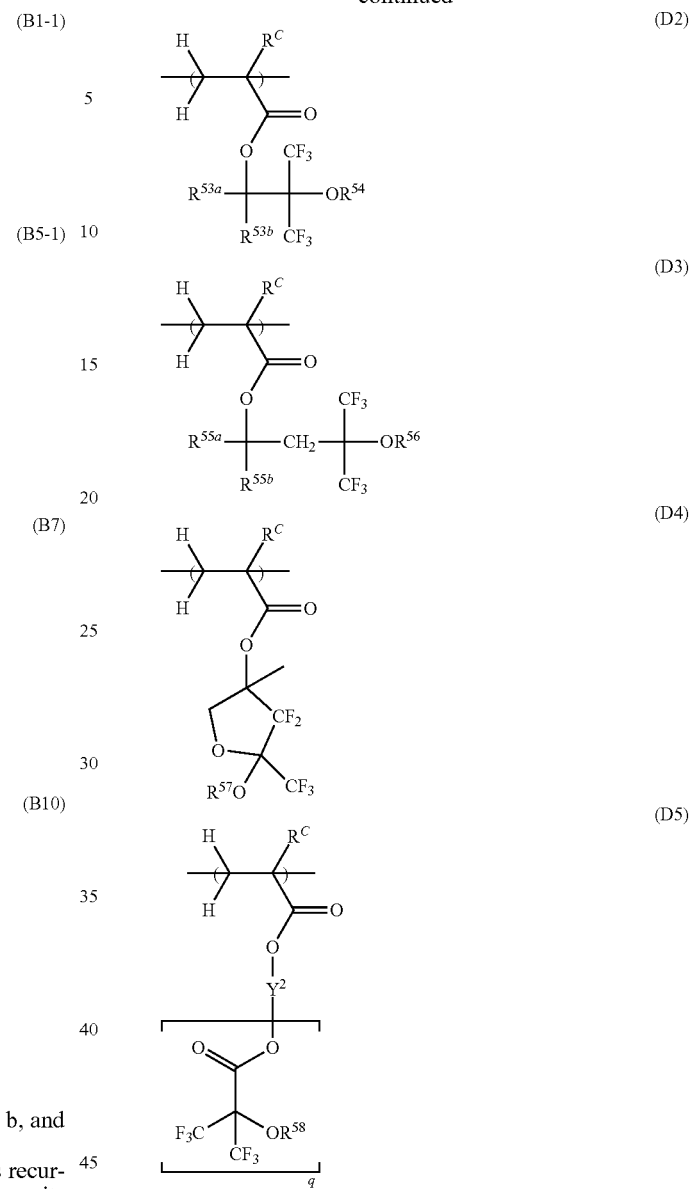

Herein $R^B$ is hydrogen or methyl; $R^C$ is each independently hydrogen, fluorine, methyl or trifluoromethyl; $R^{51}$ is hydrogen or a $C_1$-$C_5$ straight or branched monovalent hydrocarbon group in which a heteroatom-containing moiety may intervene in a carbon-carbon bond; $R^{52}$ is a $C_1$-$C_5$ straight or branched monovalent hydrocarbon group in which a heteroatom-containing moiety may intervene in a carbon-carbon bond; $R^{53a}$, $R^{53b}$, $R^{55a}$ and $R^{55b}$ are each independently hydrogen or a $C_1$-$C_{10}$ alkyl group; $R^{54}$, $R^{56}$, $R^{57}$ and $R^{58}$ are each independently hydrogen, a $C_1$-$C_{15}$ monovalent hydrocarbon group, $C_1$-$C_{15}$ monovalent fluorinated hydrocarbon group, or an acid labile group, with the proviso that an ether bond or carbonyl moiety may intervene in a carbon-carbon bond in the monovalent hydrocarbon groups or monovalent fluorinated hydrocarbon groups represented by $R^{54}$, $R^{56}$, $R^{57}$ and $R^{58}$; $Y^1$ is a single bond, —C(=O)—O— or —C(=O)—NH—; $Y^2$ is a $C_1$-$C_{20}$ (q+1)-valent hydrocarbon group or $C_1$-$C_{20}$ (q+1)-valent fluorinated hydrocarbon group; $p^1$ is an integer of 1 to 3, $p^2$ is an integer satisfying $0 \leq p^2 \leq 5+2p^3-p^1$, $p^3$ is 0 or 1, and q is an integer of 1 to 3.

The resist composition may further comprise (E) an organic solvent and/or (F) a quencher.

In another aspect, the invention provides a resist pattern forming process comprising the steps of:

applying the chemically amplified negative resist composition of any one of claims 1 to 11 onto a substrate to form a resist film thereon, exposing the resist film patternwise to high-energy radiation, and developing the exposed resist film in an alkaline developer to form a resist pattern.

Typically, the high-energy radiation is KrF excimer laser, EUV or EB.

In a preferred embodiment, the substrate has an outermost surface of chromium-containing material. Typically, the substrate is a photomask blank.

Advantageous Effects of Invention

A chemically amplified negative resist composition comprising the onium salt having formula (A) as an acid generator exhibits a very high resolution when processed by the micropatterning lithography, especially KrF, EB or EUV lithography. A pattern with minimal LER is obtainable therefrom. A dot pattern of rectangular profile is obtainable.

DESCRIPTION OF PREFERRED EMBODIMENTS

As used herein, the singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not. The notation (Cn-Cm) means a group containing from n to m carbon atoms per group.

The abbreviations and acronyms have the following meaning.

PAG: photoacid generator
Mw: weight average molecular weight
Mn: number average molecular weight
Mw/Mn: molecular weight distribution or dispersity
GPC: gel permeation chromatography
PEB: post-exposure baking
LER: line edge roughness In chemical formulae, the broken line denotes a valence bond; Me stands for methyl and Ac for acetyl.

Chemically Amplified Negative Resist Composition

The chemically amplified negative resist composition of the invention is defined as comprising (A) an acid generator and (B) a base polymer.

(A) Acid Generator

Component (A) is an acid generator containing an onium salt having the formula (A).

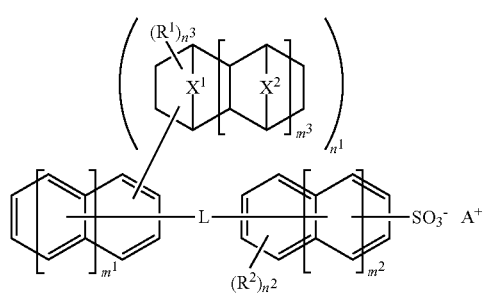

(A)

In formula (A), $X^1$ and $X^2$ are each independently methylene, propane-2,2-diyl or ether bond.

L is a single bond, ester bond, sulfonic acid ester bond, carbonate bond or carbamate bond, with the ester bond or sulfonic acid ester bond being preferred.

$R^1$ and $R^2$ are each independently a $C_1$-$C_{20}$ monovalent hydrocarbon group which may contain a heteroatom. The monovalent hydrocarbon group may be straight, branched or cyclic. Examples include alkyl groups such as methyl, ethyl, propyl, isopropyl, n-butyl, sec-butyl, t-butyl, n-pentyl, t-pentyl, n-hexyl, n-octyl, n-nonyl, n-decyl; and monovalent saturated cycloaliphatic hydrocarbon groups such as cyclopentyl, cyclohexyl, 2-ethylhexyl, cyclopentylmethyl, cyclopentylethyl, cyclopentylbutyl, cyclohexylmethyl, cyclohexylethyl, cyclohexylbutyl, norbornyl, oxanorbornyl, tricyclo[5.2.1.0$^{2,6}$]decanyl, and adamantyl.

Preferably, $R^2$ is at the ortho-position relative to the —$SO_3^-$ group. This means that the —$SO_3^-$ group which is an acid function site is blocked by steric bulkiness. An apparent effect of controlling acid diffusion is exerted.

In formula (A), $m^1$ is an integer of 0 to 2, and $n^1$ is an integer satisfying $1 \le n^1 \le 5+2m^1$. From the aspect of dissolution control during development, $m^1$ is preferably 0 or 1, especially 0. For the purpose of introducing a substituent group into the salt to impart appropriate bulkiness to the acid generated therefrom upon exposure, $n^1$ is preferably an integer of 1 to 5, more preferably 1 to 3.

In formula (A), $m^2$ is an integer of 0 to 2, and $n^2$ is an integer satisfying $0 \le n^2 \le 4+2m^2$. Preferably, $m^2$ is 0 or 1, especially 0. For the purpose of introducing a substituent group into the salt to control the diffusion of the acid generated therefrom upon exposure, $n^2$ is preferably an integer of 0 to 4, more preferably 2 or 3.

In formula (A), $m^3$ is 0 or 1, and $n^3$ is an integer satisfying $0 \le n^3 \le 8+4m^3$. From the aspect of dissolution control during development, $m^3$ is preferably 0. From the aspect of dissolution control during development, $n^3$ is preferably an integer of 0 to 3, especially 0 or 1.

In formula (A), examples of the aromatic ring structure to which the bridged ring-containing group and L are attached include structures having the formulae (A-1) to (A-13), but are not limited thereto. Herein, the broken line designates a valence bond to L.

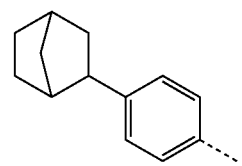

(A-1)

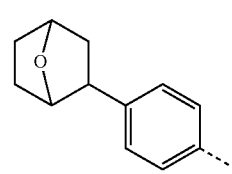

(A-2)

-continued
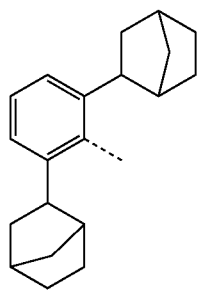
(A-3)
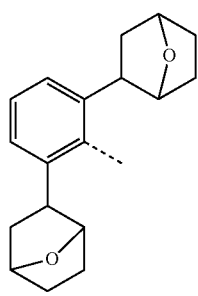
(A-4)
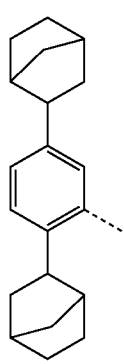
(A-5)
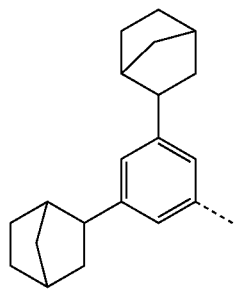
(A-6)
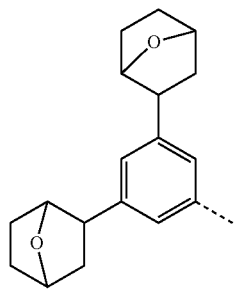
(A-7)
-continued
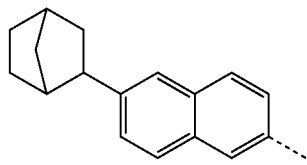
(A-8)
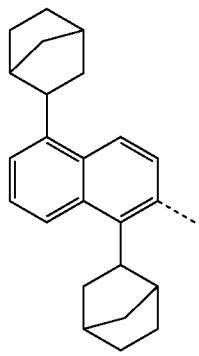
(A-9)
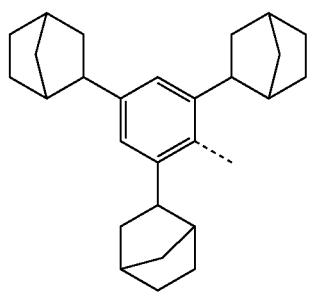
(A-10)
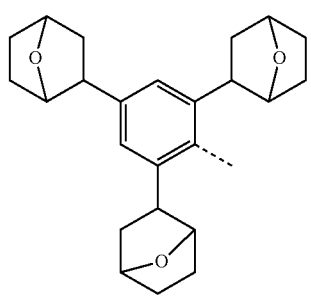
(A-11)
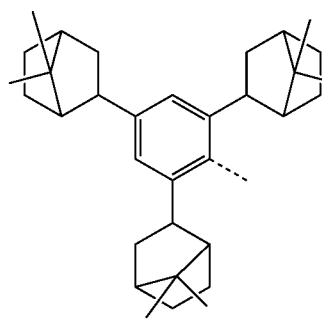
(A-12)

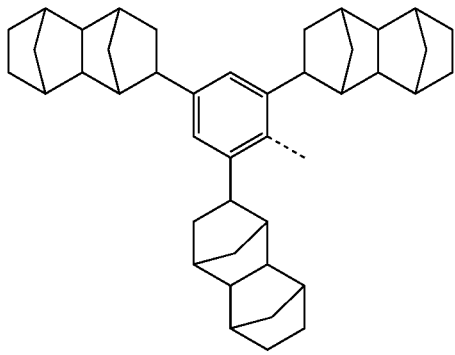
(A-13)
The preferred structures of the anion of the onium salt having formula (A) are shown below, but not limited thereto.
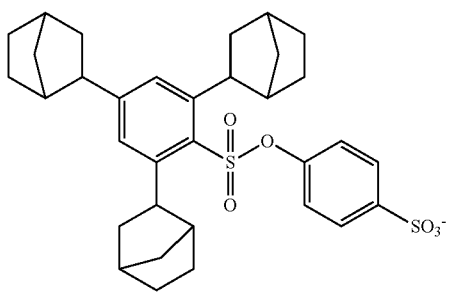
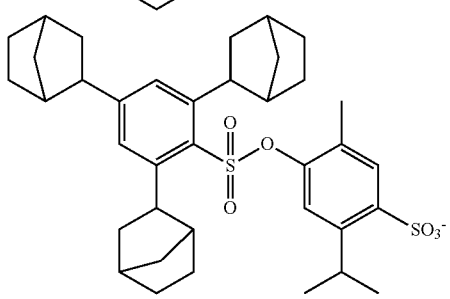
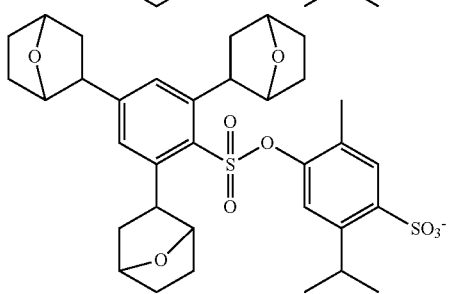
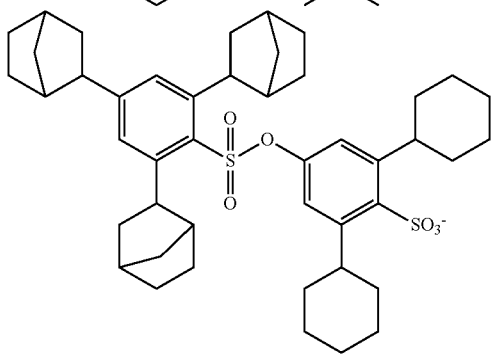
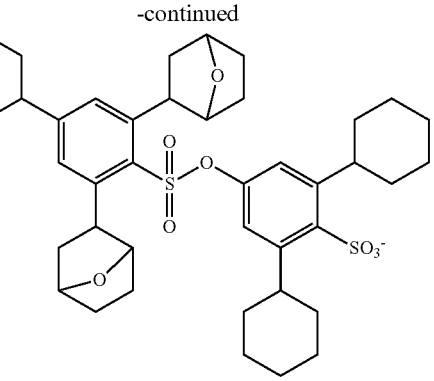
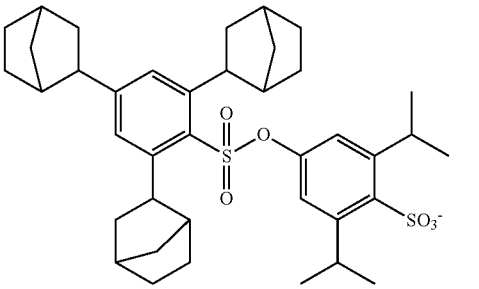
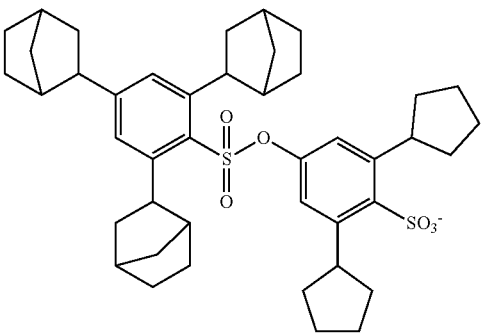
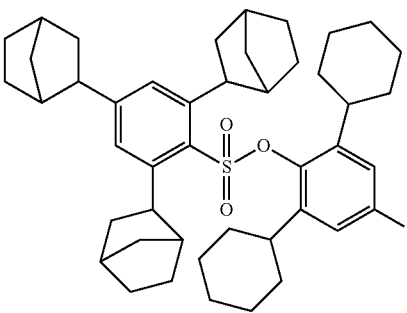
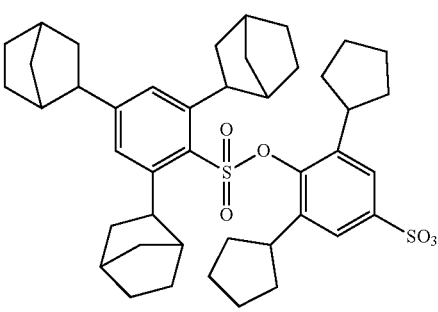

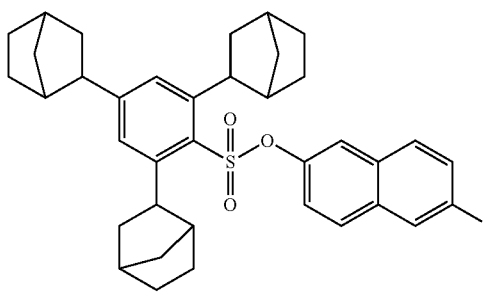
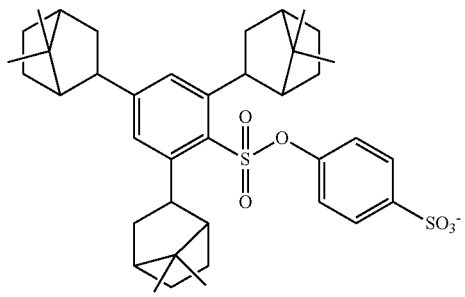
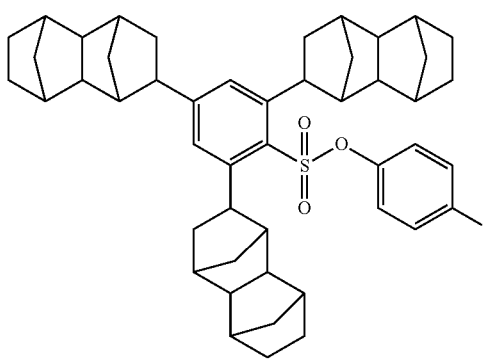
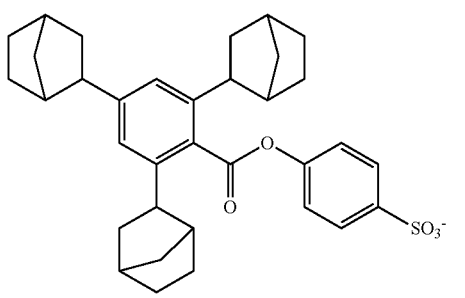
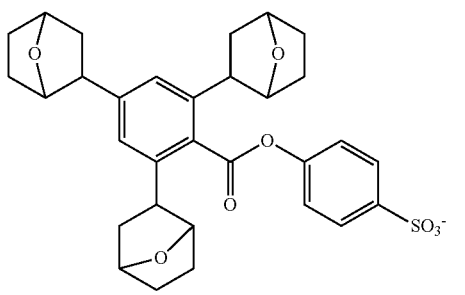

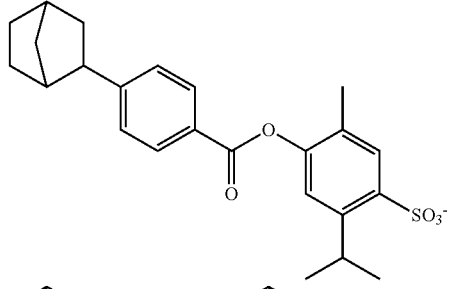
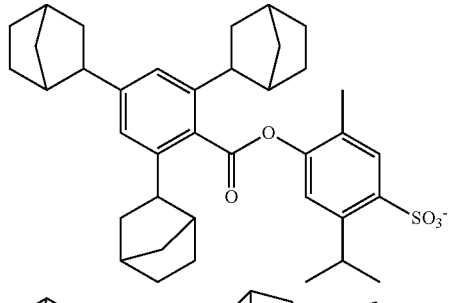
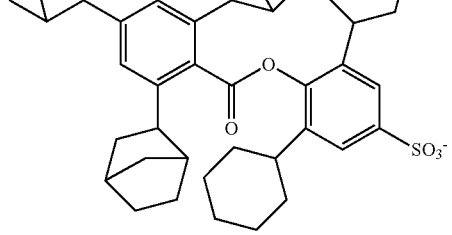

In formula (A), $A^+$ is a sulfonium cation having the formula (A-A), an iodonium cation having the formula (A-B), or an ammonium cation having the formula (A-C).

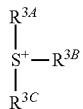
(A-A)

(A-B)

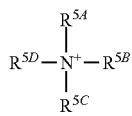
(A-C)

In formulae (A-A) to (A-C), $R^{3A}$, $R^{3B}$, $R^{3C}$, $R^{4A}$, $R^{4B}$, $R^{5A}$, $R^{5B}$ and $R^{5C}$ are each independently a $C_1$-$C_{20}$ monovalent hydrocarbon group which may contain a heteroatom. $R^{5D}$ is hydrogen or a $C_1$-$C_{20}$ monovalent hydrocarbon group which may contain a heteroatom. Any two of $R^{3A}$, $R^{3B}$, and $R^{3C}$, or any two of $R^{5A}$, $R^{5B}$, $R^{5C}$, and $R^{5D}$ may bond together to form a ring with the sulfur or nitrogen atom to which they are attached.

The monovalent hydrocarbon group may be straight, branched or cyclic. Examples include alkyl groups such as methyl, ethyl, n-propyl, isopropyl, n-butyl, and t-butyl, monovalent saturated cycloaliphatic hydrocarbon groups such as cyclopropyl, cyclopentyl, cyclohexyl, cyclopropylmethyl, 4-methylcyclohexyl, cyclohexylmethyl, norbornyl, and adamantyl, alkenyl groups such as vinyl, allyl, propenyl, butenyl, and hexenyl, monovalent unsaturated cycloaliphatic hydrocarbon groups such as cyclohexenyl, aryl groups such as phenyl and naphthyl, heteroaryl groups such as thienyl, and aralkyl groups such as benzyl, 1-phenylethyl and 2-phenylethyl. Inter alia, aryl groups are preferred. In these hydrocarbon groups, some hydrogen may be substituted by a moiety containing a heteroatom such as oxygen, sulfur, nitrogen or halogen, and some carbon may be replaced by a moiety containing a heteroatom such as oxygen, sulfur or nitrogen, so that the group may contain a hydroxyl moiety, cyano moiety, carbonyl moiety, ether bond, ester bond, sulfonic acid ester bond, carbonate bond, lactone ring, sultone ring, carboxylic anhydride (—C(=O)—O—C(=O)—) or haloalkyl moiety.

In formula (A-A), any two of $R^{3A}$, $R^{3B}$, and $R^{3C}$ may bond together to form a ring with the sulfur atom to which they are attached. Examples of the sulfonium cation in this embodiment are shown below, but not limited thereto.

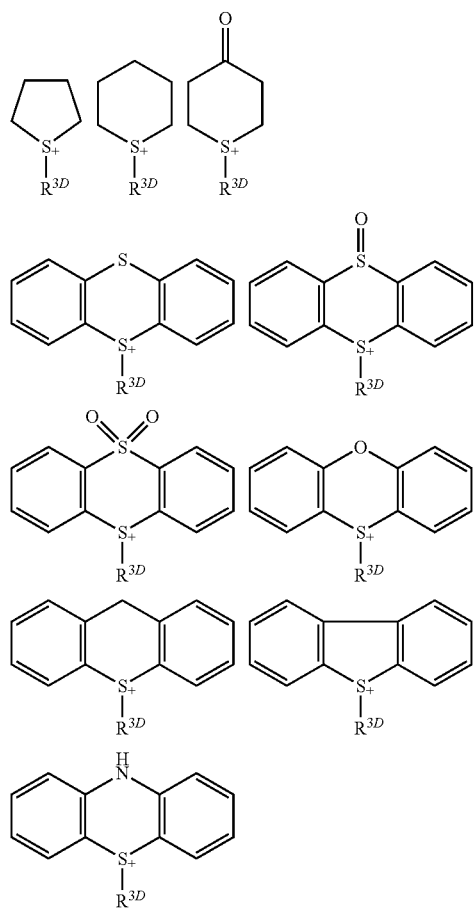

Herein $R^{3D}$ is the same as defined and exemplified for $R^{3A}$ to $R^{3C}$.

Examples of the sulfonium cation having formula (A-A) are shown below, but not limited thereto.

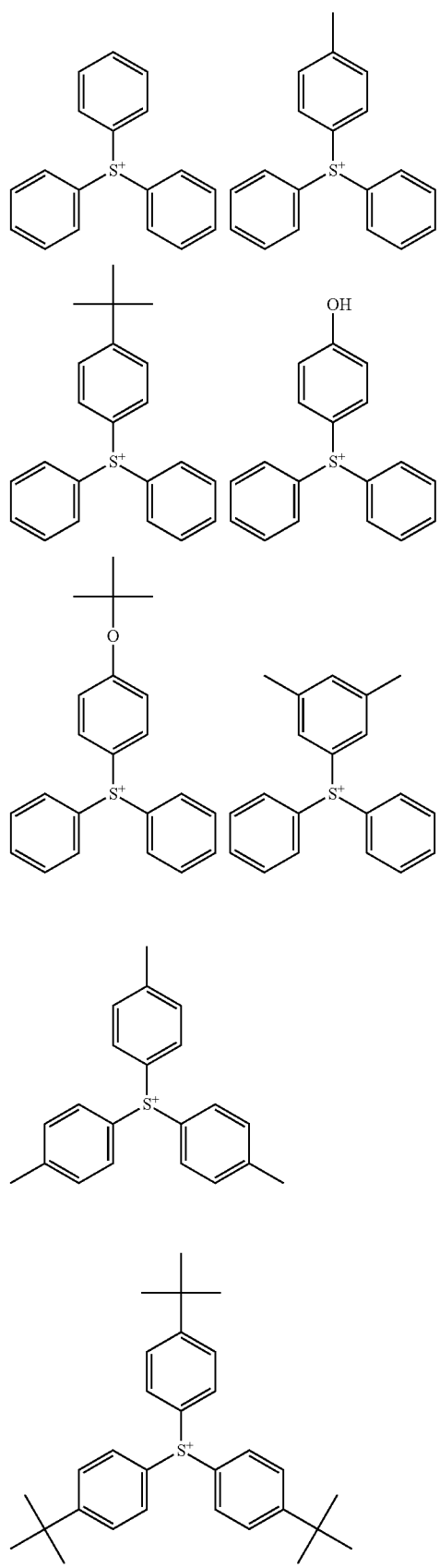

-continued

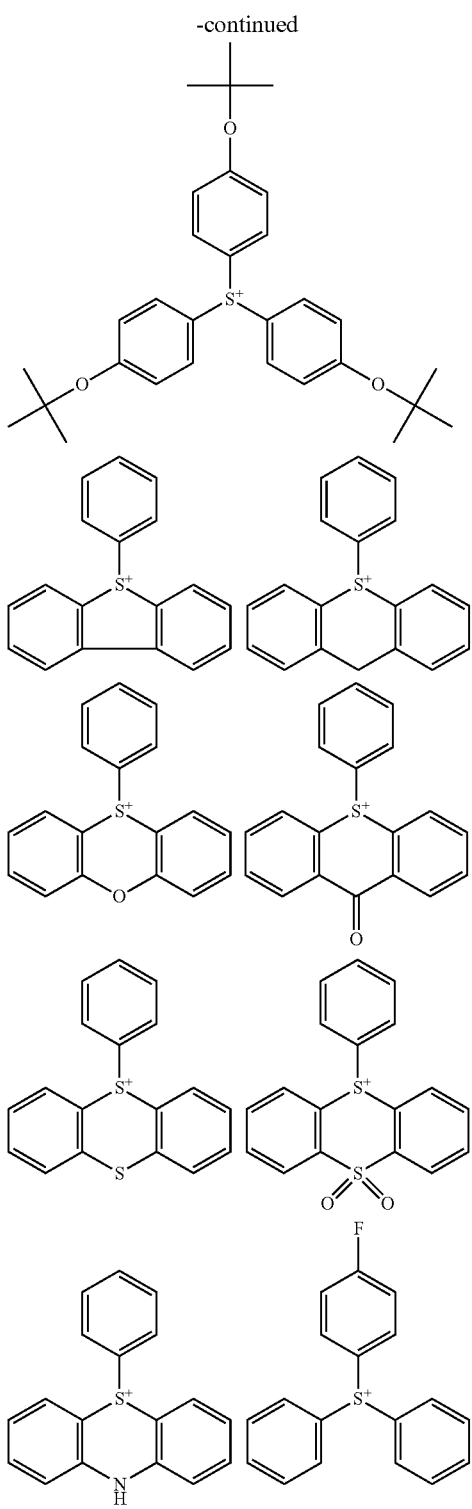

Examples of the iodonium cation having formula (A-B) include diphenyliodonium, bis(4-methylphenyl)iodonium, bis(4-(1,1-dimethylethyl)phenyl)iodonium, bis(4-(1,1-dimethylpropyl)phenyl)iodonium, and (4-(1,1-dimethylethoxy)phenyl)phenyliodonium cations.

Examples of the ammonium cation having formula (A-C) include tertiary ammonium cations such as trimethylammonium, triethylammonium, tributylammonium and N,N-dimethylanilinium cations and quaternary ammonium cations such as tetramethylammonium, tetraethylammonium and tetrabutylammonium cations.

Exemplary structures of the onium salt include arbitrary combinations of anions with cations, both as exemplified above.

The method for synthesizing the onium compound having formula (A), for example, formula (A) wherein L is an ester bond or sulfonic acid ester bond is exemplified by the following reaction scheme A, but not limited thereto.

Scheme A

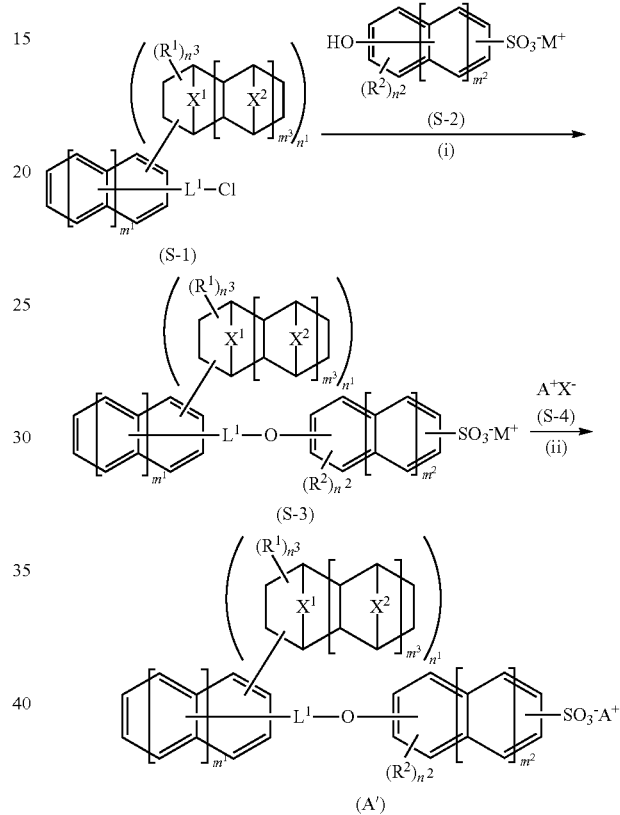

Herein $R^1$ to $R^5$, $X^1$, $X^2$, $A^+$, $m^1$ to $m^3$, $n^1$ to $n^3$ are as defined above, $L^1$ is a carbonyl or sulfonyl group, $M^+$ is a lithium, sodium or potassium ion, and $X^-$ is a halide or methyl sulfate ion.

Step (i) is nucleophilic displacement reaction of acid chloride (S-1) with hydroxyarene sulfonic acid salt (S-2) to form sulfonic acid salt (S-3). The reaction may be conducted by the standard technique, specifically by sequentially or simultaneously adding the acid chloride (S-1), the hydroxyarene sulfonic acid salt (S-2), and a base to a solvent and allowing the reaction to take place while cooling or heating if necessary.

Suitable solvents which can be used in step (i) include water; ethers such as tetrahydrofuran (THF), diethyl ether, diisopropyl ether, di-n-butyl ether and 1,4-dioxane; hydrocarbons such as n-hexane, n-heptane, benzene, toluene, and xylene; aprotic polar solvents such as acetonitrile, dimethyl sulfoxide (DMSO) and N,N-dimethylformamide (DMF); and chlorinated solvents such as methylene chloride, chloroform and carbon tetrachloride. The solvent may be selected depending on reaction conditions while it may be used alone or in admixture.

Suitable bases which can be used in step (i) include amines such as ammonia, triethylamine, pyridine, lutidine, collidine, and N,N-dimethylaniline; hydroxides such as sodium hydroxide, potassium hydroxide and tetramethylammonium hydroxide; and carbonates such as potassium carbonate and sodium hydrogencarbonate, which may be used alone or in admixture.

Step (ii) is ion exchange reaction between sulfonic acid salt (S-3) and onium salt (S-4) to form onium salt (A'). As the sulfonic acid salt (S-3), the reaction product resulting from step (i) may be used in crude form (after the termination of reaction and without post-treatment) or after it is isolated by customary aqueous work-up.

Where the isolated form of sulfonic acid salt (S-3) is used, a reaction mixture is obtained by dissolving the salt (S-3) in a solvent, mixing with onium salt (S-4), and optionally cooling or heating. Examples of the solvent used herein include water; ethers such as THF, diethyl ether, diisopropyl ether, di-n-butyl ether and 1,4-dioxane; hydrocarbons such as n-hexane, n-heptane, benzene, toluene, and xylene; aprotic polar solvents such as acetonitrile, DMSO and DMF; and chlorinated organic solvents such as methylene chloride, chloroform and carbon tetrachloride. From the reaction mixture, onium salt (A') may be recovered via customary aqueous work-up. If necessary, the salt may be purified by standard techniques like distillation, recrystallization and chromatography.

Where the crude form of sulfonic acid salt (S-3) is used, an onium salt (A') is obtained by adding onium salt (S-4) to the reaction mixture at the end of synthesis reaction (step i) of sulfonic acid salt (S-3) and optionally cooling or heating. If necessary, a solvent may be added to the reaction mixture. Examples of the solvent include water; ethers such as THF, diethyl ether, diisopropyl ether, di-n-butyl ether and 1,4-dioxane; hydrocarbons such as n-hexane, n-heptane, benzene, toluene, and xylene; aprotic polar solvents such as acetonitrile, DMSO and DMF; and chlorinated solvents such as methylene chloride, chloroform and carbon tetrachloride. From the reaction mixture, onium salt (A') may be recovered via customary aqueous work-up. If necessary, the salt may be purified by standard techniques like distillation, recrystallization and chromatography.

Since the onium salt of formula (A) has an onium salt structure of non-fluorinated sulfonic acid, it generates an acid with appropriate strength upon exposure to high-energy radiation. Since the onium salt has a bulky substituent group such as norbornyl or oxanorbornyl, the movement and diffusion of the generated acid can be appropriately controlled, contributing to roughness improvement. In particular, a hole pattern of rectangular profile is obtainable. Since the onium salt is fully lipophilic, it is easy to prepare and handle.

Upon high-energy radiation exposure or heating, the onium salt having formula (A) generates a sulfonic acid having the formula (Aa).

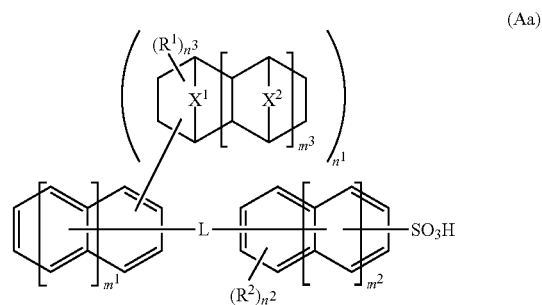

(Aa)

Herein $R^1$, $R^2$, $X^1$, $X^2$, L, $m^1$ to $m^3$, $n^1$ to $n^3$ are as defined above.

In addition to the onium salt having formula (A), the acid generator as component (A) may contain another acid generator. The other acid generator may be selected from prior art well-known acid generators. The acid generator is typically a compound capable of generating acid in response to actinic light or radiation (known as photoacid generator). The PAG may be any compound capable of generating an acid upon exposure to high-energy radiation. Suitable PAGs include sulfonium salts, iodonium salts, sulfonyldiazomethane, N-sulfonyloxyimide, and oxime-O-sulfonate acid generators. These PAGs may be used alone or in admixture of two or more.

In the resist composition, the acid generator (A) is preferably present in an amount of 0.1 to 40 parts by weight, more preferably 1 to 20 parts by weight per 100 parts by weight of the base polymer (B). When the amount of the acid generator falls in the range, a sufficient amount of acid to deprotect the acid labile group is generated and storage stability is satisfactory.

(B) Base Polymer

Component (B) is a base polymer containing a polymer comprising recurring units having the formula (B1). It is noted that the recurring unit having formula (B1) is simply referred to as recurring unit (B1), and the polymer is referred to as polymer B. The recurring unit (B1) serves to impart adhesion to a substrate and solubility in an alkaline developer as well as etching resistance.

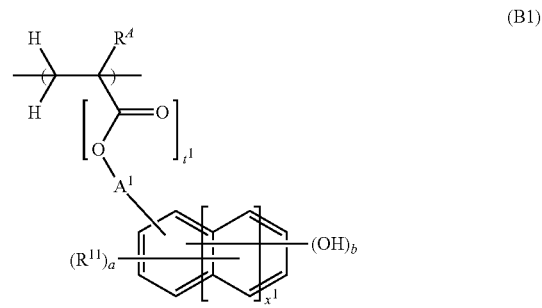

(B1)

In formula (B1), $R^A$ is hydrogen, fluorine, methyl or trifluoromethyl, with hydrogen or methyl being preferred. $R^{11}$ is each independently halogen, an optionally halogenated $C_2$-$C_8$ acyloxy group, optionally halogenated $C_1$-$C_6$ alkyl group, or optionally halogenated $C_1$-$C_6$ alkoxy group. $A^1$ is a single bond or $C_1$-$C_{10}$ alkanediyl group in which an ether bond may intervene in a carbon-carbon bond, $t^1$ is 0 or 1, $x^1$ is an integer of 0 to 2, a is an integer satisfying $0 \leq a \leq 5+2x^1-b$, and b is an integer of 1 to 3.

Examples of the alkanediyl group $A^1$ include methylene, ethylene, propylene, butylene, pentylene, hexylene, and structural isomers of carbon skeleton having a branched or cyclic structure. Where the alkanediyl group contains an ether bond, in case of $t^1=1$ in formula (B1), the ether bond may take any position excluding the position between α-carbon and β-carbon relative to the ester oxygen. In case of $t^1=0$, the atom bonding with the backbone becomes an ethereal oxygen atom, and a second ether bond may take any position excluding the position between α-carbon and β-carbon relative to the ethereal oxygen atom. As long as the carbon count of the alkanediyl group is 10 or less, sufficient solubility in alkaline developer is available.

Preferred examples of the hydrocarbon moiety in the acyloxy, alkyl and alkoxy groups represented by $R^{11}$ include methyl, ethyl, propyl, isopropyl, butyl, pentyl, hexyl and structural isomers of carbon skeleton having a branched or cyclic structure. As long as the carbon count of the group is not more than the upper limit, sufficient solubility in alkaline developer is available.

In formula (B1), $x^1$ is an integer of 0 to 2. The relevant skeleton is a benzene skeleton in case of $x^1=0$, a naphthalene skeleton in case of $x^1=1$, and an anthracene skeleton in case of $x^1=2$. The subscript a is an integer satisfying $0 \leq a \leq 5+2x^1-b$. In case of $x^1=0$, preferably a is an integer of 0 to 3 and b is an integer of 1 to 3. In case of $x^1=1$ or 2, preferably a is an integer of 0 to 4 and b is an integer of 1 to 3.

Where the recurring units (B1) are free of a linker (—CO—O-$A^1$-) that is, have formula (B1) wherein $t^1=0$ and $A^1$ is a single bond, suitable recurring units (B1) include those derived from 3-hydroxystyrene, 4-hydroxystyrene, 5-hydroxy-2-vinylnaphthalene, and 6-hydroxy-2-vinylnaphthalene. Of these, recurring units having the formula (B1-1) are more preferred.

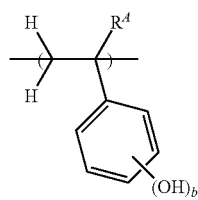

(B1-1)

Herein $R^A$ and b are as defined above.

Where the recurring units (B1) have a linker (—CO—O-$A^1$-), that is, have formula (B1) wherein $t^1=1$, preferred examples of the recurring units (B1) are given below, but not limited thereto. Herein $R^A$ is as defined above.

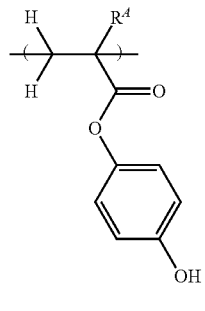 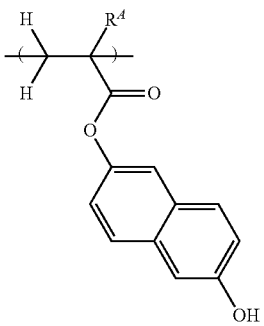

-continued

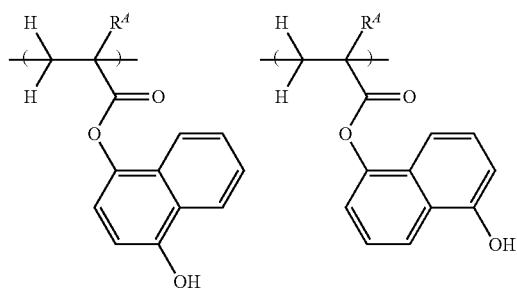

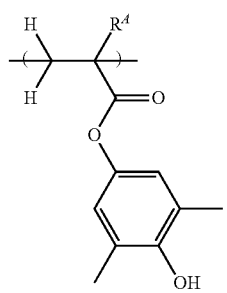

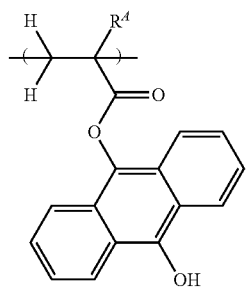

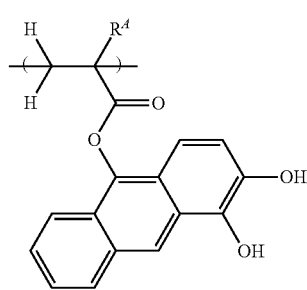

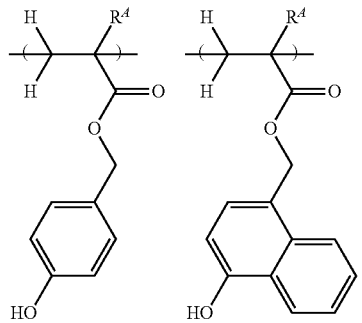

-continued

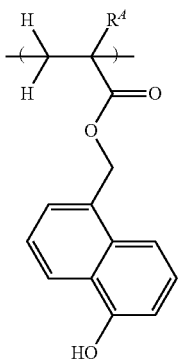

For the purpose of improving etching resistance, recurring units of at least one type selected from recurring units having the formula (B2), recurring units having the formula (B3), and recurring units having the formula (B4) may be incorporated in polymer B. For simplicity's sake, these recurring units are also referred to as recurring units (B2), (B3) and (B4), respectively.

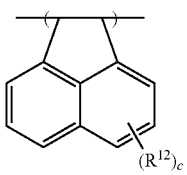
(B2)

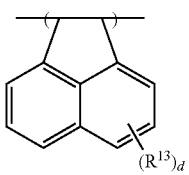
(B3)

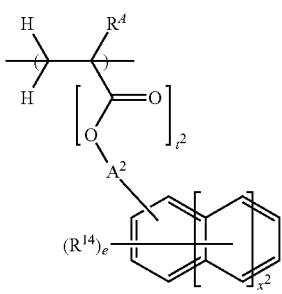
(B4)

Herein $R^A$ is as defined above. $R^{12}$ and $R^{13}$ are each independently hydroxyl, halogen, acetoxy, an optionally halogenated $C_1$-$C_8$ alkyl group, optionally halogenated $C_1$-$C_8$ primary alkoxy group, optionally halogenated $C_2$-$C_8$ secondary alkoxy group, optionally halogenated $C_2$-$C_8$ acyloxy group, or optionally halogenated $C_2$-$C_8$ alkylcarbonyloxy group. $R^{14}$ is an acetyl group, acetoxy group, $C_1$-$C_{20}$ alkyl group, $C_1$-$C_{20}$ primary alkoxy group, $C_2$-$C_{20}$ secondary alkoxy group, $C_2$-$C_{20}$ acyloxy group, $C_2$-$C_{20}$ alkoxyalkyl group, $C_2$-$C_{20}$ alkylthioalkyl group, halogen, nitro group or cyano group. $A^2$ is a single bond or $C_1$-$C_{10}$ alkanediyl group in which an ether bond may intervene in a carbon-carbon bond, c and d are each independently an integer of 0 to 4, e is an integer of 0 to 5, $x^2$ is an integer of 0 to 2, and $t^2$ is 0 or 1.

Examples of the alkanediyl group $A^2$ include methylene, ethylene, propylene, butylene, pentylene, hexylene, and structural isomers of carbon skeleton having a branched or cyclic structure. Where the alkanediyl group contains an ether bond, in case of $t^2=1$ in formula (B4), the ether bond may take any position excluding the position between α-carbon and β-carbon relative to the ester oxygen. In case of $t^2=0$, the atom bonding with the backbone becomes an ethereal oxygen atom, and a second ether bond may take any position excluding the position between α-carbon and β-carbon relative to the ethereal oxygen atom. As long as the carbon count of the alkanediyl group is 10 or less, sufficient solubility in alkaline developer is available.

Preferred examples of the hydrocarbon moiety in the alkyl, alkoxy, acyloxy and alkylcarbonyloxy groups represented by $R^{12}$ and $R^{13}$ include methyl, ethyl, propyl, isopropyl, butyl, pentyl, hexyl and structural isomers of carbon skeleton having a branched or cyclic structure. As long as the carbon count of the group is not more than the upper limit, sufficient solubility in alkaline developer is available.

$R^{14}$ is preferably selected from chlorine, bromine, iodine, methyl, ethyl, propyl, butyl, pentyl, hexyl and structural isomers thereof, cyclopentyl, cyclohexyl, methoxy, ethoxy, propoxy, butoxy, pentyloxy, hexyloxy and structural isomers of its hydrocarbon moiety, cyclopentyloxy, and cyclohexyloxy. Inter alia, methoxy and ethoxy are preferred. Also, an acyloxy group may be introduced into a polymer even at the end of polymerization by the chemical modification method and is thus advantageously used for fine adjustment of solubility of a base polymer in alkaline developer. Suitable acyloxy groups include methylcarbonyloxy, ethylcarbonyloxy, propylcarbonyloxy, butylcarbonyloxy, pentylcarbonyloxy, hexylcarbonyloxy and structural isomers thereof, cyclopentylcarbonyloxy, cyclohexylcarbonyloxy, and benzoyloxy groups. As long as the carbon count is not more than 20, the group is effective for appropriately controlling and adjusting (typically reducing) the solubility of a base polymer in alkaline developer and for preventing scum or development defects from forming. Of the preferred substituent groups mentioned above, chlorine, bromine, iodine, methyl, ethyl, and methoxy are especially useful because corresponding monomers are readily furnished.

In formula (B4), $x^2$ is an integer of 0 to 2. The relevant skeleton is a benzene skeleton in case of $x^2=0$, a naphthalene skeleton in case of $x^2=1$, and an anthracene skeleton in case of $x^2=2$. In case of $x^2=0$, preferably e is an integer of 0 to 3. In case of $x^2=1$ or 2, preferably e is an integer of 0 to 4.

Where the recurring units (B4) are free of a linker (—CO—O-$A^2$-), that is, have formula (B4) wherein $t^2=0$ and $A^2$ is a single bond, suitable recurring units (B4) include those derived from styrene, 4-chlorostyrene, 4-methylstyrene, 4-methoxystyrene, 4-bromostyrene, 4-acetoxystyrene, 2-hydroxypropylstyrene, 2-vinylnaphthalene, and 3-vinylnaphthalene.

Where the recurring units (B4) have a linker (—CO—O-$A^2$-), that is, have formula (B4) wherein $t^2=1$, preferred examples of the recurring units (B4) are given below, but not limited thereto. Herein $R^A$ is as defined above.

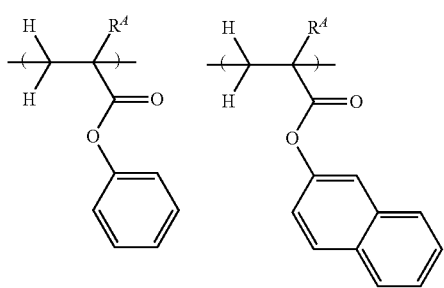
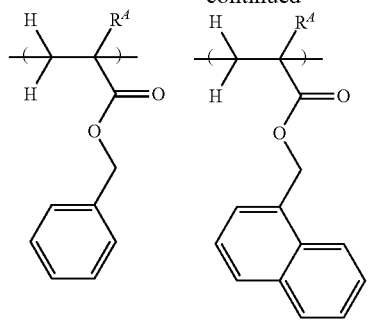
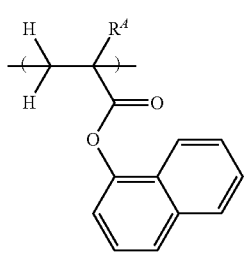
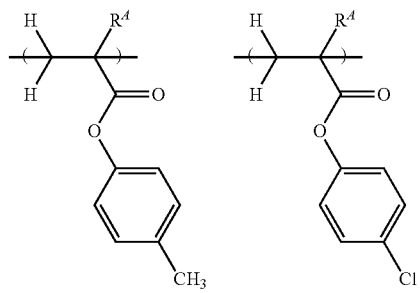
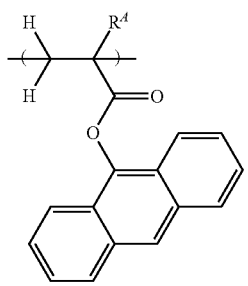
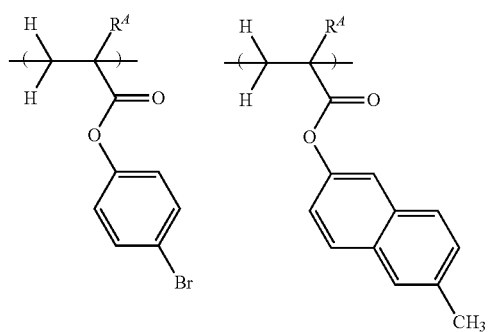
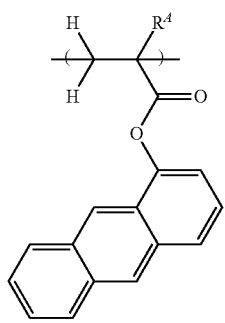
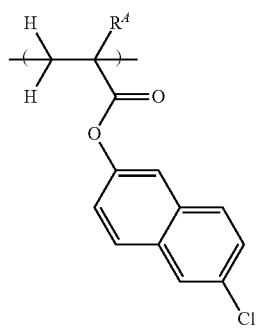
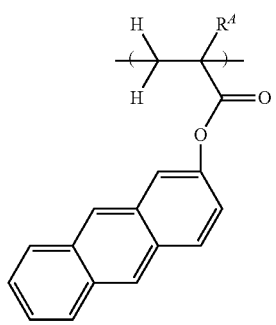
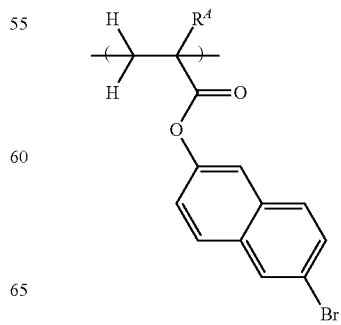

-continued

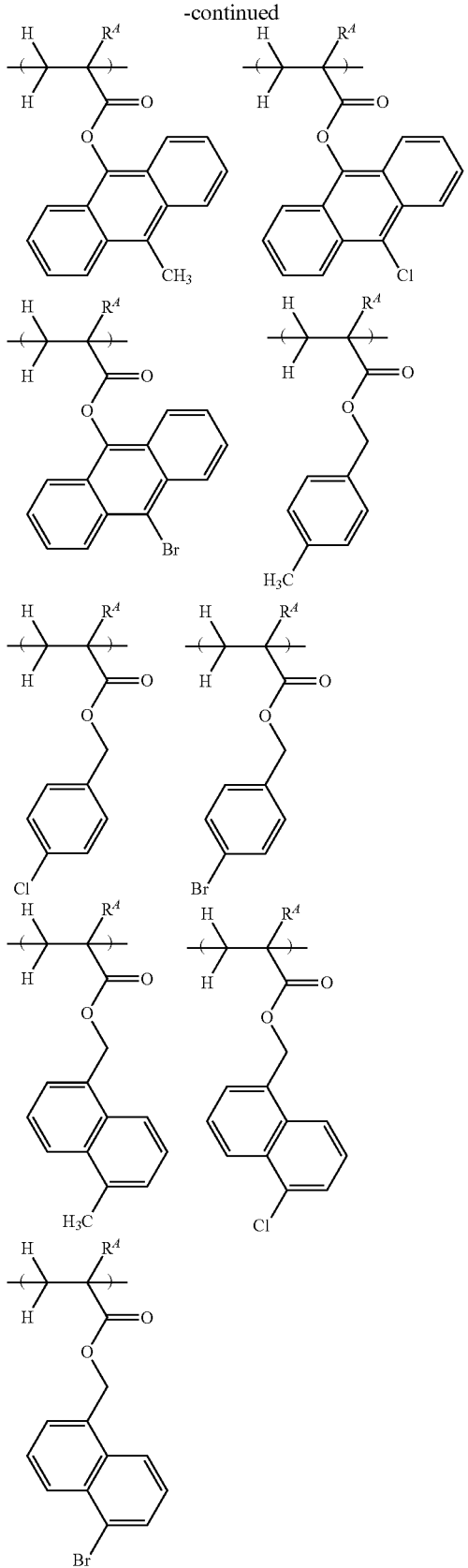

When recurring units of at least one type selected from recurring units (B2) to (B4) are incorporated, better performance is obtained because not only the aromatic ring possesses etching resistance, but the cyclic structure incorporated into the main chain also exerts the effect of improving resistance to EB irradiation during etching and pattern inspection steps. The recurring units (B2) to (B4) may be of one type or a combination of plural types.

The polymer B may further comprise recurring units having the formula (B5). The recurring units having formula (B5) are also referred to as recurring units (B5), and polymer B further comprising recurring units (B5) is also referred to as polymer B'.

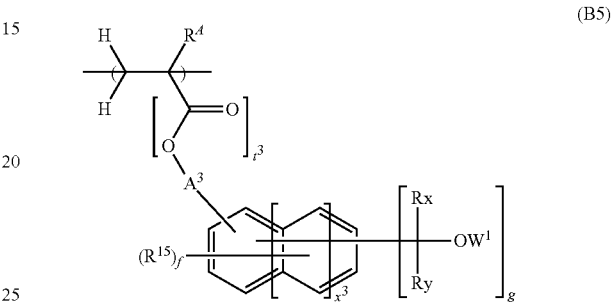

(B5)

Herein $R^A$ is as defined above. $A^3$ is a single bond or $C_1$-$C_{10}$ alkanediyl group in which an ether bond may intervene in a carbon-carbon bond. $R^{15}$ is each independently halogen, an optionally halogenated $C_2$-$C_8$ acyloxy group, optionally halogenated $C_1$-$C_6$ alkyl group, or optionally halogenated $C_1$-$C_6$ alkoxy group. $W^1$ is hydrogen, a $C_1$-$C_{10}$ aliphatic monovalent hydrocarbon group in which an ether bond, carbonyl moiety or carbonyloxy moiety may intervene in a carbon-carbon bond, or an optionally substituted monovalent aromatic group. Rx and Ry are each independently hydrogen, an optionally hydroxy or alkoxy-substituted $C_1$-$C_{15}$ alkyl group, or an optionally substituted monovalent aromatic group, excluding that both Rx and Ry are hydrogen at the same time, or Rx and Ry may bond together to form a ring with the carbon atom to which they are attached, $x^3$ is an integer of 0 to 2, $t^3$ is 0 or 1, f is an integer satisfying $0 \leq f \leq 5+2x^3-g$, and g is an integer of 1 to 3.

Upon exposure to high-energy radiation, the unit (B5) functions such that the acid-eliminatable group undergoes elimination reaction under the action of an acid which is generated by the acid generator. That is, the unit (B5) induces alkali insolubilization and crosslinking reaction between polymer molecules. Since the unit (B5) permits for more efficient progress of negative-working reaction, it is effective for improving the resolving performance.

Examples of the monovalent aliphatic hydrocarbon and monovalent aromatic groups represented by $W^1$ include methyl, ethyl, propyl, isopropyl, cyclopentyl, cyclohexyl, adamantyl, methylcarbonyl and phenyl.

Preferred structures of Rx and Ry include methyl, ethyl, propyl, butyl and structural isomers thereof, and substituted forms of the foregoing in which some hydrogen is substituted by hydroxy or alkoxy.

The subscript $x^3$ is an integer of 0 to 2. The structure represents a benzene ring when $x^3=0$, a naphthalene ring when $x^3=1$, and an anthracene ring when $x^3=2$.

Preferred examples of the alkanediyl group represented by $A^3$ include methylene, ethylene, propylene, butylene, pentylene, hexylene and structural isomers of a carbon skeleton having branched or cyclic structure. For the alkanediyl group containing an ether bond, in case $t^3=1$ in formula (B5), the ether bond may be incorporated at any position excluding the position between the α- and β-carbons relative to the ester oxygen. In case $t^3=0$, the atom in $A^3$ that bonds with the main chain becomes an ethereal oxygen atom, and a second ether bond may be incorporated at any position excluding the position between the α- and α-carbons relative to that ether bond. As long as the carbon count of the alkanediyl group is not more than 10, sufficient solubility in alkaline developer is available.

Preferred examples of the hydrocarbon moiety in the acyloxy, alkyl and alkoxy groups represented by $R^{15}$ include methyl, ethyl, propyl, isopropyl, butyl, pentyl, hexyl and structural isomers of carbon skeleton having a branched or cyclic structure. As long as the carbon count of the group is not more than the upper limit, sufficient solubility in alkaline developer is available.

Preferred examples of the recurring unit (B5) are recurring units of the formula (B5-1).

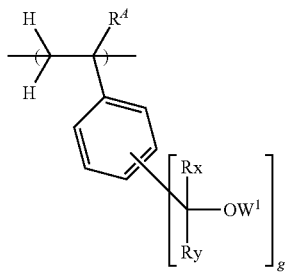

(B5-1)

Herein $R^A$, Rx, Ry, $W^1$ and g are as defined above.

Recurring units of the formula (B5-2) are also preferred as the recurring unit (B5).

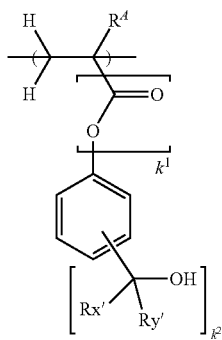

(B5-2)

In formula (B5-2), $R^A$ is as defined above. Rx' and Ry' are each independently hydrogen or a $C_1$-$C_{15}$ primary or secondary alkyl group in which some hydrogen may be substituted by hydroxyl or $C_1$-$C_6$ alkoxy.

The primary or secondary alkyl group may be straight, branched or cyclic. Examples include methyl, ethyl, n-propyl, isopropyl, cyclopropyl, n-butyl, isobutyl, sec-butyl, cyclobutyl, n-pentyl, isopentyl, sec-pentyl, 1-ethylpropyl, 2,2-dimethylpropyl, cyclopentyl, n-hexyl, and cyclohexyl. The primary or secondary alkyl groups are preferably of 1 to 8 carbon atoms, more preferably 1 to 6 carbon atoms, even more preferably 1 to 4 carbon atoms.

Also, Rx' and Ry' may bond together to form a ring with the carbon atom to which they are attached. The ring is preferably a 3 to 6-membered ring, more preferably a 5 or 6-membered ring.

Preferably at least one of Rx' and Ry' is a $C_1$-$C_{15}$ primary or secondary alkyl group, more preferably both are $C_1$-$C_{15}$ primary or secondary alkyl groups.

In formula (B5-2), $k^1$ is 0 or 1 and $k^2$ is an integer of 2 to 4. For easy synthesis of the relevant monomer, preferably $k^2$ is 2.

A method for synthesizing the monomer from which recurring units (B5-2) are derived, for example, formula (B5-2) wherein $R^A$ is hydrogen, $k^1=0$, $k^2=2$, Rx' and Ry' are methyl is exemplified by the following Scheme B, but not limited thereto.

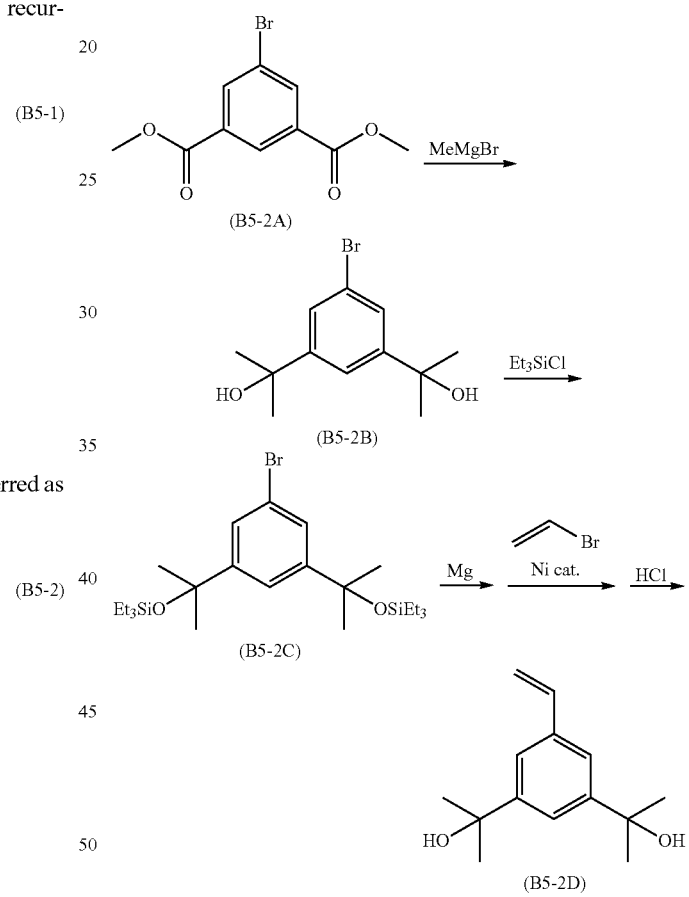

In the reaction according to Scheme B, first dimethyl 3-bromoisophthalate (B5-2A) at its ester site is reduced with Grignard reagent, and purification is carried out, if necessary, by a standard technique such as distillation, re-crystallization or chromatography, obtaining alcohol (B5-2B). Subsequently, the hydroxyl group on alcohol (B5-2B) is protected with a silyl group, and purification is carried out, if necessary, by a standard technique such as distillation, re-crystallization or chromatography, obtaining compound (B5-2C). Once the compound (B5-2C) is converted to a Grignard reagent with the assistance of magnesium, it is reacted with vinyl bromide in the presence of a nickel catalyst. Finally, deprotection of silyl group is carried out in hydrochloric acid, yielding monomer (B5-2D).

Another method for synthesizing the monomer from which recurring units (B5-2) are derived, for example, formula (B5-2) wherein $R^A$ is methyl, $k^1=1$, $k^2=2$, Rx' and Ry' are methyl is exemplified by the following Scheme C, but not limited thereto.

Scheme C

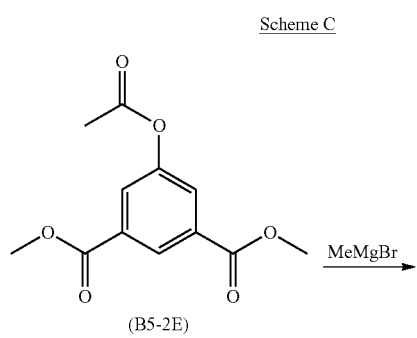
(B5-2E)

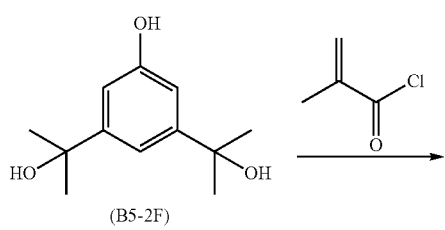
(B5-2F)

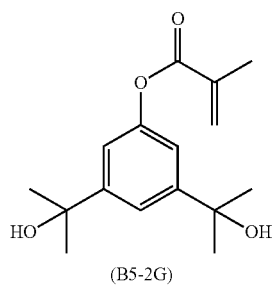
(B5-2G)

In the reaction according to Scheme C, first dimethyl 3-acetoxyisophthalate (B5-2E) at its ester site is reduced with Grignard reagent, and purification is carried out, if necessary, by a standard technique such as distillation, re-crystallization or chromatography, obtaining phenol compound (B5-2F). Subsequently phenol compound (B5-2F) is reacted with an acylating agent, obtaining monomer (B5-2G). The reaction readily takes place in a well-known way. Preferably, the reaction is conducted in a solventless system or in a solvent (e.g., methylene chloride, toluene, hexane, diethyl ether, THF or acetonitrile) by sequentially or simultaneously adding phenol compound (B5-2F), the acylating agent, and a base (e.g., triethylamine, pyridine or 4-dimethylaminopyridine) and allowing the reaction to take place while cooling or heating if necessary. The product may be purified by a standard technique such as distillation, re-crystallization or chromatography, if necessary.

Preferred examples of the recurring unit (B5) are given below, but not limited thereto. Herein $R^A$ is as defined above.

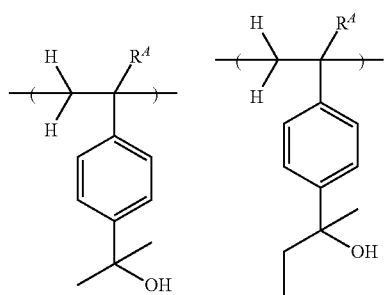

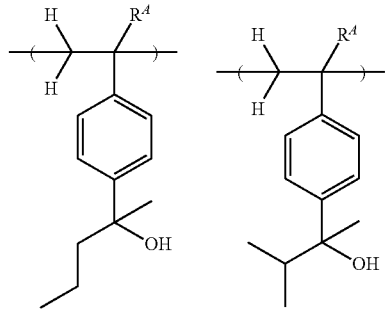

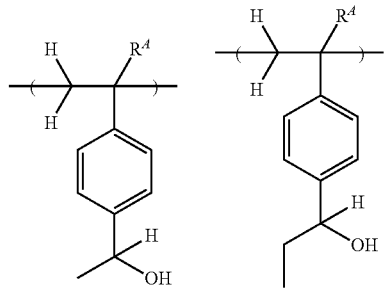

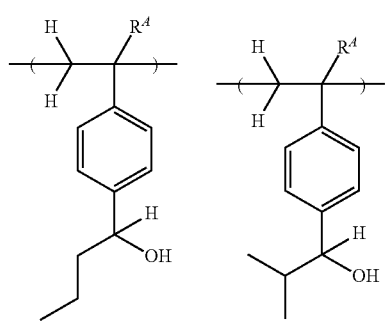

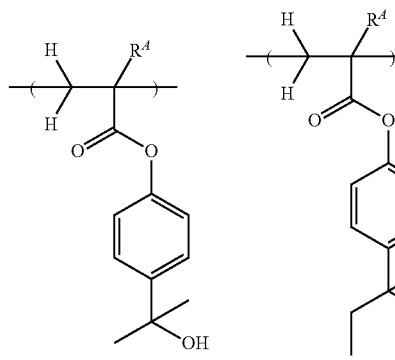

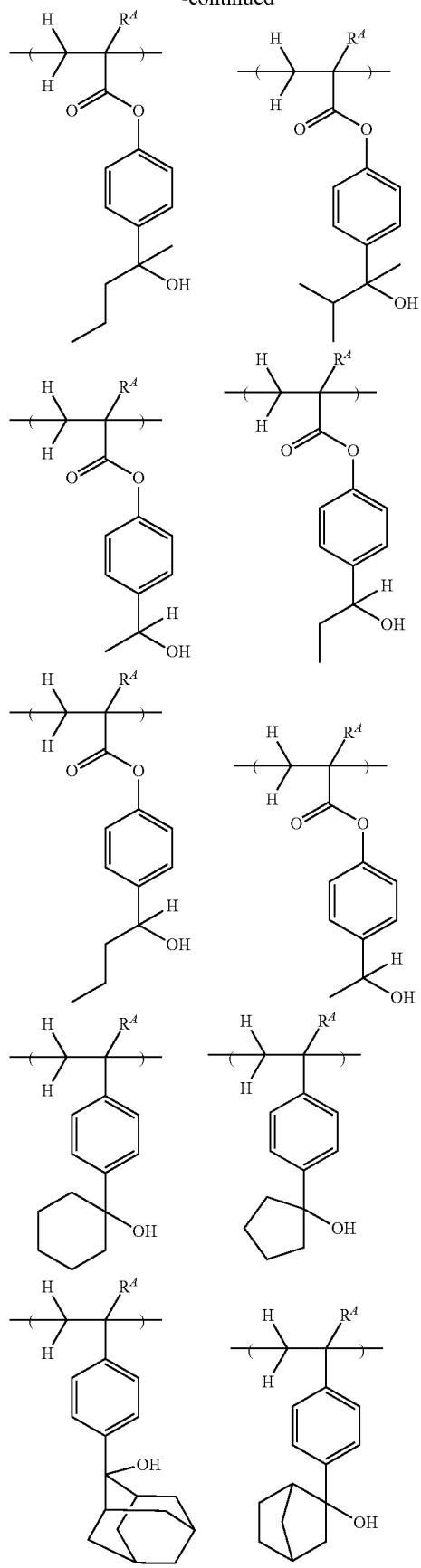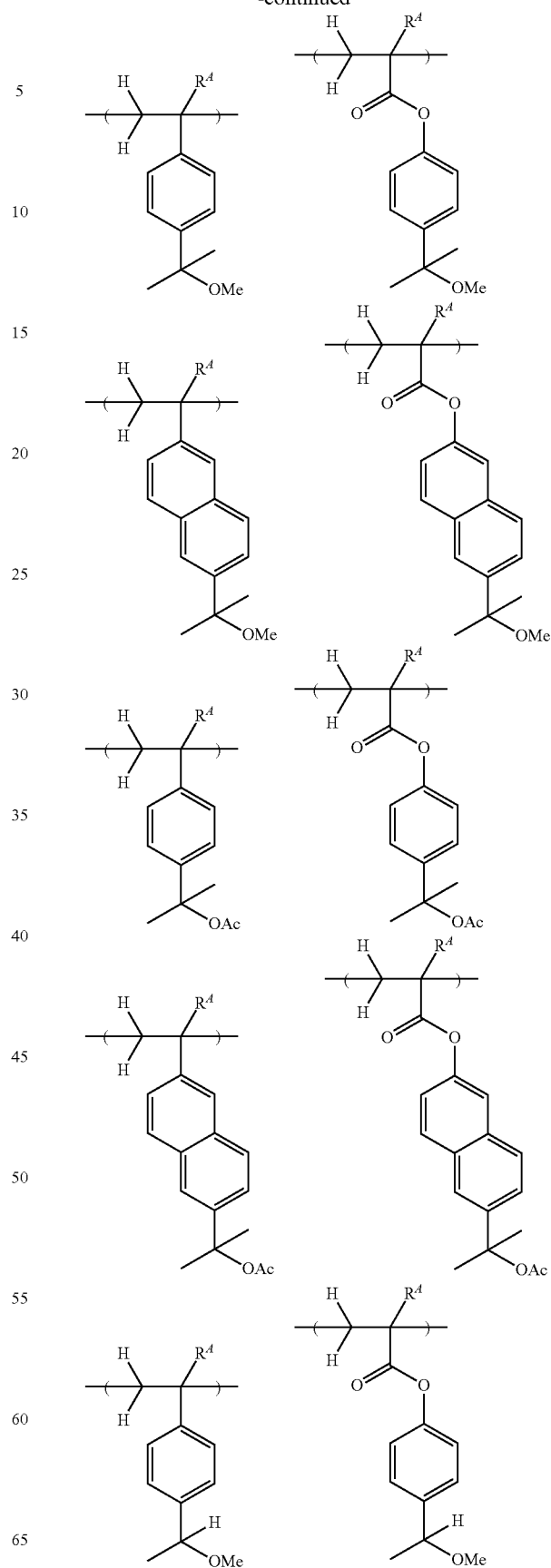

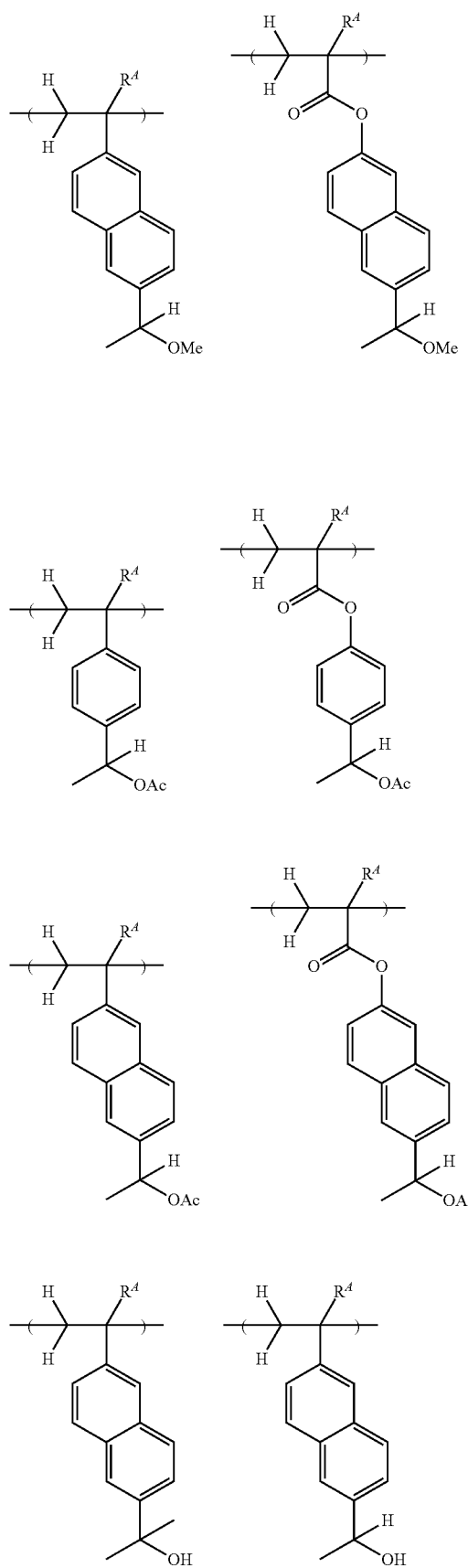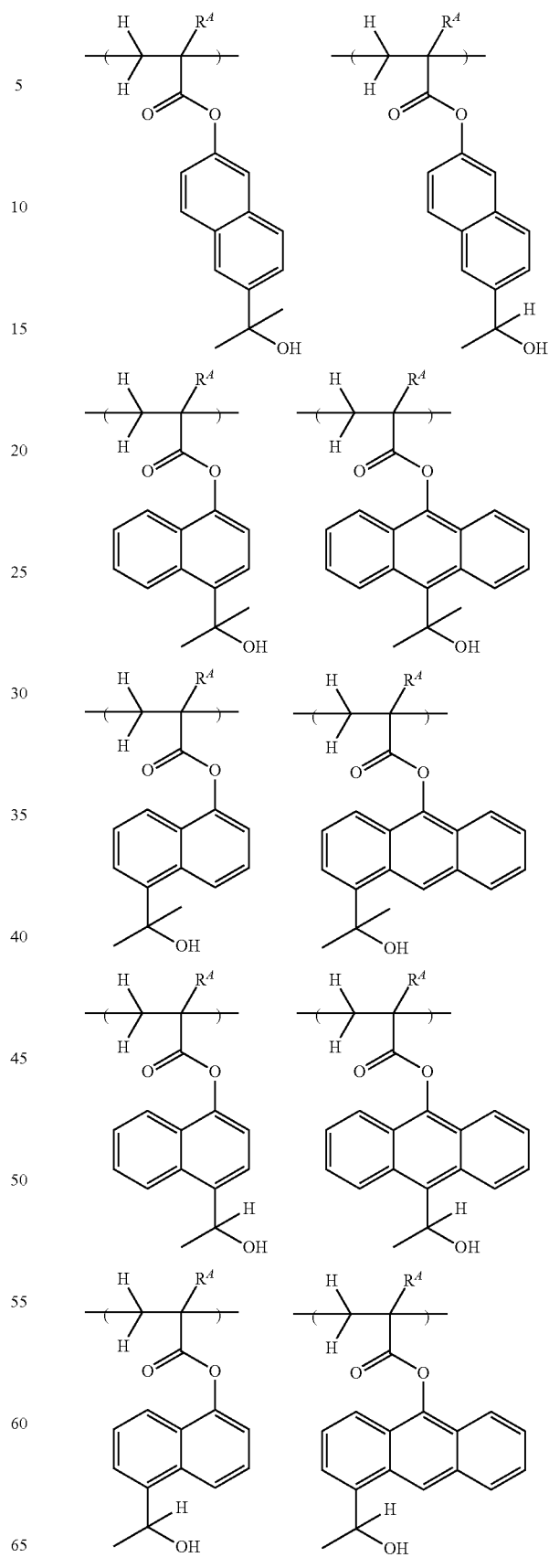

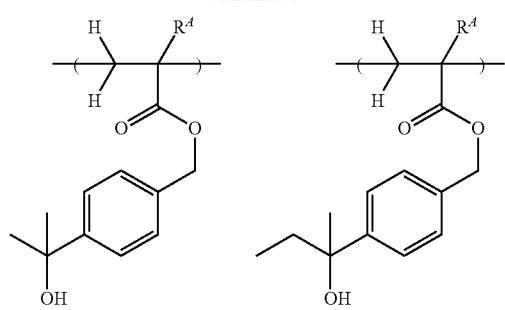
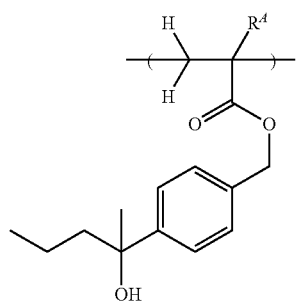
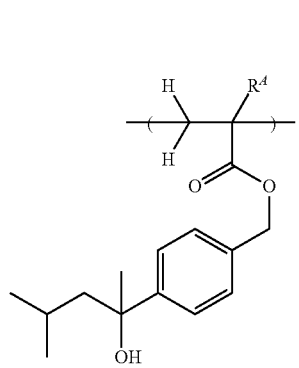
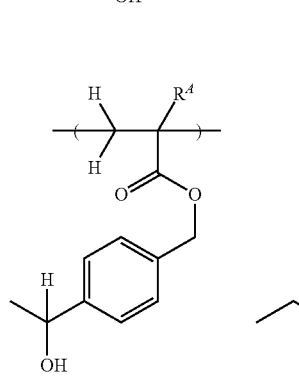
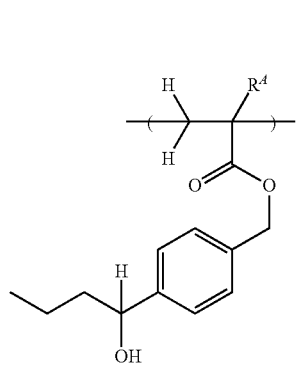
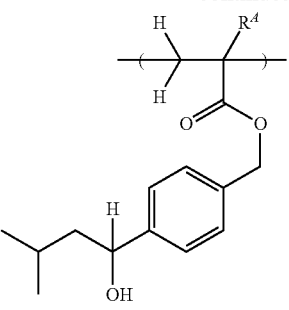
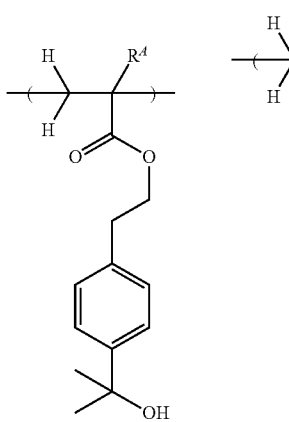
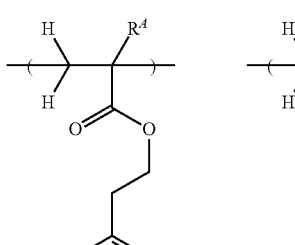
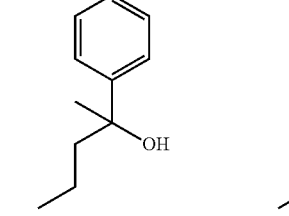
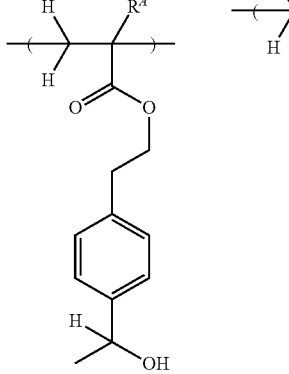

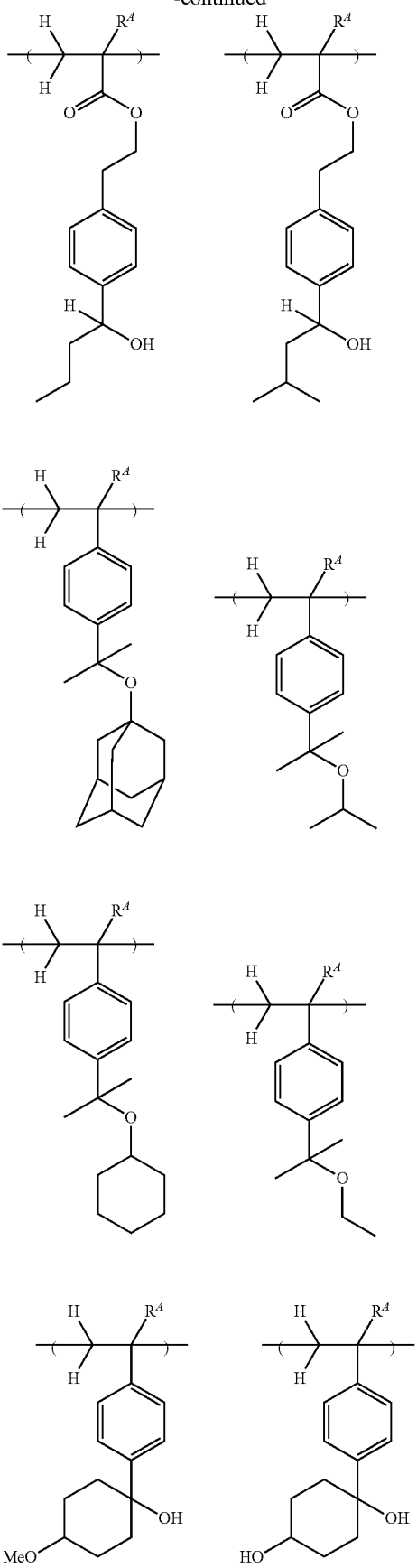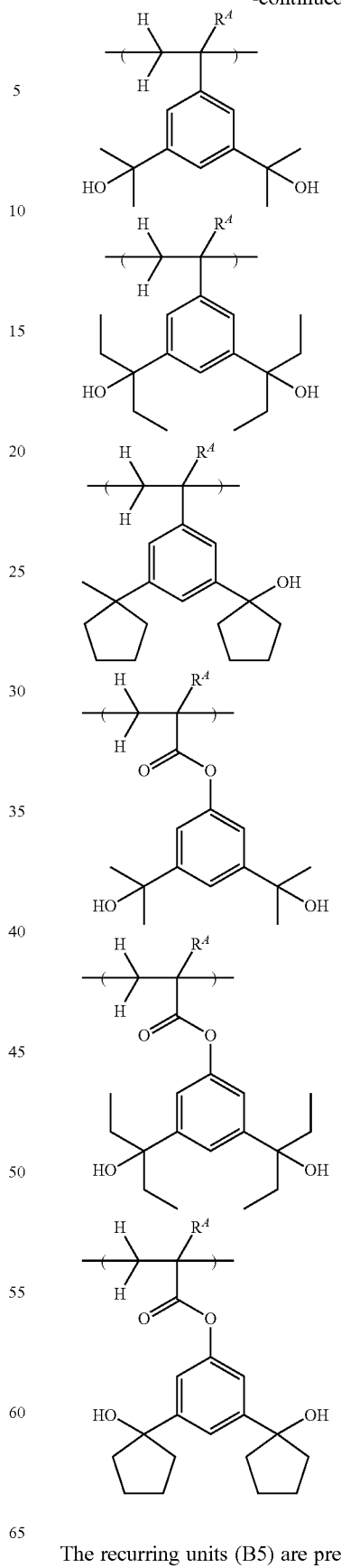
The recurring units (B5) are preferably incorporated in a range of at least 5 mol %, more preferably at least 10 mol % and up to 90 mol %, more preferably up to 75 mol %, based on the overall recurring units of the polymer.

The recurring units (B1) to (B5) are preferably incorporated in a range of at least 60 mol %, more preferably at least 70 mol %, based on the overall recurring units of the polymer. The range ensures that the polymer has necessary properties as the chemically amplified negative resist composition.

Polymer B' may further comprise recurring units of at least one type selected from recurring units having formulae (B6) to (B11). Notably these recurring units are also referred to as recurring units (B6) to (B11).

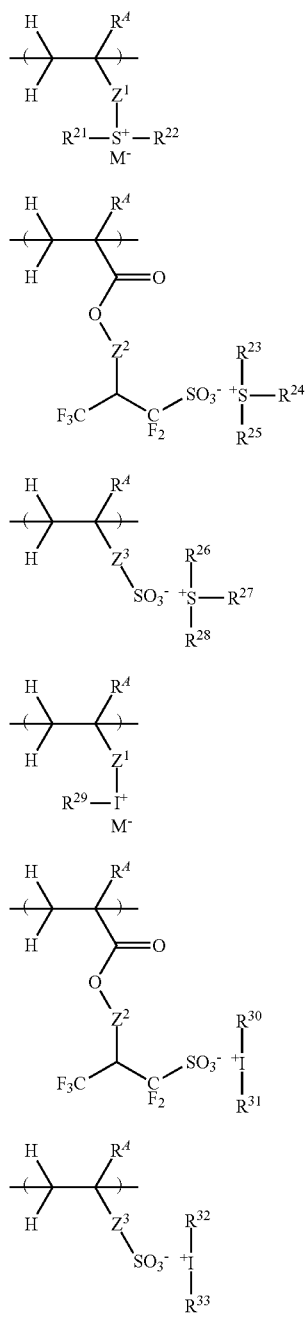

In formulae (B6) to (B11), $R^A$ is as defined above. $Z^1$ is each independently a single bond, phenylene group, —O—$Z^{11}$—, —C(=O)—O—$Z^{11}$— or —C(=O)—NH—$Z^{11}$—, wherein $Z^{11}$ is a $C_1$-$C_6$ alkanediyl, $C_2$-$C_6$ alkenediyl or phenylene group, which may contain a carbonyl, ester bond, ether bond or hydroxyl moiety. $Z^2$ is each independently a single bond or —$Z^{21}$—C(=O)—O—, wherein $Z^{21}$ is a $C_1$-$C_{20}$ divalent hydrocarbon group which may contain a heteroatom. $Z^3$ is each independently a single bond, methylene, ethylene, phenylene, fluorinated phenylene, —O—$Z^{31}$—, —C(=O)—O—$Z^{31}$—, or —C(=O)—NH—$Z^{31}$—, wherein $Z^{31}$ is a $C_1$-$C_6$ alkanediyl, $C_2$-$C_6$ alkenediyl or phenylene group, which may contain a carbonyl, ester bond, ether bond or hydroxyl moiety.

$R^{21}$ to $R^{33}$ are each independently a $C_1$-$C_{20}$ monovalent hydrocarbon group which may contain a heteroatom. In the hydrocarbon group, some hydrogen may be substituted by a moiety containing a heteroatom such as oxygen, sulfur, nitrogen or halogen, and some carbon may be replaced by a moiety containing a heteroatom such as oxygen, sulfur or nitrogen, so that the group may contain a hydroxyl moiety, cyano moiety, carbonyl moiety, ether bond, ester bond, sulfonic acid ester bond, carbonate bond, lactone ring, sultone ring, carboxylic anhydride (—C(=O)—O—C(=O)—) or haloalkyl moiety. $R^{21}$ and $R^{22}$ may bond together to form a ring with the sulfur atom to which they are attached, any two of $R^{23}$, $R^{24}$ and $R^{25}$ may bond together to form a ring with the sulfur atom to which they are attached, and any two of $R^{26}$, $R^{27}$ and $R^{28}$ may bond together to form a ring with the sulfur atom to which they are attached. $M^-$ is a non-nucleophilic counter ion.

In formulae (B7) and (B10) wherein $Z^2$ is —$Z^{21}$—C(=O)—O—, is a divalent hydrocarbon group which may contain a heteroatom-containing moiety. Illustrative, non-limiting examples of the hydrocarbon group $Z^{21}$ are given below.

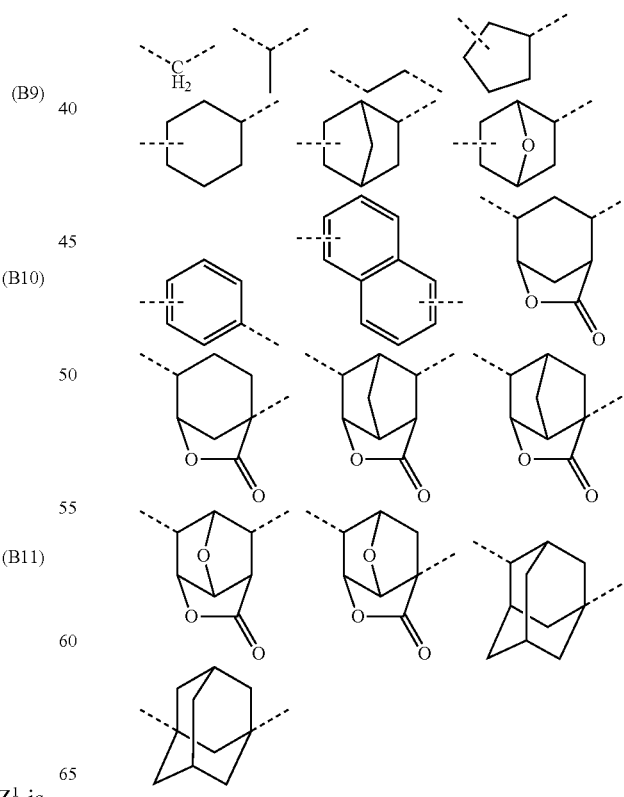

Illustrative, non-limiting examples of the sulfonium cation in formulae (B7) and (B8) wherein any two of $R^{23}$, $R^{24}$ and $R^{25}$, or any two of $R^{26}$, $R^{27}$ and $R^{28}$ bond together to form a ring with the sulfur atom to which they are attached, are shown below.

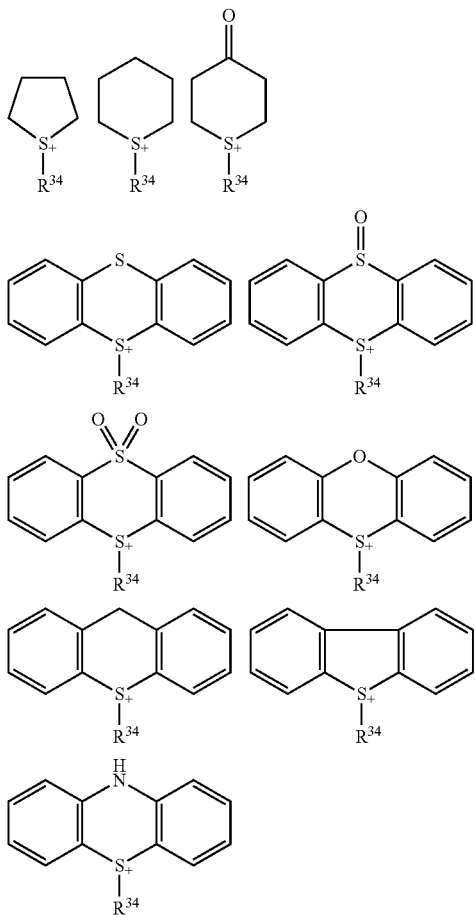

It is noted that $R^{34}$ is the same as defined and exemplified for $R^{21}$ to $R^{33}$.

Exemplary structures of the sulfonium cation in formulae (B7) and (B8) are shown below, but not limited thereto.

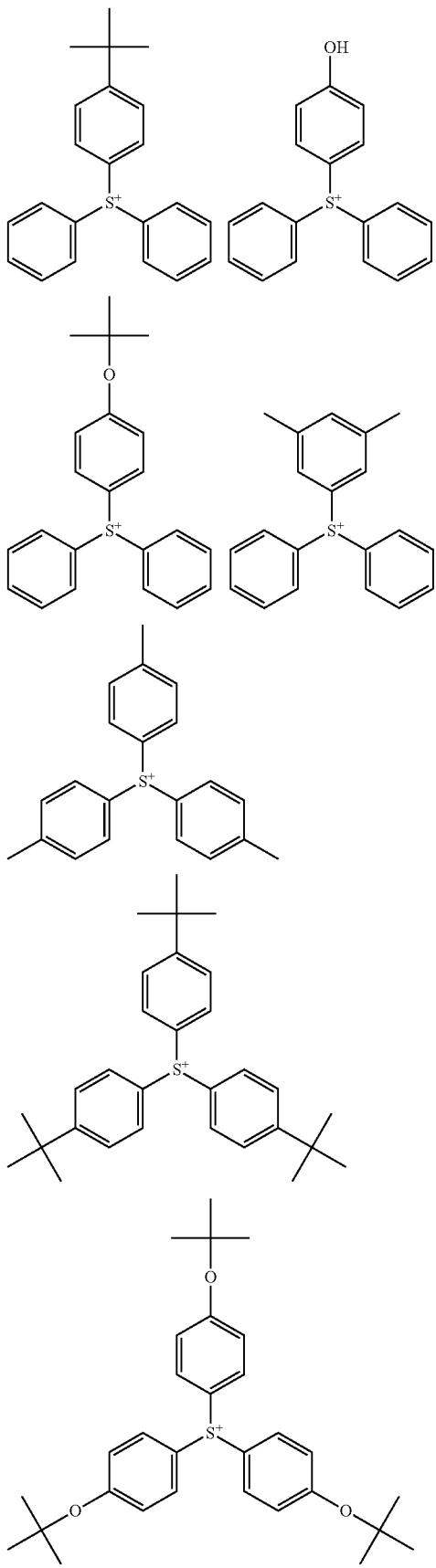

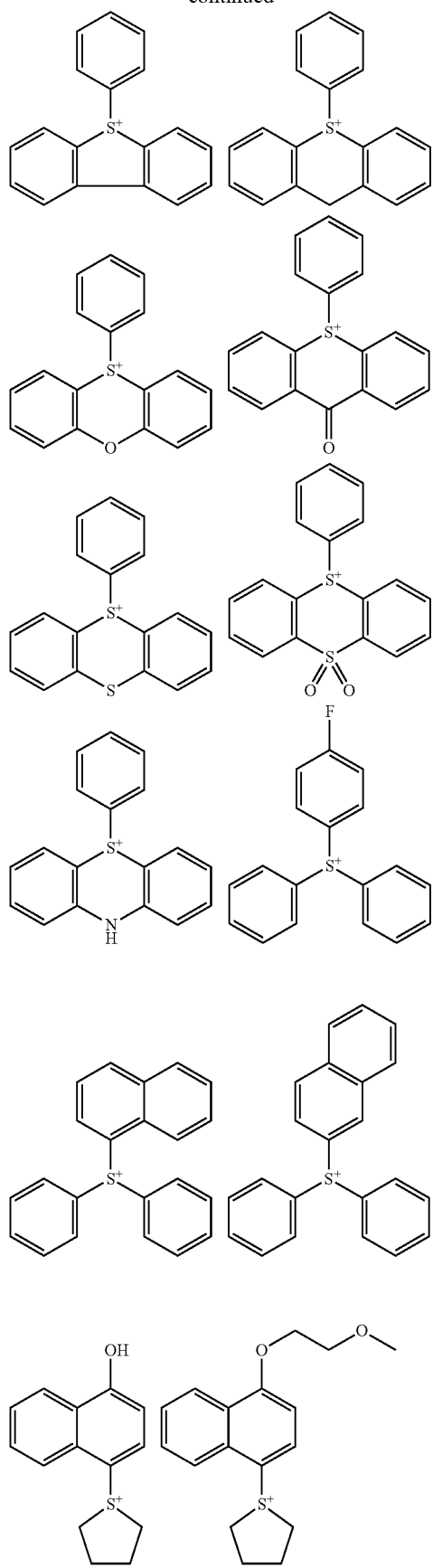
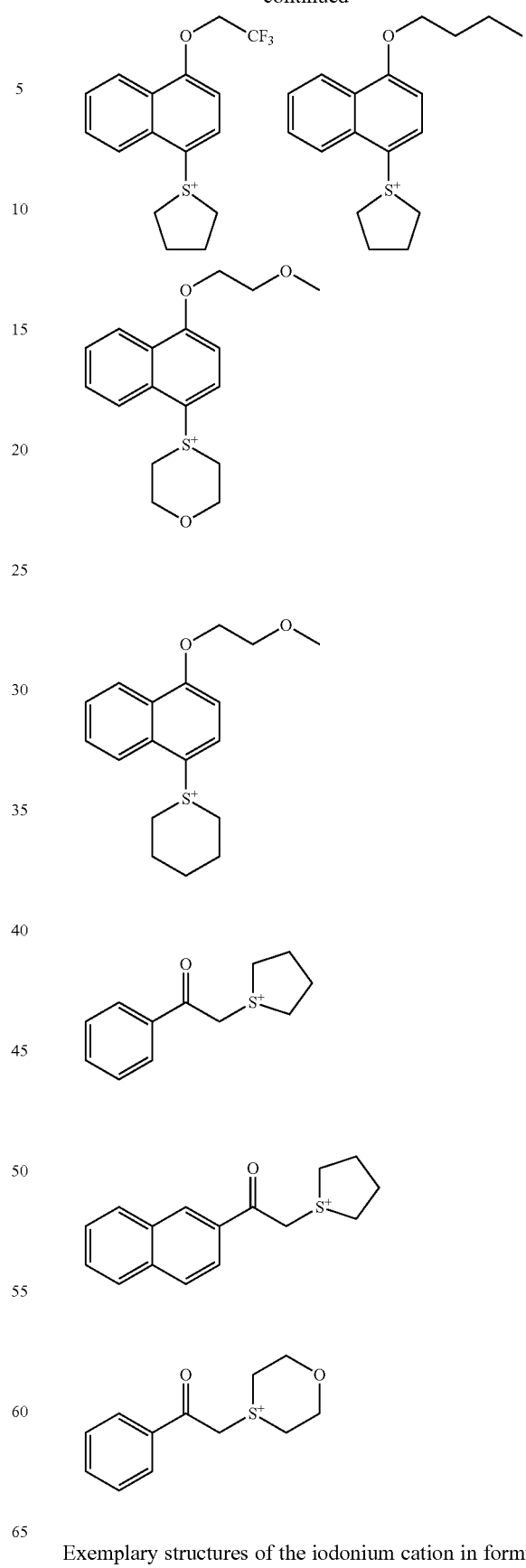
Exemplary structures of the iodonium cation in formulae (B10) and (B11) are shown below, but not limited thereto.

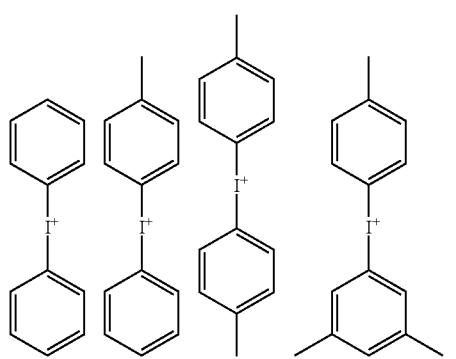
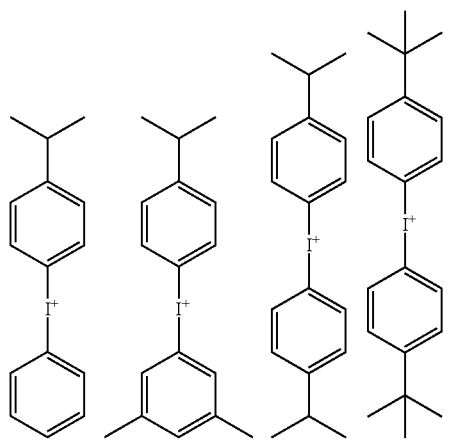
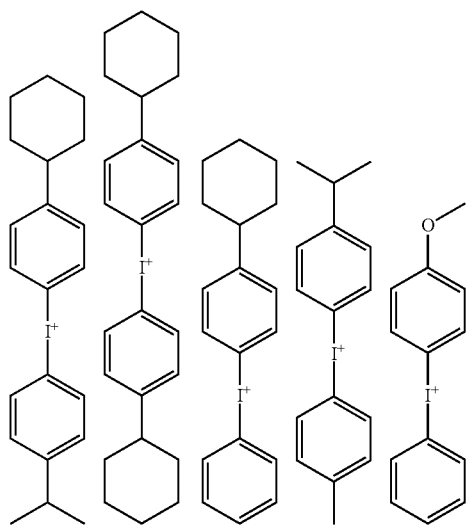
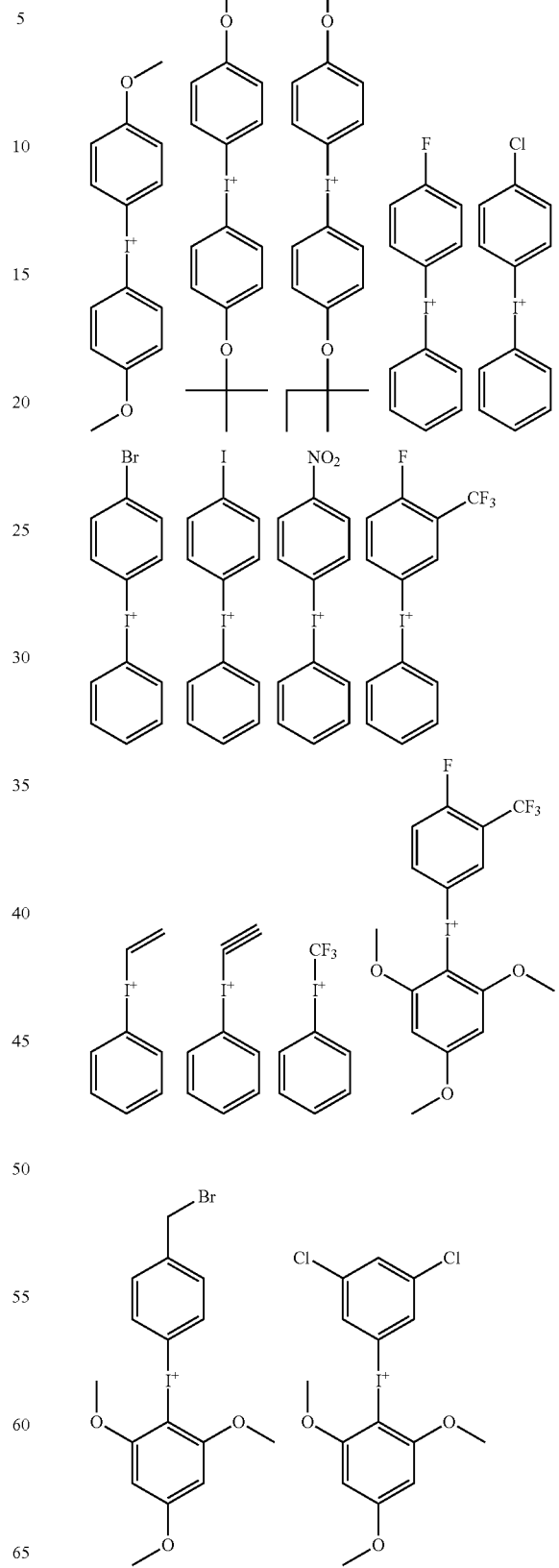

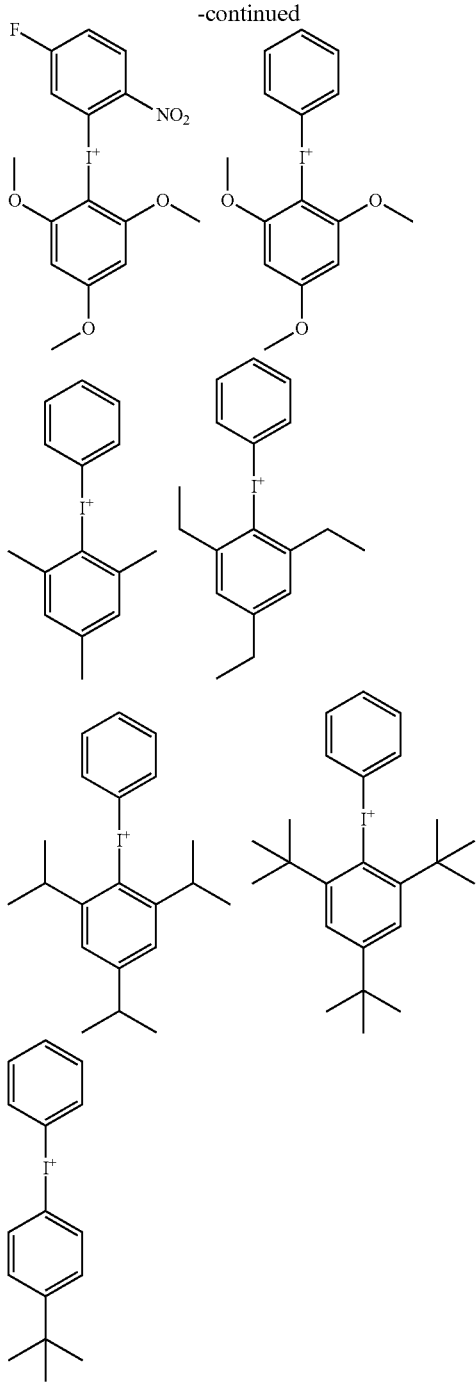

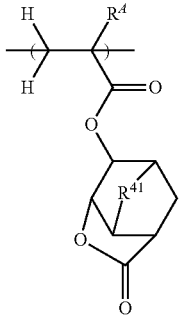

(B12)

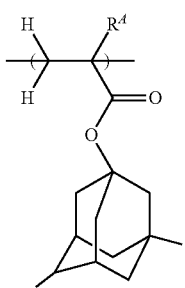

(B13)

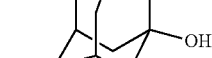

(B14)

The polymer may further contain (meth)acrylate units having an adhesive group such as lactone structure or hydroxyl group other than the phenolic hydroxyl group, or other recurring units. Examples of the (meth)acrylate units having an adhesive group include units having the formulae (B12) to (B14):

wherein $R^4$ is as defined above, $R^{41}$ is —O— or methylene, $R^{42}$ is hydrogen or hydroxyl, $R^{43}$ is $C_1$-$C_4$ alkyl, and h is an integer of 0 to 3. These units do not exhibit acidity and may be used as supplemental units for imparting adhesion to substrates or for adjusting solubility.

In polymer B, the content of recurring units (B1) is preferably 25 to 95 mol %, more preferably 40 to 80 mol %; the content of recurring units (B2) to (B4) is preferably 0 to 30 mol %, more preferably 3 to 20 mol %. Polymer B may further contain 0 to 30 mol %, preferably 0 to 20 mol % of other recurring units.

Where polymer B' is free of recurring units (B6) to (B11), the content of recurring units (B1) is preferably 25 to 95 mol %, more preferably 40 to 85 mol %; the content of recurring units (B2) to (B4) is preferably 0 to 30 mol %, more preferably 5 to 20 mol %; the content of recurring units (B5) is preferably 5 to 90 mol %, more preferably 10 to 75 mol %. Polymer B' may further contain 0 to 30 mol %, preferably 0 to 20 mol % of other recurring units.

Where polymer B' contains recurring units (B6) to (B11), the content of recurring units (B1) is preferably 25 to 94.5 mol %, more preferably 36 to 85 mol %; the content of The recurring units (B6) to (B11) are units capable of generating an acid upon receipt of high-energy radiation. With the relevant units bound into a polymer, an appropriate control of acid diffusion becomes possible, and a pattern with minimal LER can be formed. Since the acid-generating unit is bound to a polymer, the phenomenon that acid volatilizes from the exposed region and re-deposits on the unexposed region during bake in vacuum is suppressed. This is effective for reducing LER and for suppressing unwanted negative-toning reaction in the unexposed region for thereby reducing defects. The total content of recurring units (B6) to (B11) is preferably 0.5 to 20 mol % based on the overall recurring units of polymer B'.

recurring units (B2) to (B4) is preferably 0 to 30 mol %, more preferably 3 to 20 mol %; the content of recurring units (B5) is preferably 5 to 90 mol %, more preferably 10 to 75 mol %; the total content of recurring units (B1) to (B5) is preferably 60 to 99.5 mol %; the content of recurring units (B6) to (B11) is preferably 0.5 to 20 mol %, more preferably 1 to 10 mol %. Polymer B' may further contain 0 to 30 mol %, preferably 0 to 20 mol % of other recurring units.

As polymer B', preference is given to a polymer comprising recurring units having the formula (B1-1), recurring units having the formula (B5-1), and recurring units having the formula (B7) or (B10).

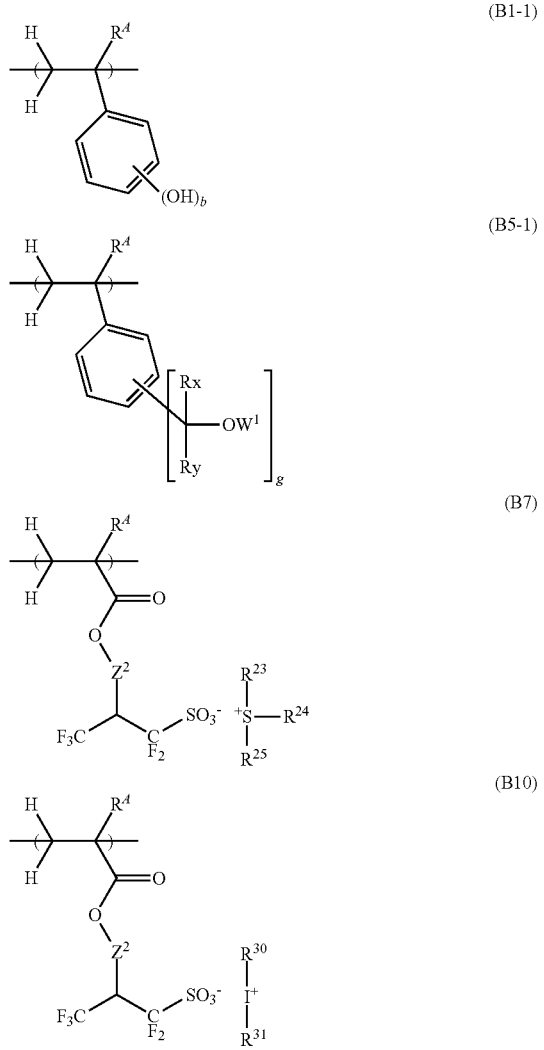

Herein $R^A$, $Z^2$, $R^{23}$, $R^{24}$, $R^{25}$, $R^{30}$, $R^{31}$, Rx, Ry, $W^1$, b, and g are as defined above.

When polymer B' is used as the base polymer (B), it is acceptable to use a mixture of a polymer free of recurring units (B6) to (B11) and a polymer containing recurring units (B6) to (B11). In this mixture, the amount of the polymer free of recurring units (B6) to (B11) is preferably 2 to 5,000 parts by weight, more preferably 10 to 1,000 parts by weight per 100 parts by weight of the polymer containing recurring units (B6) to (B11).

When the chemically amplified negative resist composition is used in the manufacture of a photomask by the advanced generation of lithography, the resist film has a thickness of up to 150 nm, preferably up to 100 nm. With respect to the base polymer in the resist composition, the dissolution rate of the base polymer in an alkaline developer, specifically 2.38 wt % tetramethylammonium hydroxide (TMAH) aqueous solution is preferably set at or below 80 nm/sec, more preferably at or below 50 nm/sec in order to form a finer size pattern, because an intense development process is often used in order to reduce defects due to resist residues. Also, when the resist composition is used in the manufacture of a LSI chip from a wafer by the EUV photolithography process, for example, the resist film thickness is often reduced below 100 nm because fine lines of 50 nm or less must be patterned. Because of a thin film, it is expected that a pattern is degraded by development. Then the dissolution rate of the base polymer is preferably set at or below 80 nm/sec, more preferably at or below 50 nm/sec. On the other hand, in the case of the KrF lithography process, the resist film thickness is often as thick as 200 nm or more, although the film thickness varies depending on a particular purpose. Then the dissolution rate of the base polymer is preferably set at or above 90 nm/sec.

The polymer may be synthesized by combining suitable monomers optionally protected with a protective group, copolymerizing them in the standard way, and effecting deprotection reaction if necessary. The copolymerization reaction is preferably radical polymerization or anionic polymerization though not limited thereto. For the polymerization reaction, reference may be made to WO 2006/121096, JP-A 2004-115630, JP-A 2008-102383, and JP-A 2008-304590.

The polymer should preferably have a weight average molecular weight (Mw) of 1,000 to 50,000, and more preferably 2,000 to 20,000. A Mw of at least 1,000 eliminates the phenomenon that pattern features are rounded at their top, and resolution and LER are degraded. A Mw of up to 50,000 eliminates the risk that LER is increased when a pattern having a line width of up to 100 nm is formed. As used herein, Mw is measured by GPC versus polystyrene standards.

The polymer preferably has a narrow molecular weight distribution or dispersity (Mw/Mn) of 1.0 to 2.0, more preferably 1.0 to 1.8. A polymer with such a narrow dispersity eliminates any foreign particles left on the pattern or profile degradation of the pattern after development.

(C) Crosslinker

When only polymer B is used as the base polymer in the negative resist composition, a crosslinker is preferably added. When the base polymer contains polymer B', a crosslinker need not be added.

Suitable crosslinkers which can be used herein include melamine compounds, guanamine compounds, glycoluril compounds and urea compounds having substituted thereon at least one group selected from among methylol, alkoxymethyl and acyloxymethyl groups, epoxy compounds, isocyanate compounds, azide compounds, and compounds having a double bond such as an alkenyl ether group. These compounds may be used as an additive or introduced into a polymer side chain as a pendant. Hydroxy-containing compounds may also be used as the crosslinker.

Of the foregoing crosslinkers, examples of suitable epoxy compounds include tris(2,3-epoxypropyl) isocyanurate, trimethylolmethane triglycidyl ether, trimethylolpropane triglycidyl ether, and triethylolethane triglycidyl ether. Examples of the melamine compound include hexamethylol melamine, hexamethoxymethyl melamine, hexamethylol melamine compounds having 1 to 6 methylol groups methoxymethylated and mixtures thereof, hexamethoxyethyl melamine, hexaacyloxymethyl melamine, hexamethylol melamine compounds having 1 to 6 methylol groups acyloxymethylated and mixtures thereof. Examples of the guanamine compound include tetramethylol guanamine, tetramethoxymethyl guanamine, tetramethylol guanamine compounds having 1 to 4 methylol groups methoxymethylated and mixtures thereof, tetramethoxyethyl guanamine, tetraacyloxyguanamine, tetramethylol guanamine compounds having 1 to 4 methylol groups acyloxymethylated and mixtures thereof. Examples of the glycoluril compound include tetramethylol glycoluril, tetramethoxyglycoluril, tetramethoxymethyl glycoluril, tetramethylol glycoluril compounds having 1 to 4 methylol groups methoxymethylated and mixtures thereof, tetramethylol glycoluril compounds having 1 to 4 methylol groups acyloxymethylated and mixtures thereof. Examples of the urea compound include tetramethylol urea, tetramethoxymethyl urea, tetramethylol urea compounds having 1 to 4 methylol groups methoxymethylated and mixtures thereof, and tetramethoxyethyl urea.

Suitable isocyanate compounds include tolylene diisocyanate, diphenylmethane diisocyanate, hexamethylene diisocyanate and cyclohexane diisocyanate. Suitable azide compounds include 1,1'-biphenyl-4,4'-bisazide, 4,4'-methylidenebisazide, and 4,4'-oxybisazide. Examples of the alkenyl ether group-containing compound include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylol propane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and trimethylol propane trivinyl ether.

An appropriate amount of the crosslinker (C) used is 2 to 50 parts, and more preferably 5 to 30 parts by weight per 100 parts by weight of the base polymer (B). As long as the amount of the crosslinker is in the range, the risk of resolution being reduced by forming bridges between pattern features is mitigated. The crosslinkers may be used alone or in admixture.

(D) Fluorinated Polymer

The resist composition may further comprise (D) a fluorinated polymer comprising recurring units having the formula (D1) and recurring units of at least one type selected from recurring units having the formulae (D2), (D3), (D4), and (D5), for the purposes of enhancing contrast, preventing chemical flare of acid upon exposure to high-energy radiation, preventing mixing of acid from an anti-charging film in the step of coating an anti-charging film-forming material on a resist film, and suppressing unexpected unnecessary pattern degradation. Notably, recurring units having formulae (D1), (D2), (D3), (D4), and (D5) are simply referred to as recurring units (D1), (D2), (D3), (D4), and (D5), respectively. Since the fluorinated polymer also has a surface active function, it can prevent insoluble residues from re-depositing onto the substrate during the development step and is thus effective for preventing development defects.

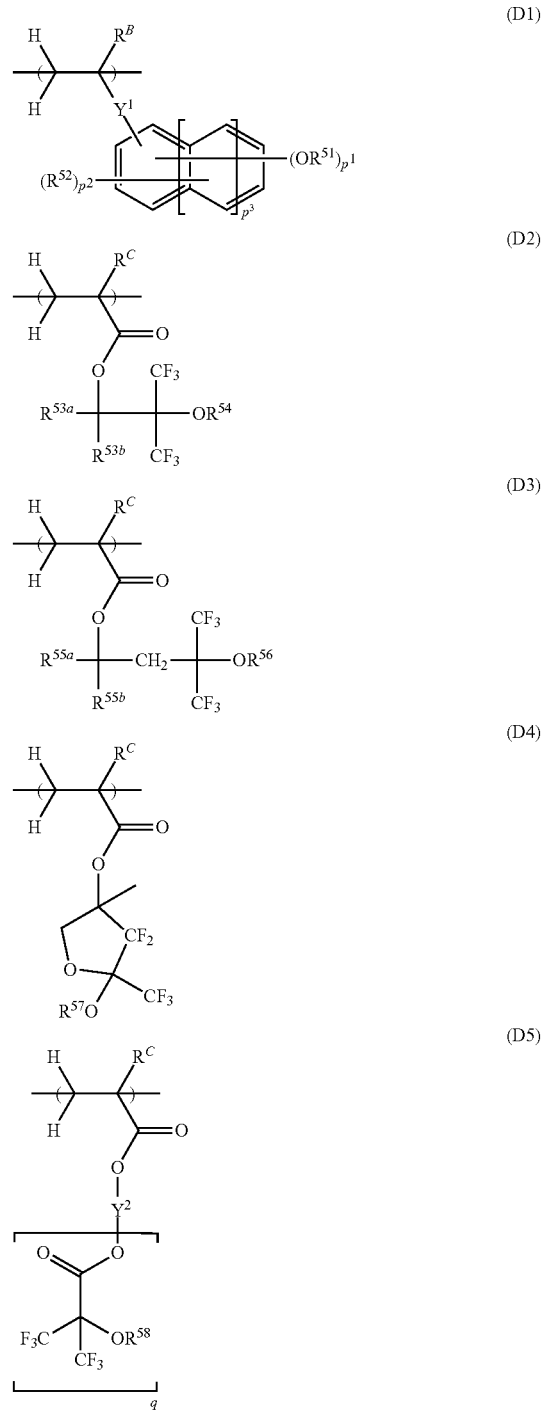

Herein $R^B$ is each independently hydrogen or methyl. $R^C$ is each independently hydrogen, fluorine, methyl or trifluoromethyl. $R^{51}$ is hydrogen or a $C_1$-$C_5$ straight or branched monovalent hydrocarbon group in which a heteroatom may intervene in a carbon-carbon bond. $R^{52}$ is a $C_1$-$C_5$ straight or branched monovalent hydrocarbon group in which a heteroatom may intervene in a carbon-carbon bond. $R^{53a}$, $R^{53b}$, $R^{55a}$ and $R^{55b}$ are each independently hydrogen or a $C_1$-$C_{10}$ alkyl group. $R^{54}$, $R^{56}$, $R^{57}$ and $R^{58}$ are each independently hydrogen, a $C_1$-$C_{15}$ monovalent hydrocarbon group or monovalent fluorinated hydrocarbon group, or an acid labile group, with the proviso that an ether or carbonyl moiety may intervene in a carbon-carbon bond in the monovalent hydrocarbon groups or monovalent fluorinated hydrocarbon groups represented by $R^{54}$, $R^{56}$, $R^{57}$ and $R^{58}$. $Y^1$ is a single bond, —C(=O)—O— or —C(=O)—NH—. $Y^2$ is a $C_1$-$C_{20}$ (q+1)-valent hydrocarbon group or fluorinated hydrocarbon group. The subscript $p^1$ is an integer of 1 to 3, $p^2$ is an integer in the range: $0 \leq p^2 \leq 5+2p^3-p^1$, $p^3$ is 0 or 1, and q is an integer of 1 to 3.

The monovalent hydrocarbon groups may be straight, branched or cyclic and examples thereof include alkyl, alkenyl and alkynyl groups, with the alkyl groups being preferred. Suitable alkyl groups include methyl, ethyl, n-propyl, isopropyl, n-butyl, isobutyl, sec-butyl, and n-pentyl. In these groups, a moiety containing a heteroatom such as oxygen, sulfur or nitrogen may intervene in a carbon-carbon bond.

In formula (D1), —$OR^{51}$ is preferably a hydrophilic group. In this case, $R^{51}$ is preferably hydrogen or a $C_1$-$C_5$ alkyl group in which oxygen intervenes in a carbon-carbon bond.

In formula (D1), $Y^1$ is preferably —C(=O)—O— or —C(=O)—NH—. Also preferably $R^B$ is methyl. The inclusion of carbonyl in $Y^1$ enhances the ability to trap the acid originating from the anti-charging film. A polymer wherein $R^B$ is methyl is a rigid polymer having a high glass transition temperature (Tg) which is effective for suppressing acid diffusion. As a result, the stability with time of a resist film is improved, and neither resolution nor pattern profile is degraded.

Examples of the recurring unit (D1) are given below, but not limited thereto. Herein $R^B$ is as defined above.

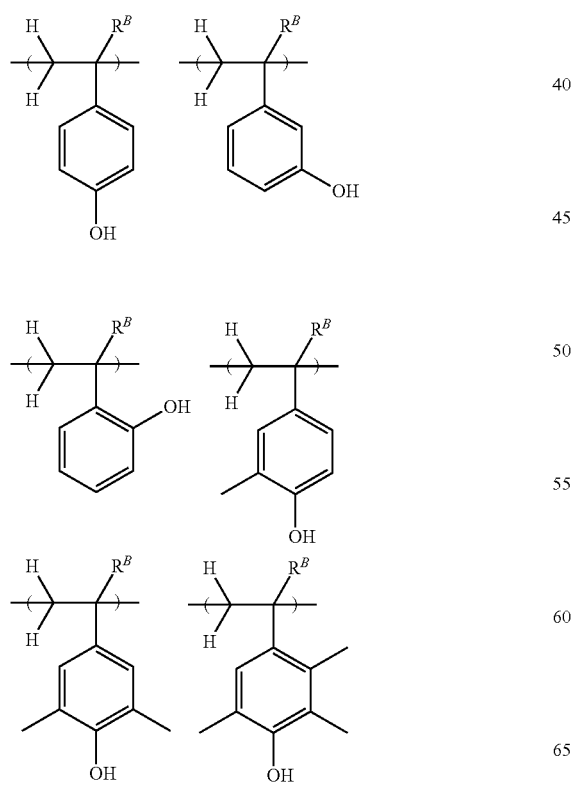

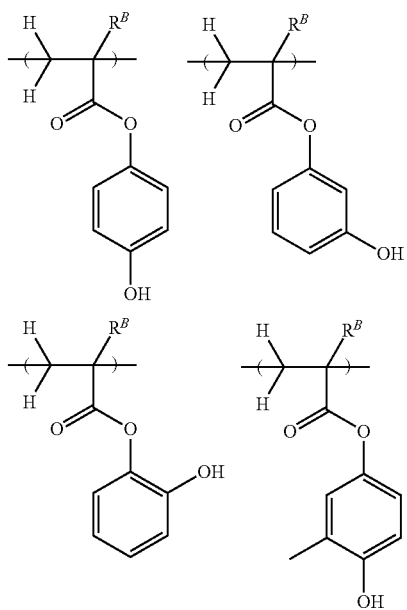

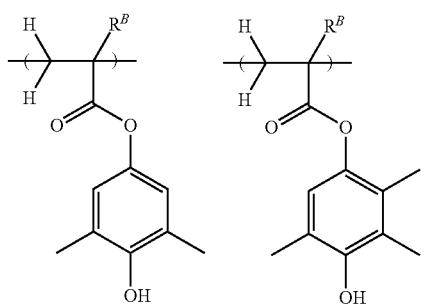

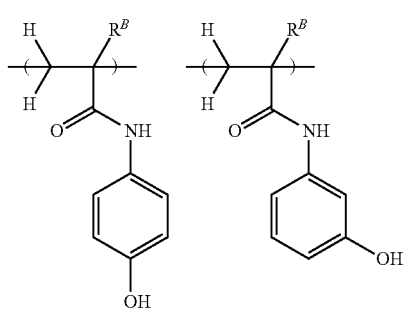

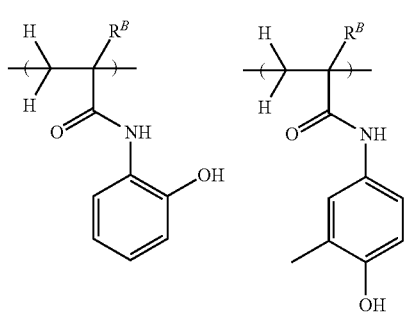

-continued
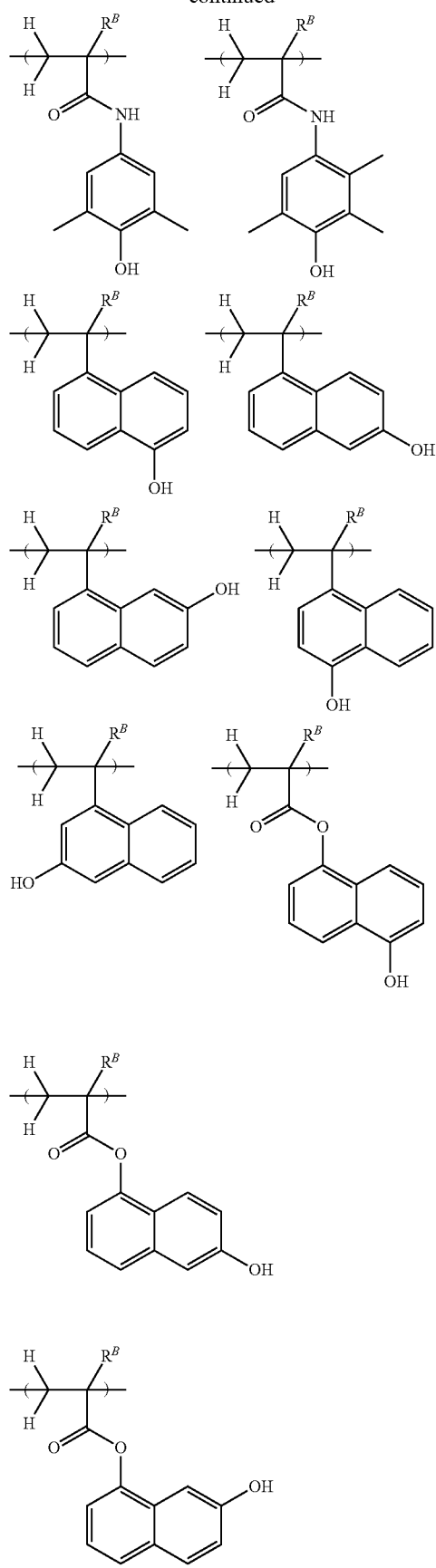
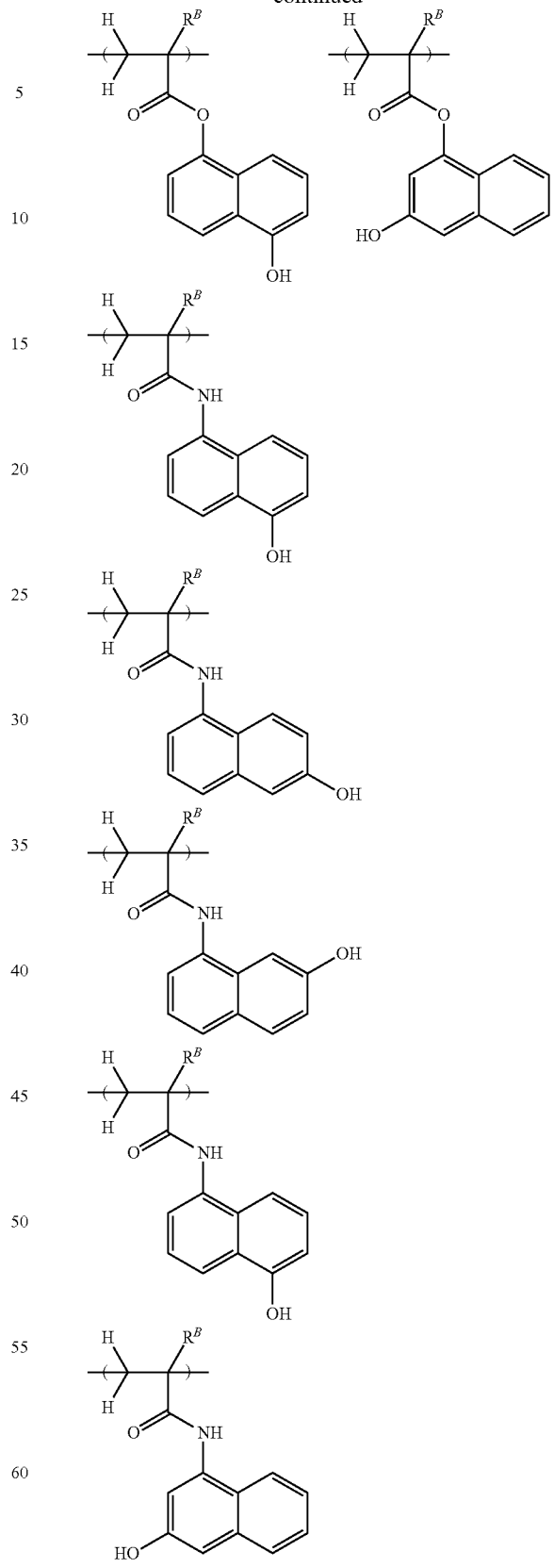
In formulae (D2) and (D3), examples of the alkyl group represented by $R^{53a}$, $R^{53b}$, $R^{55a}$ and $R^{55b}$ include methyl, ethyl, n-propyl, isopropyl, cyclopropyl, n-butyl, isobutyl, sec-butyl, tert-butyl, cyclobutyl, n-pentyl, cyclopentyl, n-hexyl, cyclohexyl, n-heptyl, n-octyl, n-nonyl, n-decyl, adamantyl, and norbornyl. Inter alia, $C_1$-$C_6$ straight, branched or cyclic alkyl groups are preferred.

In formulae (D2) to (D5), examples of the monovalent hydrocarbon group represented by $R^{54}$, $R^{56}$, $R^{57}$ and $R^{58}$ include alkyl, alkenyl and alkynyl groups, with the alkyl groups being preferred. Suitable alkyl groups include n-undecyl, n-dodecyl, tridecyl, tetradecyl and pentadecyl as well as those exemplified above. The monovalent fluorinated hydrocarbon groups correspond to the foregoing monovalent hydrocarbon groups in which some or all carbon-bonded hydrogen is substituted by fluorine.

Examples of the $C_1$-$C_{20}$ (q+1)-valent hydrocarbon group or fluorinated hydrocarbon group include the foregoing monovalent hydrocarbon groups and monovalent fluorinated hydrocarbon groups, with a number (q) of hydrogen atoms being eliminated.

Examples of the recurring units (D2) to (D5) are given below, but not limited thereto. Herein $R^C$ is as defined above.

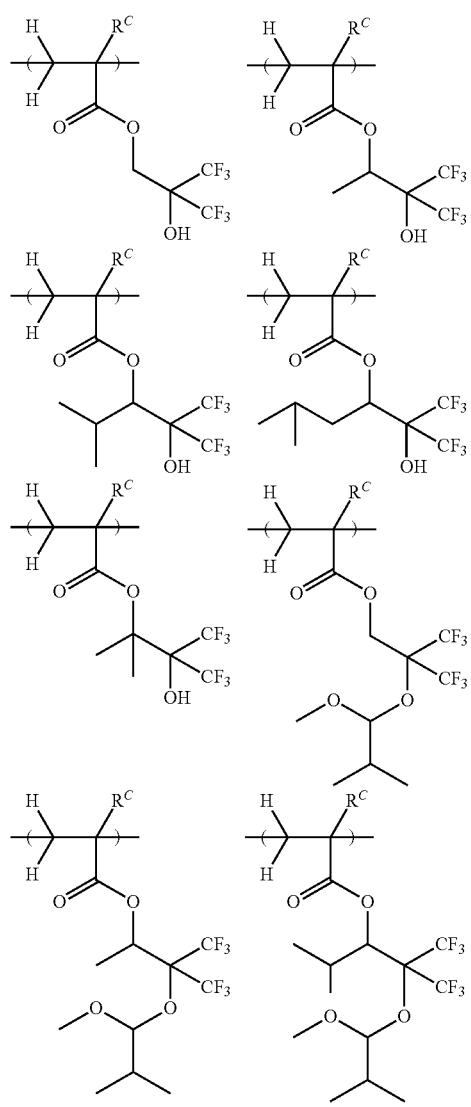

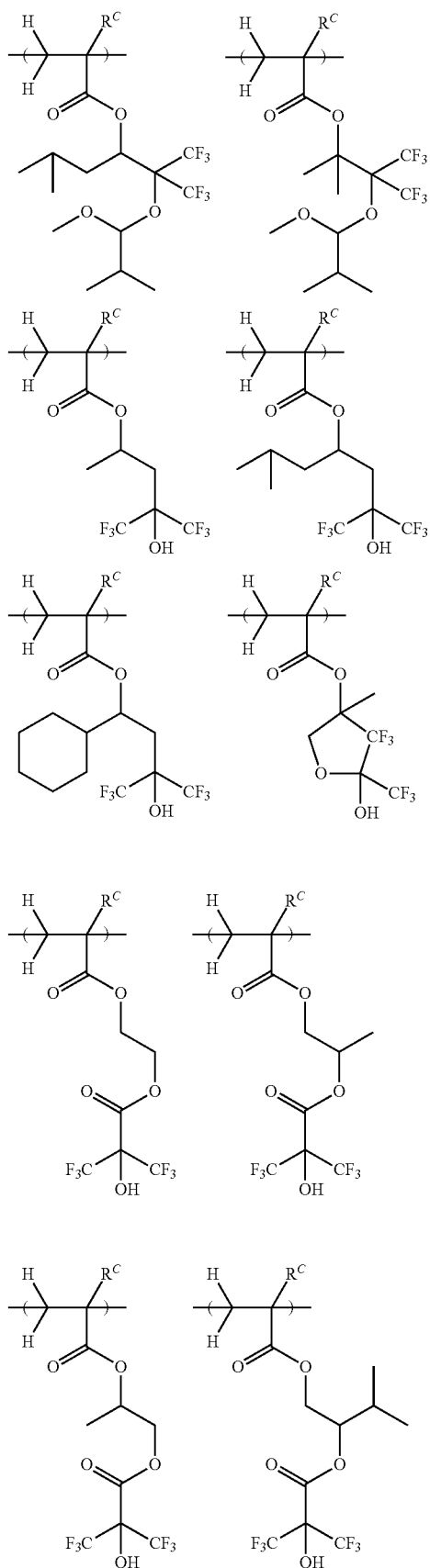

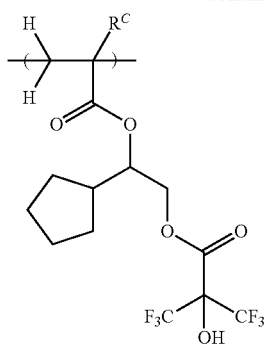
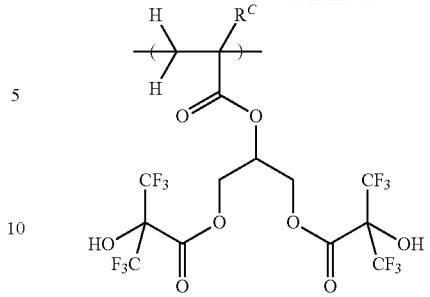
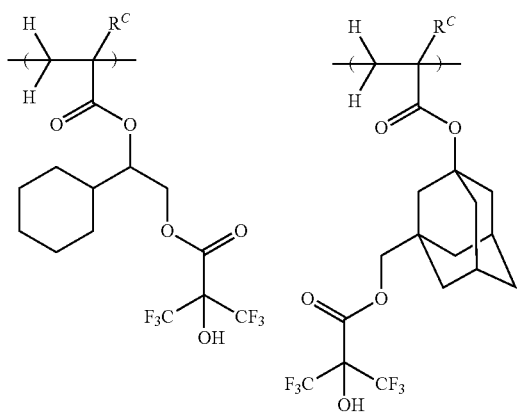
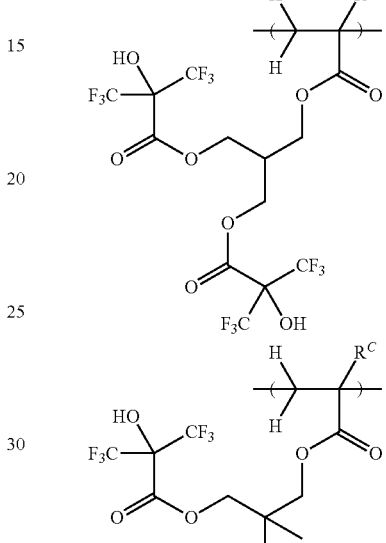
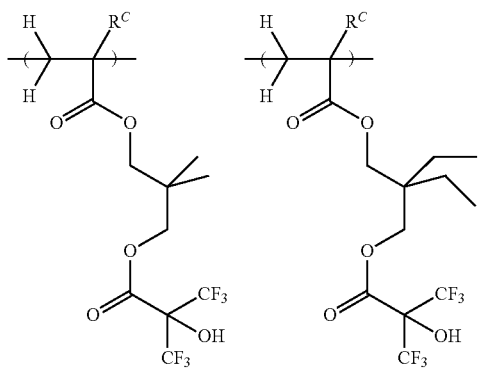
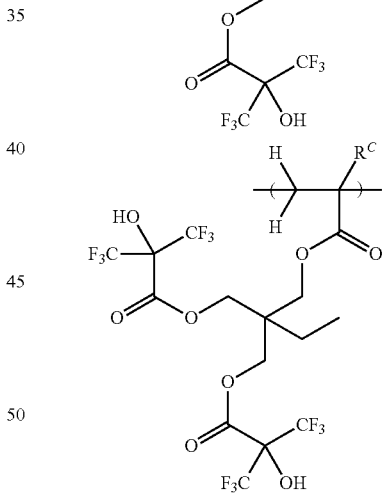
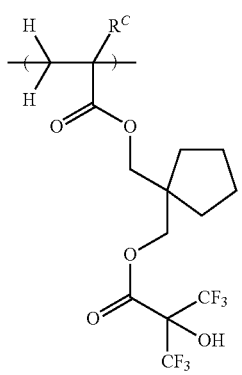

The recurring unit (D1) is preferably incorporated in an amount of 5 to 85 mol %, more preferably 15 to 80 mol % based on the overall recurring units of the fluorinated polymer (D). The recurring units (D2) to (D5), which may be used alone or in admixture, are preferably incorporated in an amount of 15 to 95 mol %, more preferably 20 to 85 mol % based on the overall recurring units of the fluorinated polymer (D).

The fluorinated polymer (D) may comprise additional recurring units as well as the recurring units (D1) to (D5). Suitable additional recurring units include those described in U.S. Pat. No. 9,091,918 (JP-A 2014-177407, paragraphs [0046]-[0078]). When the fluorinated polymer (D) comprises additional recurring units, their content is preferably up to 50 mol % based on the overall recurring units.

The fluorinated polymer (D) may be synthesized by combining suitable monomers optionally protected with a protective group, copolymerizing them in the standard way, and effecting deprotection reaction if necessary. The copolymerization reaction is preferably radical polymerization or anionic polymerization though not limited thereto. For the polymerization reaction, reference may be made to JP-A 2004-115630.

The fluorinated polymer (D) should preferably have a weight average molecular weight (Mw) of 2,000 to 50,000, and more preferably 3,000 to 20,000. A fluorinated polymer with a Mw of less than 2,000 helps acid diffusion, degrading resolution and detracting from age stability. A polymer with too high Mw has a reduced solubility in solvent, leading to coating defects. The fluorinated polymer preferably has a dispersity (Mw/Mn) of 1.0 to 2.2, more preferably 1.0 to 1.7.

The fluorinated polymer (D) is preferably used in an amount of 0.01 to 30 parts, more preferably 0.1 to 20 parts by weight per 100 parts by weight of the base polymer (B).

(E) Organic Solvent

The resist composition may further comprise (E) an organic solvent. The organic solvent used herein is not particularly limited as long as the components are soluble therein. Examples of the organic solvent are described in JP-A 2008-111103, paragraphs [0144]-[0145] (U.S. Pat. No. 7,537,880). Specifically, exemplary solvents include ketones such as cyclohexanone and methyl-2-n-pentyl ketone; alcohols such as 3-methoxybutanol, 3-methyl-3-methoxybutanol, 1-methoxy-2-propanol, 1-ethoxy-2-propanol, and diacetone alcohol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, t-butyl acetate, t-butyl propionate, and propylene glycol mono-t-butyl ether acetate; and lactones such as γ-butyrolactone, and mixtures thereof. Where an acid labile group of acetal form is used, a high-boiling alcohol solvent such as diethylene glycol, propylene glycol, glycerol, 1,4-butanediol or 1,3-butanediol may be added for accelerating deprotection reaction of acetal. Of the above organic solvents, it is recommended to use 1-ethoxy-2-propanol, PGMEA, propylene glycol monomethyl ether, cyclohexanone, ethyl lactate, γ-butyrolactone, and mixtures thereof.

An appropriate amount of the organic solvent (E) used is 200 to 10,000 parts, more preferably 400 to 5,000 parts by weight per 100 parts by weight of the base polymer (B).

(F) Quencher

The resist composition may further contain (F) a quencher, if desired. The quencher is a compound having a function of trapping the acid generated by the acid generator. The quencher is effective for holding down the rate of diffusion of the acid (generated by the acid generator) in the resist film. Even when a substrate whose outermost surface is made of a chromium-containing material is used as a processable substrate, the quencher is effective for suppressing the influence of the acid (generated in the resist film) on the chromium-containing material.

One preferred example of the quencher is an onium salt of carboxylic acid having the formula (Q-A).

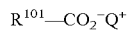  (Q-A)

In formula (Q-A), $R^{101}$ is a $C_1$-$C_{40}$ monovalent hydrocarbon group which may contain a heteroatom. The monovalent hydrocarbon group may be straight, branched or cyclic. Examples include $C_1$-$C_{40}$ alkyl groups, $C_2$-$C_{40}$ alkenyl groups, $C_2$-$C_{40}$ alkynyl groups, $C_6$-$C_{40}$ aryl groups, and $C_7$-$C_{40}$ aralkyl groups. In these hydrocarbon groups, some or all hydrogen may be substituted by a hydroxyl, carboxyl, halogen, cyano, amide, nitro, mercapto, sultone, sulfone or sulfonium salt-containing moiety, and some carbon may be replaced by an ether bond, ester bond, carbonyl moiety, carbonate moiety or sulfonic acid ester bond.

In formula (Q-A), $Q^+$ is an onium cation. Suitable onium cations include sulfonium, iodonium and ammonium cations, with the sulfonium cations being preferred. Preferred sulfonium cations are as exemplified above for the sulfonium cation having formula (A-A).

When the carboxylic onium salt having formula (Q-A) is contained as the quencher, its content is preferably 0.1 to 40 parts by weight, more preferably 0.1 to 20 parts by weight per 100 parts by weight of the base polymer (B).

Another preferred example of the quencher is an onium salt of carboxylic acid having the formula (Q-B) or (Q-C).

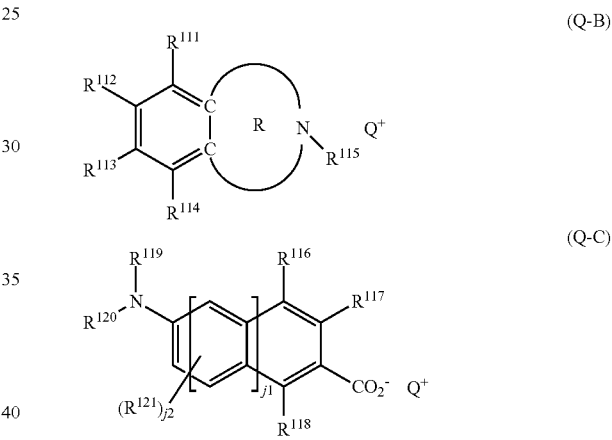

Herein, $Q^+$ is as defined above.

In formula (Q-B), $R^{111}$ to $R^{114}$ are each independently hydrogen, $-L^A$-$CO_2^-$, or a $C_1$-$C_{20}$ monovalent hydrocarbon group which may contain a heteroatom. A pair of $R^{111}$ and $R^{112}$, $R^{112}$ and $R^{113}$, or $R^{113}$ and $R^{114}$ may bond together to form a ring with the carbon atoms to which they are attached. $L^A$ is a single bond or a $C_1$-$C_{20}$ divalent hydrocarbon group which may contain a heteroatom. $R^{115}$ is hydrogen or a $C_1$-$C_{20}$ monovalent hydrocarbon group which may contain a heteroatom.

In formula (Q-B), the ring R is a ring of 2 to 6 carbon atoms including the carbon and nitrogen atoms depicted in the formula, in which some or all carbon-bonded hydrogen may be substituted by a $C_1$-$C_{20}$ monovalent hydrocarbon moiety or $-L^A$-$CO_2^-$, or some carbon may be replaced by sulfur, oxygen or nitrogen. The ring may be alicyclic or aromatic and is preferably a 5- or 6-membered ring. Examples include pyridine, pyrrole, pyrrolidine, piperidine, pyrazole, imidazoline, pyridazine, pyrimidine, pyrazine, imidazoline, oxazole, thiazole, morpholine, thiazine, and triazole rings.

The carboxylic onium salt having formula (Q-B) has at least one $-L^A$-$CO_2^-$ group.

In formula (Q-C), $R^{116}$ to $R^{121}$ are each independently hydrogen or a $C_1$-$C_{20}$ monovalent hydrocarbon group which may contain a heteroatom. A pair of $R^{116}$ and $R^{117}$, or $R^{118}$ and $R^{121}$ may bond together to form a ring with the carbon atoms to which they are attached, and a pair of $R^{119}$ and $R^{120}$ may bond together to form a ring with the nitrogen atom to which they are attached. The subscript j1 is 0 or 1, and j2 is 0 or 1 in case of j1=0 and j2 is an integer of 0 to 3 in case of j1=1.

When the carboxylic onium salt having formula (Q-B) or (Q-C) is contained as the quencher, its content is preferably 0.1 to 50 parts by weight, more preferably 0.5 to 30 parts by weight per 100 parts by weight of the base polymer (B).

A further preferred example of the quencher is a sulfonium compound having the formula (Q-D).

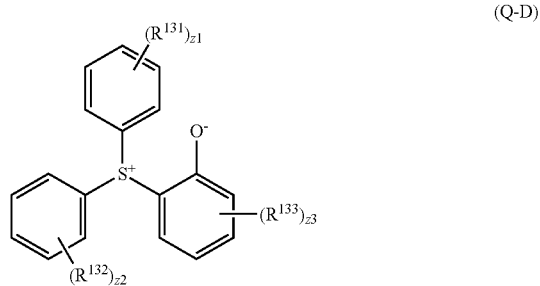

In formula (Q-D), $R^{131}$, $R^{132}$ and $R^{133}$ are each independently a $C_1$-$C_{20}$ monovalent hydrocarbon group which may contain a heteroatom. In the hydrocarbon group, some hydrogen may be substituted by a moiety containing a heteroatom such as oxygen, sulfur, nitrogen or halogen, or some carbon may be replaced by a moiety containing a heteroatom such as oxygen, sulfur or nitrogen, or the carbon atom (in the hydrocarbon group) bonded to the benzene ring may be replaced by a moiety containing a heteroatom such as oxygen, sulfur or nitrogen, so that the group may contain a hydroxyl moiety, cyano moiety, carbonyl moiety, ether bond, thioether bond, ester bond, sulfonic acid ester bond, carbonate bond, carbamate bond, lactone ring, sultone ring, carboxylic anhydride or haloalkyl moiety.

In formula (Q-D), z1 and z2 are each independently an integer of 0 to 5, and z3 is an integer of 0 to 4. From the standpoints of ease of synthesis and availability of reactants, z1, z2 and z3 each are preferably 0, 1 or 2.

When z1 is 2 to 5, two adjoining $R^{131}$ may bond together to form a ring with the carbon atoms to which they are attached. When z2 is 2 to 5, two adjoining $R^{132}$ may bond together to form a ring with the carbon atoms to which they are attached. When z3 is 2 to 4, two adjoining $R^{133}$ may bond together to form a ring with the carbon atoms to which they are attached.

When the sulfonium compound having formula (Q-D) is contained as the quencher, its content is preferably 0.1 to 40 parts by weight, more preferably 1 to 20 parts by weight per 100 parts by weight of the base polymer (B).

In combination with the above-mentioned onium salt compound, a photo-decomposable onium salt having a nitrogen-containing substituent group may be used as the quencher, if desired. This compound functions as a quencher in the unexposed region, but as a so-called photo-degradable base in the exposed region because it loses the quencher function in the exposed region due to neutralization thereof with the acid generated by itself. Using a photo-degradable base, the contrast between exposed and unexposed regions can be further enhanced. With respect to the photo-degradable base, reference may be made to JP-A 2009-109595, 2012-046501 and JP-A 2013-209360, for example. When the photo-degradable base is contained as the quencher, its content is preferably 0.1 to 40 parts by weight, more preferably 0.1 to 20 parts by weight per 100 parts by weight of the base polymer (B).

Also, an amine compound may be used as the quencher. Suitable amine compounds include primary, secondary and tertiary amine compounds as described in JP-A 2008-111103, paragraphs [0146]-[0164] (U.S. Pat. No. 7,537,880), especially amine compounds having a hydroxyl group, ether bond, ester bond, lactone ring, cyano group or sulfonic acid ester bond. Also useful are compounds having primary or secondary amine protected with a carbamate group, as described in JP 3790649. When the amine compound is contained as the quencher, its content is preferably 0.001 to 12 parts by weight, more preferably 0.01 to 8 parts by weight per 100 parts by weight of the base polymer (B).

(G) Surfactant

In the resist composition, any of surfactants commonly used for improving coating characteristics to the substrate may be added as an optional component. Numerous surfactants are known in the art including PF-636 (Omnova Solutions), FC-4430 (3M), and those described in JP-A 2004-115630, for example. A choice may be made with reference to such patent documents. An appropriate amount of the surfactant (G) used is 0 to 5 parts by weight per 100 parts by weight of the base polymer (B).

Patterning Process

A further embodiment of the invention is a resist pattern forming process comprising the steps of applying the resist composition defined above onto a processable substrate to form a resist film thereon, exposing the resist film patternwise to high-energy radiation, and developing the resist film in an alkaline developer to form a resist pattern.

Pattern formation using the negative resist composition of the invention may be performed by well-known lithography processes. In general, the resist composition is first applied onto a processable substrate such as a substrate for IC fabrication (e.g., Si, SiO, $SiO_2$, SiN, SiON, TiN, WSi, BPSG, SOG, organic antireflective coating, etc.) or a substrate for mask circuit fabrication (e.g., Cr, CrO, CrON, $MoSi_2$, Si, SiO, $SiO_2$, etc.) by a suitable coating technique such as spin coating. The coating is prebaked on a hotplate at a temperature of 60 to 150° C. for 1 to 20 minutes, preferably at 80 to 140° C. for 1 to 10 minutes to form a resist film of 0.03 to 2 μm thick.

Then the resist film is exposed patternwise to high-energy radiation such as UV, deep UV, excimer laser (KrF, ArF), EUV, x-ray, γ-ray or synchrotron radiation through a mask having a desired pattern or directly by EB writing. The exposure dose is preferably 1 to 300 $mJ/cm^2$, more preferably 10 to 200 $mJ/cm^2$ in the case of UV, deep UV, excimer laser, EUV or x-ray, or 1 to 300 $\mu C/cm^2$, more preferably 10 to 200 $\mu C/cm^2$ in the case of EB.

The exposure may be performed by conventional lithography whereas the immersion lithography of holding a liquid between the mask and the resist film may be employed if desired. When the immersion lithography is applied, a protective film which is insoluble in water may be formed on the resist film. The inventive resist composition is especially useful in the EUV or EB lithography.

The resist film is then baked (PEB) on a hotplate at 60 to 150° C. for 1 to 20 minutes, preferably at 80 to 140° C. for 1 to 10 minutes. Thereafter the resist film is developed with a developer in the form of an aqueous base solution, for example, 0.1 to 5 wt %, preferably 2 to 3 wt % aqueous solution of tetramethylammonium hydroxide (TMAH) for 0.1 to 3 minutes, preferably 0.5 to 2 minutes by conventional techniques such as dip, puddle and spray techniques. In this way, a desired resist pattern is formed on the substrate.

From the resist composition, a pattern with a high resolution and minimal LER may be formed, especially a hole or dot pattern of rectangular profile may be formed. The resist composition is effectively applicable to a processable substrate, specifically a substrate having a surface layer of material to which a resist film is less adherent and which is likely to invite pattern stripping or pattern collapse, and particularly a substrate having sputter deposited thereon metallic chromium or a chromium compound containing at least one light element selected from oxygen, nitrogen and carbon or a substrate having an outermost surface layer of $SiO_x$. The invention is especially effective for pattern formation on a photomask blank as the substrate.

Even on use of a processable substrate having an outermost surface layer made of a chromium or silicon-containing material which tends to adversely affect the profile of resist pattern, typically photomask blank, the resist pattern forming process is successful in forming a hole or dot pattern of rectangular profile via exposure because the resist composition is effective for controlling acid diffusion at the substrate interface, i.e., exerting an appropriate dissolution inhibitory effect.

EXAMPLE

Examples and Comparative Examples are given below by way of illustration and not by way of limitation. All parts are by weight (pbw); THF stands for tetrahydrofuran; Mw is a weight average molecular weight as measured by GPC versus polystyrene standards. The copolymer compositional ratio is a molar ratio.

[1] Synthesis of Sulfonium Salts

Synthesis Example 1-1

Synthesis of triphenylsulfonium 4-(2,4,6-trinorbornylbenzenesulfonyloxy)benzenesulfonate (PAG-1)

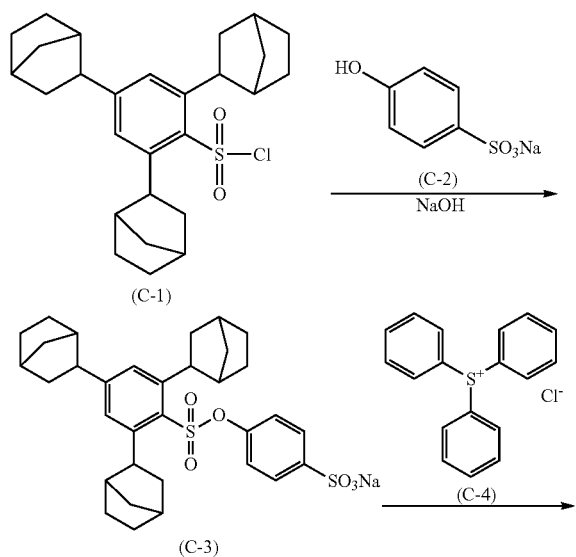

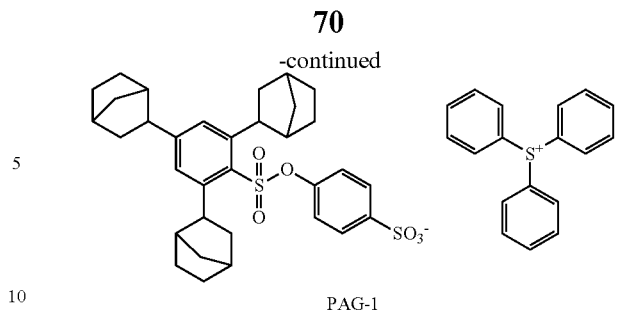

PAG-1

In a mixture of 20 g of THF and 15 g of $H_2O$ was suspended 4.32 g of sodium 4-hydroxybenzenesulfonate (C-2). Under ice cooling, 3.20 g of 25 wt % NaOH was added dropwise to the suspension, which was stirred for 1 hour. A solution of 4.59 g of 2,4,6-trinorbornylbenzenesulfonyl chloride (C-1) in 25 g of THF was added dropwise to the solution, which was stirred for 3 hours at room temperature until sodium 4-(2,4,6-trinorbornylbenzenesulfonyloxy)benzenesulfonate (C-3) was obtained. Next, 50 g of a 5 wt % aqueous solution of triphenylsulfonium chloride (C-4) and 50 g of methylene chloride were added to the reaction solution. After 30 minutes of stirring, the organic layer was taken out, washed with water, and concentrated under reduced pressure. Methyl isobutyl ketone, 10 mL, was added to the concentrate, which was concentrated again. The precipitated solid was washed with diisopropyl ether and dried in vacuum. The target compound was obtained, i.e., 4.04 g of triphenylsulfonium 4-(2,4,6-trinorbornylbenzenesulfonyloxy)benzenesulfonate, designated PAG-1, as white crystal (yield 47%).

Synthesis Example 1-2

Synthesis of triphenylsulfonium 2-isopropyl-5-methyl-4-(2,4,6-trinorbornylbenzenesulfonyloxy) benzenesulfonate (PAG-2)

Synthesis was carried out as in Synthesis Example 1-1 aside from using sodium 2-isopropyl-5-methyl-4-hydroxybenzenesulfonate instead of sodium 4-hydroxybenzenesulfonate (C-2). There was obtained 3.94 g of PAG-2 (yield 43%).

Synthesis Example 1-3

Synthesis of 10-phenylphenoxathiinium 2-isopropyl-5-methyl-4-(2,4,6-trinorbornyl-benzenesulfonyloxy)benzenesulfonate (PAG-3)

Synthesis was carried out as in Synthesis Example 1-1 aside from using an aqueous solution of 10-phenylphenoxathiinium chloride instead of the aqueous solution of triphenylsulfonium chloride (C-4). There was obtained 4.72 g of PAG-3 (yield 51%).

Synthesis Example 1-4

Synthesis of 10-phenylphenoxathiinium 2-isopropyl-5-methyl-4-(2,4,6-trioxanorbornyl-benzenesulfonyloxy)benzenesulfonate (PAG-4)

Synthesis was carried out as in Synthesis Example 1-1 aside from using 2,4,6-trioxanorbornylbenzenesulfonyl chloride instead of 2,4,6-trinorbornylbenzenesulfonyl chloride (C-1), sodium 2-isopropyl-5-methyl-4-hydroxybenzenesulfonate instead of sodium 4-hydroxybenzenesulfonate (C-2), and an aqueous solution of 10-phenylphenoxathiinium chloride instead of the aqueous solution of triphenylsulfonium chloride (C-4). There was obtained 4.40 g of PAG-4 (yield 47%).

Synthesis Example 1-5

Synthesis of 10-phenylphenoxathiinium 2,6-diisopropyl-4-(2,4,6-trinorbornylbenzenesulfonyloxy) benzenesulfonate (PAG-5)

Synthesis was carried out as in Synthesis Example 1-1 aside from using sodium 2,6-diisopropyl-4-hydroxybenzenesulfonate instead of sodium 4-hydroxybenzenesulfonate (C-2), and an aqueous solution of 10-phenylphenoxathiinium chloride instead of the aqueous solution of triphenylsulfonium chloride (C-4). There was obtained 5.27 g of PAG-5 (yield 55%).

Synthesis Example 1-6

Synthesis of 10-phenylphenoxathiinium 4-{2,4,6-tri (7,7-dimethylnorbornyl) benzenesulfonyloxy}benzenesulfonate (PAG-6)

Synthesis was carried out as in Synthesis Example 1-1 aside from using 2,4,6-tri(7,7-dimethylnorbornyl)benzenesulfonyl chloride instead of 2,4,6-trinorbornylbenzenesulfonyl chloride (C-1), and an aqueous solution of 10-phenylphenoxathiinium chloride instead of the aqueous solution of triphenylsulfonium chloride (C-4). There was obtained 4.83 g of PAG-6 (yield 51%).

[2] Synthesis of Monomer

Synthesis Example 2

Synthesis of Monomer 1

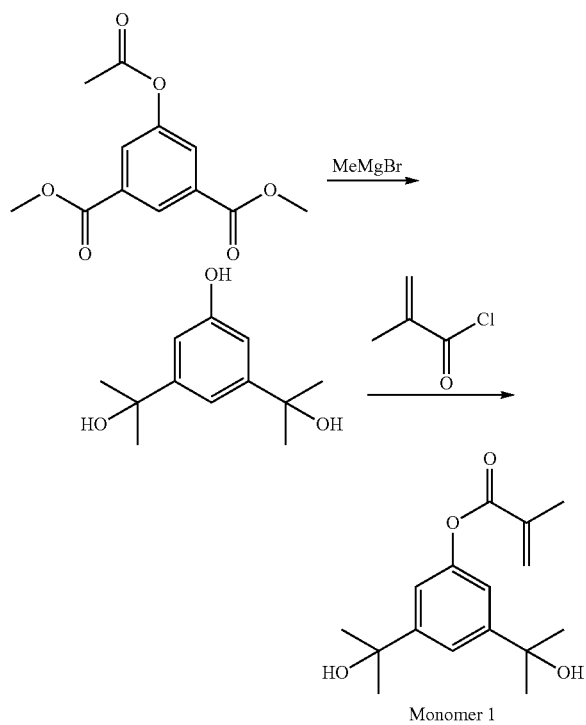

Monomer 1

In a reactor, 270 g of dimethyl 3-acetoxyisophthalate was dissolved in 3.5 kg of THF. Then 3.6 kg of THF solution of 3 mol/L methylmagnesium chloride was added dropwise over 2 hours to the reactor in a water bath at 50° C. Under ice cooling, 5 kg of saturated ammonium chloride aqueous solution was added to the reaction solution. The organic layer was taken out and the water layer was extracted with 3 kg of ethyl acetate, followed by concentration under reduced pressure. Toluene was added to the concentrate, which was concentrated again. The precipitated solid was washed with hexane and dried under reduced pressure, obtaining 187 g of the desired compound, 3,5-bis(2-hydroxy-2-propyl)phenol as white solid (yield 73%).

Subsequently, 515 g of 3,5-bis(2-hydroxy-2-propyl)phenol, 417 g of triethylamine and 1,500 g of THF were mixed. To the mixture, 282 g of methacryloyl chloride was added dropwise over 1 hour, followed by stirring at room temperature for 3 hours. Under ice cooling, 750 g of 10 wt % HCl aqueous solution and 1,500 g of ethyl acetate were added. The organic layer was taken out, washed with water, and concentrated under reduced pressure. The precipitated solid was dissolved in acetone and recrystallized from hexane. The resulting solid was dried under reduced pressure, obtaining 486 g of the target compound, 3,5-bis(2-hydroxy-2-propyl)phenyl methacrylate as white solid (yield 80%). It is designated Monomer 1, from which recurring units C-5 are derived.

[3] Synthesis of Base Polymers

Synthesis Example 3-1

Synthesis of Polymer A1

A 3-L flask was charged with 314.4 g of 5-acetoxyacenaphthylene, 22.0 g of 4-chlorostyrene, 190.7 g of indene, and 675 g of toluene as solvent. The reactor was cooled at −70° C. in a nitrogen atmosphere, after which vacuum pumping and nitrogen blow were repeated three times. The reactor was warmed up to room temperature, whereupon 40.5 g of 2,2'-azobis(2,4-dimethylvaleronitrile) (V-65 by Wako Pure Chemical Industries, Ltd.) was added as polymerization initiator. The reactor was heated at 45° C., whereupon reaction ran for 20 hours. The reactor was then heated at 55° C., whereupon reaction ran for a further 20 hours. The reaction solution was concentrated to a half volume. The concentrate was added to 15.0 L of methanol for precipitation. The precipitated white solid was collected by filtration and vacuum dried at 40° C., obtaining 309 g of a polymer.

The polymer was again dissolved in a mixture of 488 g of methanol and 540 g of THF, to which 162 g of triethylamine and 32 g of water were added. The reaction mixture was heated at 60° C. for 40 hours for deprotection reaction. The reaction solution was concentrated and dissolved in 870 g of ethyl acetate. This was followed by neutralization/separation/washing once with a mixture of 250 g water and 98 g acetic acid, once with a mixture of 225 g water and 75 g pyridine, and separation/washing 4 times with 225 g water. Thereafter, the upper layer, ethyl acetate solution was concentrated. The concentrate was dissolved in 250 g of acetone and precipitated from 15 L of water, filtered, and vacuum dried at 50° C. for 40 hours, obtaining 223 g of Polymer A1 white solid. Polymer A1 was analyzed by $^{13}$C-NMR and $^{1}$H-NMR spectroscopy to determine a compositional ratio of recurring units and by GPC to determine Mw and Mw/Mn, with the results shown below.

Polymer A1

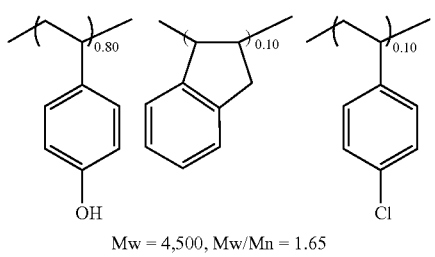

Mw = 4,500, Mw/Mn = 1.65

Synthesis Example 3-2

Synthesis of Polymer A8

In nitrogen atmosphere, 890 g of a 50.0 wt % PGMEA solution of 4-hydroxystyrene, 47.7 g of acenaphthylene, 310 g of a 54.7 wt % PGMEA solution of 4-(2-hydroxy-2-propyl)styrene, 87.0 g of triphenylsulfonium 1,1,3,3,3-pentafluoro-2-methacryloyloxypropane-1-sulfonate, 96.1 g of dimethyl 2,2'-azobis(2-methylpropionate) (V-601 by Wako Pure Chemical Industries, Ltd.), and 360 g of γ-butyrolactone and 220 g of PGMEA as solvent were fed into a 3000-mL dropping cylinder to form a monomer solution. A 5000-mL flask in nitrogen atmosphere was charged with 580 g of γ-butyrolactone, which was heated at 80° C. The monomer solution was added dropwise to the flask over 4 hours. After the completion of dropwise addition, the polymerization solution was continuously stirred for 18 hours while maintaining the temperature of 80° C. After the polymerization solution was cooled to room temperature, it was added dropwise to 22.5 kg of diisopropyl ether, during which a copolymer agglomerated. After diisopropyl ether was removed by decantation, the copolymer was dissolved in 2,250 g of acetone. The acetone solution was added dropwise to 22.5 kg of diisopropyl ether, and the precipitated copolymer was collected by filtration. The copolymer was dissolved in 2,250 g of acetone again. The acetone solution was added dropwise to 22.5 kg of water, and the precipitated copolymer was collected by filtration. The copolymer was dried at 40° C. for 40 hours, obtaining 700 g of Polymer A8 as white solid. Polymer A8 was analyzed by $^{13}$C-NMR and $^1$H-NMR spectroscopy to determine a compositional ratio of recurring units and by GPC to determine Mw and Mw/Mn, with the results shown below.

Polymer A8

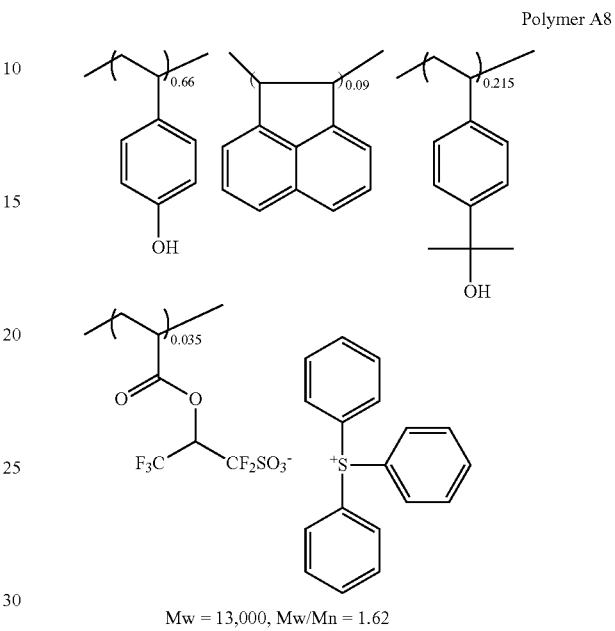

Mw = 13,000, Mw/Mn = 1.62

Synthesis Examples 3-3 to 3-20

Synthesis of Polymers A2 to A7 and A9 to A20

Polymers A2 to A7 and A9 to A20 were synthesized by the same procedure as in Synthesis Example 3-1 or 3-2 except that the type and amount of monomers were changed.

Table 1 shows the type and proportion (in molar ratio) of recurring units incorporated in Polymers A1 to A20. Tables 2 to 5 show the structure of recurring units.

TABLE 1

|  | Unit 1 | Proportion (mol %) | Unit 2 | Proportion (mol %) | Unit 3 | Proportion (mol %) | Unit 4 | Proportion (mol %) | Mw | Mw/Mn |
|---|---|---|---|---|---|---|---|---|---|---|
| Polymer A1 | A-1 | 80.0 | B-1 | 10.0 | B-5 | 10.0 | — | — | 4,500 | 1.65 |
| Polymer A2 | A-1 | 80.0 | B-2 | 8.0 | B-4 | 12.0 | — | — | 4,400 | 1.64 |
| Polymer A3 | A-1 | 60.0 | B-2 | 10.0 | C-1 | 30.0 | — | — | 3,700 | 1.62 |
| Polymer A4 | A-1 | 70.0 | B-2 | 7.0 | C-2 | 23.0 | — | — | 3,600 | 1.63 |
| Polymer A5 | A-1 | 70.0 | B-2 | 10.0 | C-3 | 20.0 | — | — | 3,900 | 1.65 |
| Polymer A6 | A-1 | 70.0 | B-2 | 10.0 | C-4 | 20.0 | — | — | 4,200 | 1.64 |
| Polymer A7 | A-1 | 55.0 | B-4 | 10.0 | C-1 | 35.0 | — | — | 4,000 | 1.63 |
| Polymer A8 | A-1 | 66.0 | B-2 | 9.0 | C-1 | 21.5 | P-1 | 3.5 | 13,000 | 1.62 |
| Polymer A9 | A-1 | 60.0 | B-2 | 4.0 | C-1 | 24.0 | P-1 | 12.0 | 15,000 | 1.65 |
| Polymer A10 | A-1 | 67.0 | B-2 | 10.0 | C-1 | 18.5 | P-2 | 4.5 | 14,000 | 1.63 |
| Polymer A11 | A-1 | 67.0 | B-2 | 9.3 | C-1 | 20.0 | P-3 | 3.7 | 13,500 | 1.63 |
| Polymer A12 | A-1 | 67.3 | B-2 | 10.0 | C-1 | 17.5 | P-4 | 5.2 | 13,200 | 1.64 |
| Polymer A13 | A-1 | 64.1 | B-2 | 9.5 | C-1 | 22.0 | P-5 | 4.4 | 12,800 | 1.62 |
| Polymer A14 | A-1 | 64.0 | B-2 | 10.0 | C-1 | 22.8 | P-6 | 3.2 | 13,500 | 1.63 |
| Polymer A15 | A-1 | 62.0 | B-3 | 10.0 | C-1 | 24.3 | P-1 | 3.7 | 12,400 | 1.66 |
| Polymer A16 | A-2 | 60.5 | B-4 | 10.0 | C-1 | 24.4 | P-2 | 5.1 | 12,300 | 1.65 |
| Polymer A17 | A-1 | 50.0 | B-6 | 10.0 | C-1 | 40.0 | — | — | 4,100 | 1.66 |
| Polymer A18 | A-1 | 58.0 | B-6 | 8.5 | C-1 | 30.0 | P-1 | 3.5 | 12,900 | 1.62 |
| Polymer A19 | A-1 | 50.0 | B-2 | 10.0 | C-5 | 40.0 | — | — | 3,900 | 1.62 |
| Polymer A20 | A-1 | 60.0 | B-2 | 8.5 | C-5 | 28.0 | P-1 | 3.5 | 12,800 | 1.64 |

TABLE 2
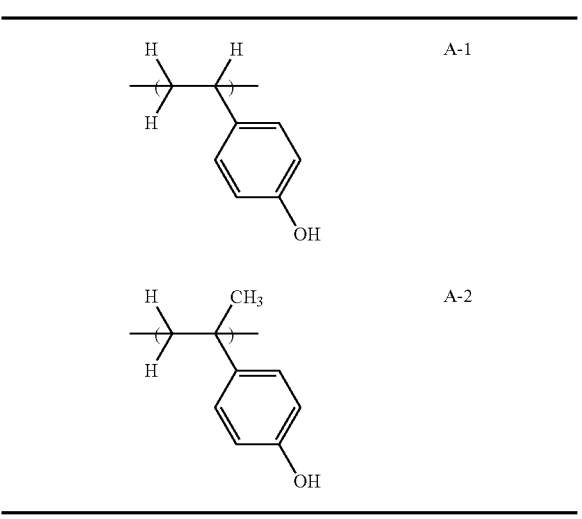
TABLE 3
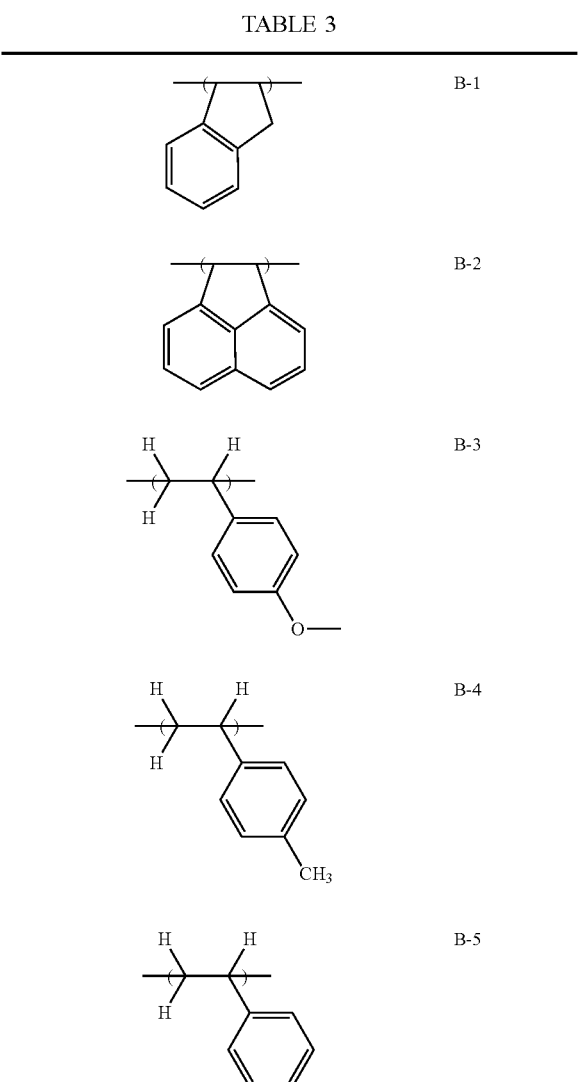
TABLE 3-continued
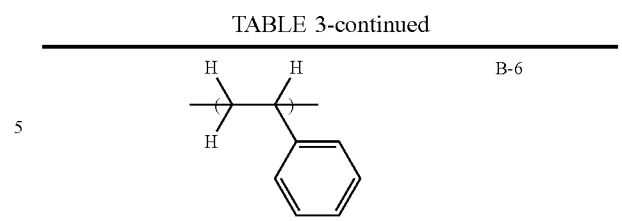
TABLE 4
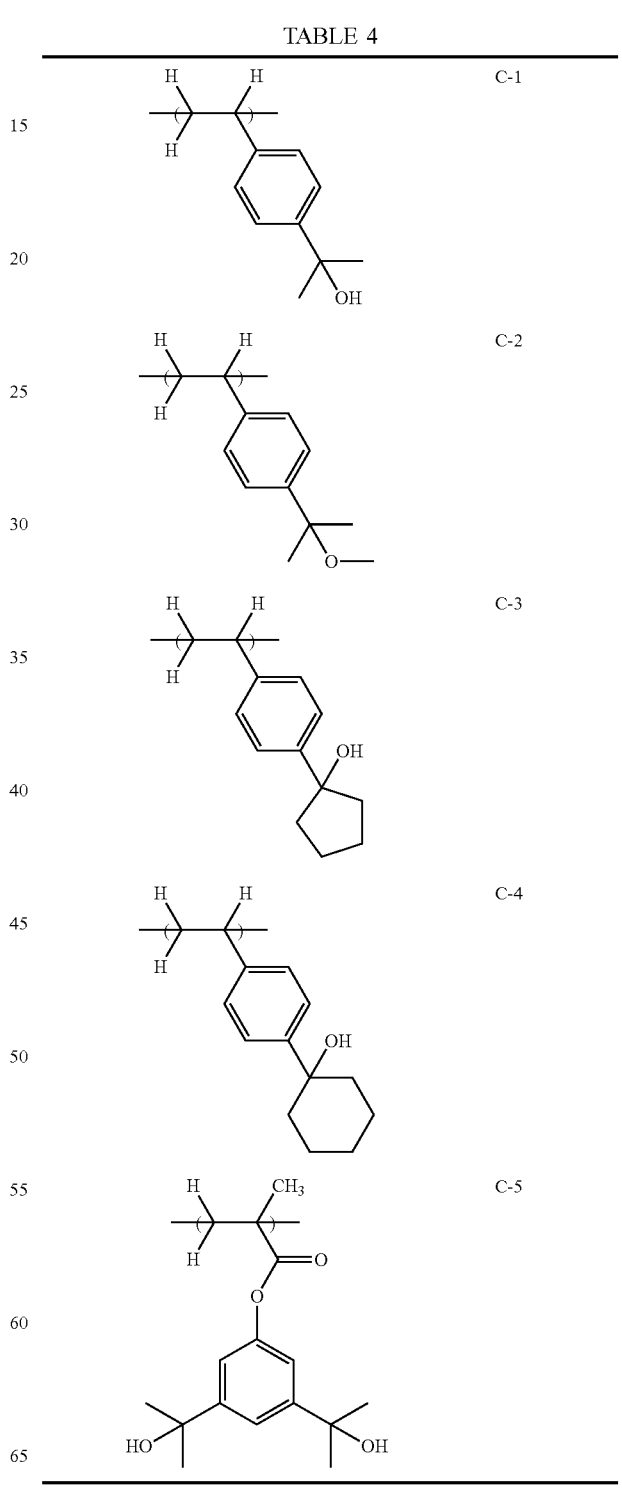

TABLE 5
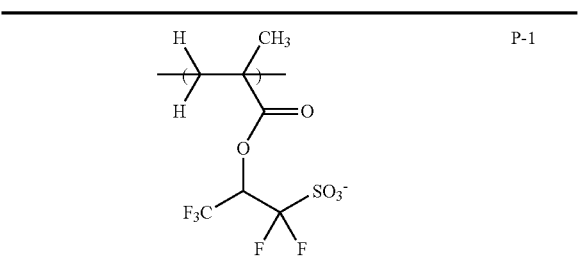
P-1
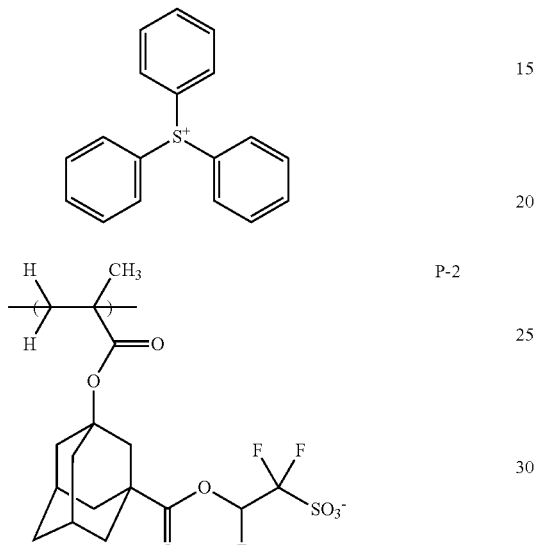
P-2
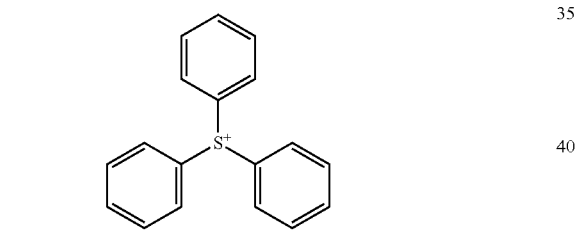
P-3
TABLE 5-continued
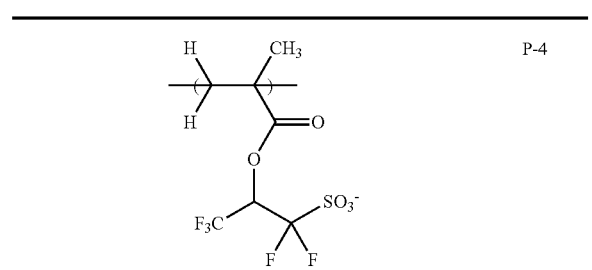
P-4
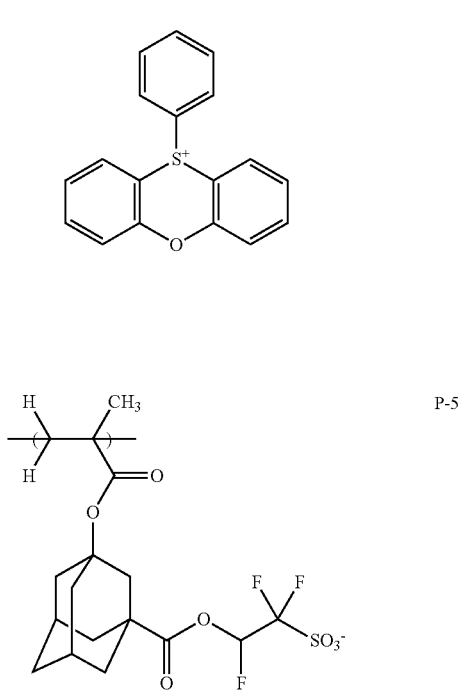
P-5
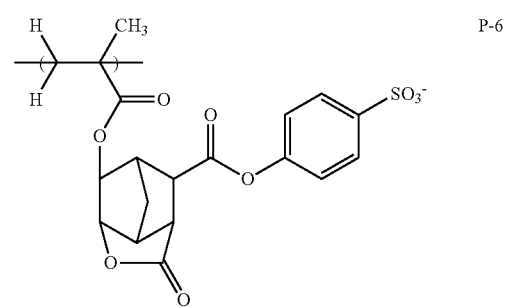
P-6

TABLE 5-continued

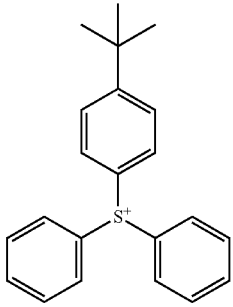

[4] Preparation of Negative Resist Compositions

Examples 1-1 to 1-39 and Comparative Examples 1-1 to 1-7

A negative resist composition in solution form was prepared by dissolving a base polymer (Polymers A1 to A20), an acid generator (PAG-1 to PAG-6, c-PAG-1 to c-PAG-5, PAG-A, PAG-B), a quencher (Q-1 to Q-3), a fluorinated polymer (Polymers D1 to D3), a crosslinker (tetramethoxymethylglycoluril (TMGU)), and a surfactant (PF-636, Omnova Solutions Inc.) in an organic solvent in accordance with the recipe shown in Tables 6 to 8, and filtering through a UPE filter and/or nylon filter with a pore size of 0.02 μm.

In Tables 6 to 8, the organic solvent used in Examples 1-1 to 1-23 and Comparative Examples 1-1 to 1-2 is a mixture of 249 parts by weight of propylene glycol monomethyl ether acetate (PGMEA) and 655 parts by weight of ethyl lactate (EL). The organic solvent used in Examples 1-24 to 1-39 and Comparative Examples 1-3 to 1-7 is a mixture of 1,204 parts by weight of PGMEA, 1,204 parts by weight of EL, and 1,606 parts by weight of propylene glycol monomethyl ether (PGME).

TABLE 6

| | | Resist composition | Resin 1 (pbw) | Resin 2 (pbw) | Acid generator (pbw) | Quencher (pbw) | Crosslinker (pbw) | Fluorinated polymer (pbw) | Surfactant (pbw) |
|---|---|---|---|---|---|---|---|---|---|
| Example | 1-1 | R-1 | Polymer A1 (80) | — | PAG-A (2) PAG-1 (8) | Q-1 (4.5) | TMGU (8.154) | — | PF-636 (0.075) |
| | 1-2 | R-2 | Polymer A1 (80) | — | PAG-A (2) PAG-1 (8) | Q-1 (4.4) | TMGU (8.154) | Polymer D1 (3) | PF-636 (0.075) |
| | 1-3 | R-3 | Polymer A1 (80) | — | PAG-A (2) PAG-1 (8) | Q-1 (4.4) | TMGU (8.154) | Polymer D2 (3) | PF-636 (0.075) |
| | 1-4 | R-4 | Polymer A1 (80) | — | PAG-A (2) PAG-1 (8) | Q-1 (4.4) | TMGU (8.154) | Polymer D3 (3) | PF-636 (0.075) |
| | 1-5 | R-5 | Polymer A2 (80) | — | PAG-1 (10) | Q-1 (4.5) | TMGU (8.154) | — | PF-636 (0.075) |
| | 1-6 | R-6 | Polymer A3 (80) | — | PAG-2 (10) | Q-1 (4.8) | — | — | — |
| | 1-7 | R-7 | Polymer A4 (80) | — | PAG-2 (10) | Q-1 (4.3) | — | — | — |
| | 1-8 | R-8 | Polymer A5 (80) | — | PAG-2 (10) | Q-1 (4.5) | — | — | — |
| | 1-9 | R-9 | Polymer A6 (80) | — | PAG-2 (10) | Q-1 (4.4) | — | — | — |
| | 1-10 | R-10 | Polymer A7 (80) | — | PAG-2 (10) | Q-1 (5.0) | — | — | — |
| | 1-11 | R-11 | Polymer A8 (80) | — | PAG-2 (5) | Q-1 (5.5) | — | — | — |
| | 1-12 | R-12 | Polymer A9 (80) | — | PAG-2 (2) | Q-1 (5.5) | — | — | — |
| | 1-13 | R-13 | Polymer A10 (80) | — | PAG-2 (5) | Q-1 (5.5) | — | — | — |
| | 1-14 | R-14 | Polymer A11 (80) | — | PAG-2 (5) | Q-1 (4.0) | — | — | — |
| | 1-15 | R-15 | Polymer A12 (80) | — | PAG-2 (5) | Q-1 (5.5) | — | — | — |
| | 1-16 | R-16 | Polymer A13 (80) | — | PAG-2 (5) | Q-1 (5.3) | — | — | — |
| | 1-17 | R-17 | Polymer A14 (80) | — | PAG-2 (5) | Q-1 (4.0) | — | — | — |
| | 1-18 | R-18 | Polymer A15 (80) | — | PAG-2 (5) | Q-1 (6.2) | — | — | — |
| | 1-19 | R-19 | Polymer A16 (80) | — | PAG-2 (5) | Q-1 (6.2) | — | — | — |
| | 1-20 | R-20 | Polymer A17 (80) | — | PAG-2 (10) | Q-1 (5.2) | — | — | — |
| | 1-21 | R-21 | Polymer A18 (80) | — | PAG-2 (5) | Q-1 (5.1) | — | — | — |
| | 1-22 | R-22 | Polymer A19 (80) | — | PAG-2 (10) | Q-1 (4.0) | — | — | — |
| | 1-23 | R-23 | Polymer A20 (80) | — | PAG-2 (5) | Q-1 (4.2) | — | — | — |

TABLE 7

| | | Resist composition | Resin 1 (pbw) | Resin 2 (pbw) | Acid generator (pbw) | Quencher (pbw) | Crosslinker (pbw) | Fluorinated polymer (pbw) | Surfactant (pbw) |
|---|---|---|---|---|---|---|---|---|---|
| Example | 1-24 | R-24 | Polymer A8 (40) | Polymer A3 (40) | PAG-1 (7) | Q-1 (5.2) | — | — | — |
| | 1-25 | R-25 | Polymer A8 (40) | Polymer A3 (40) | PAG-2 (7) | Q-1 (5.0) | — | — | — |
| | 1-26 | R-26 | Polymer A8 (40) | Polymer A3 (40) | PAG-2 (7) | Q-1 (5.0) | — | Polymer D1 (3) | — |
| | 1-27 | R-27 | Polymer A8 (40) | Polymer A3 (40) | PAG-2 (5) PAG-B (2) | Q-1 (5.2) | — | Polymer D1 (3) | — |
| | 1-28 | R-28 | Polymer A8 (40) | Polymer A3 (40) | PAG-2 (7) | Q-1 (5.0) | — | Polymer D2 (3) | — |
| | 1-29 | R-29 | Polymer A8 (40) | Polymer A3 (40) | PAG-2 (7) | Q-1 (5.0) | — | Polymer D3 (3) | — |
| | 1-30 | R-30 | Polymer A8 (40) | Polymer A3 (40) | PAG-2 (7) | Q-2 (4.0) | — | Polymer D1 (3) | — |
| | 1-31 | R-31 | Polymer A8 (40) | Polymer A3 (40) | PAG-2 (7) | Q-3 (3.0) | — | Polymer D1 (3) | — |
| | 1-32 | R-32 | Polymer A8 (40) | Polymer A3 (40) | PAG-2 (7) | Q-3 (3.0) | TMGU (2.0) | Polymer D1 (3) | — |
| | 1-33 | R-33 | Polymer A8 (40) | Polymer A3 (40) | PAG-3 (7) | Q-1 (4.8) | — | Polymer D1 (3) | — |
| | 1-34 | R-34 | Polymer A8 (40) | Polymer A3 (40) | PAG-4 (7) | Q-1 (4.9) | — | Polymer D1 (3) | — |
| | 1-35 | R-35 | Polymer A8 (40) | Polymer A3 (40) | PAG-5 (7) | Q-1 (4.9) | — | Polymer D1 (3) | — |
| | 1-36 | R-36 | Polymer A8 (40) | Polymer A3 (40) | PAG-6 (7) | Q-1 (4.9) | — | Polymer D1 (3) | — |
| | 1-37 | R-37 | Polymer A8 (40) | Polymer A19 (40) | PAG-3 (7) | Q-2 (2.5) | — | Polymer D1 (3) | — |
| | 1-38 | R-38 | Polymer A18 (40) | Polymer A17 (40) | PAG-2 (7) | Q-1 (5.4) | — | Polymer D1 (3) | — |
| | 1-39 | R-39 | Polymer A20 (40) | Polymer A19 (40) | PAG-3 (7) | Q-1 (3.0) | — | Polymer D1 (3) | — |

TABLE 8

| | | Resist composition | Resin 1 (pbw) | Resin 2 (pbw) | Acid generator (pbw) | Quencher (pbw) | Crosslinker (pbw) | Fluorinated polymer (pbw) | Surfactant (pbw) |
|---|---|---|---|---|---|---|---|---|---|
| Comparative Example | 1-1 | CR-1 | Polymer A1 (80) | — | PAG-A (2) c-PAG-1 (8) | Q-1 (4.5) | TMGU (8.154) | — | PF-636 (0.075) |
| | 1-2 | CR-2 | Polymer A3 (80) | — | c-PAG-1 (7) | Q-1 (5.2) | — | — | — |
| | 1-3 | CR-3 | Polymer A8 (40) | Polymer A3 (40) | c-PAG-1 (7) | Q-1 (5.2) | — | — | — |
| | 1-4 | CR-4 | Polymer A8 (40) | Polymer A3 (40) | c-PAG-2 (7) | Q-1 (5.2) | — | — | — |
| | 1-5 | CR-5 | Polymer A8 (40) | Polymer A3 (40) | c-PAG-3 (7) | Q-1 (5.2) | — | — | — |
| | 1-6 | CR-6 | Polymer A8 (40) | Polymer A3 (40) | c-PAG-4 (7) | Q-1 (5.2) | — | — | — |
| | 1-7 | CR-7 | Polymer A8 (40) | Polymer A3 (40) | c-PAG-5 (7) | Q-1 (5.2) | — | — | — |

The acid generators (PAG-1 to PAG-6, c-PAG-1 to c-PAG-5, PAG-A, PAG-B), quenchers (Q-1 to Q-3), and fluorinated polymers (Polymers D1 to D3) in Tables 6 to 8 are identified below.
PAG-1
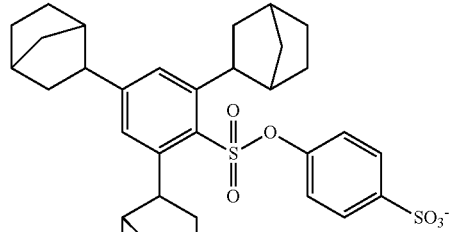
PAG-2
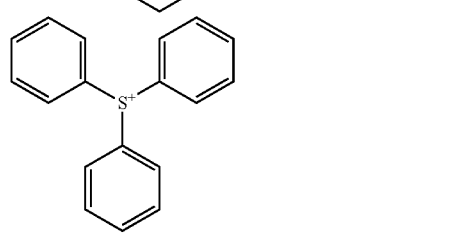
PAG-3
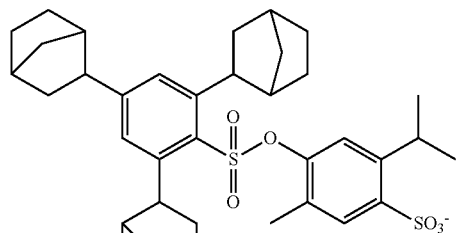
PAG-4
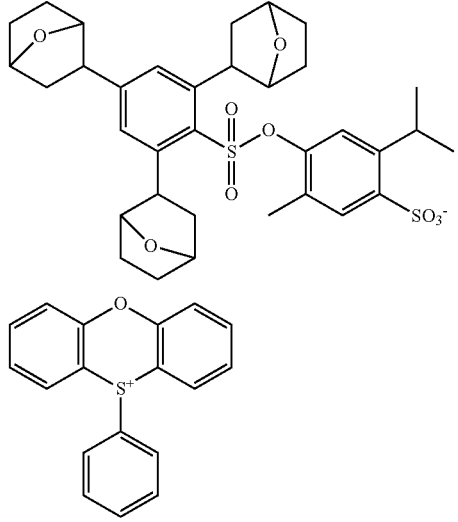
PAG-5
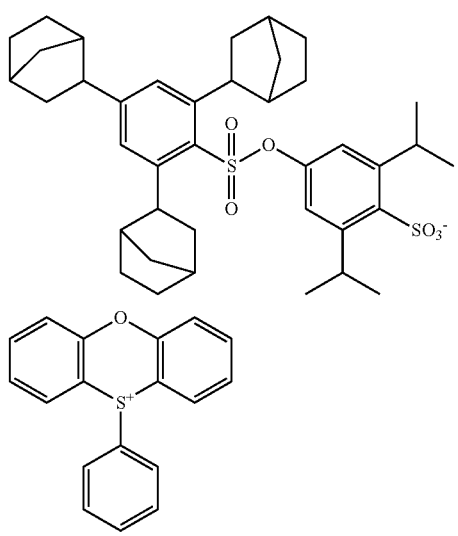
PAG-6
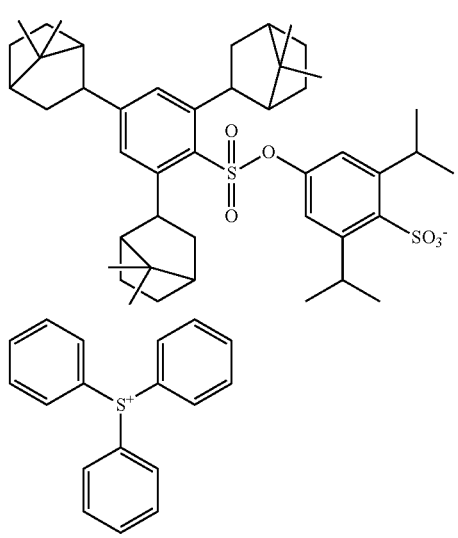

c-PAG-1
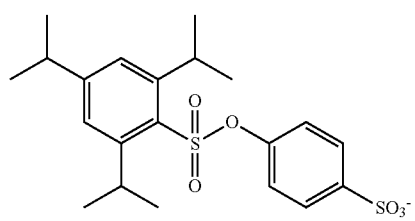
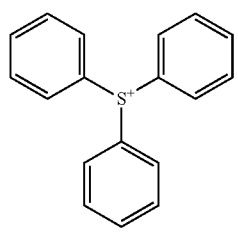
c-PAG-2
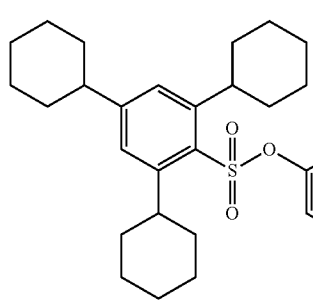
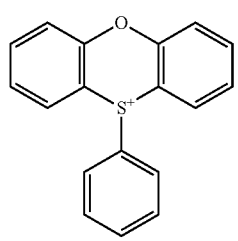
c-PAG-3
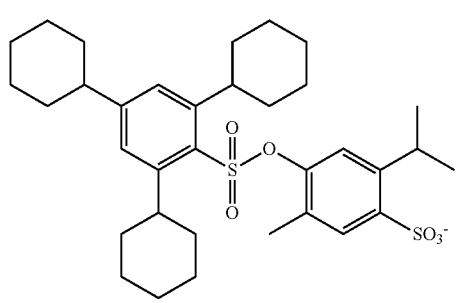
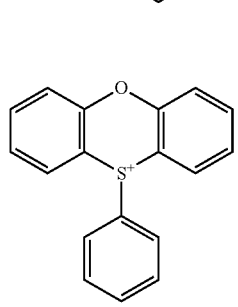
c-PAG-4
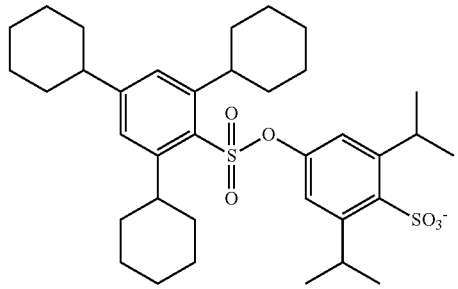
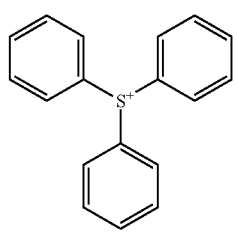
c-PAG-5
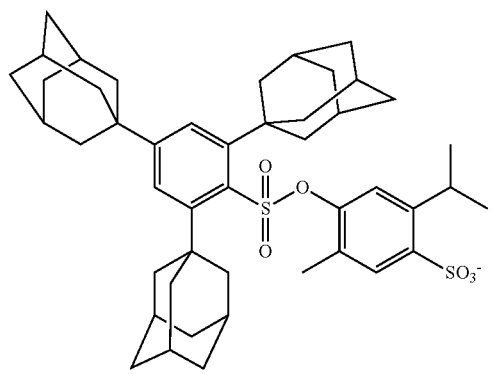
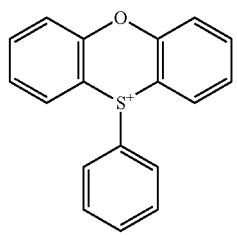
PAG-A
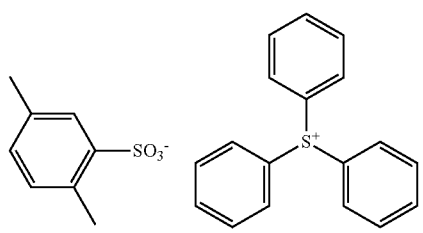

-continued

PAG-B

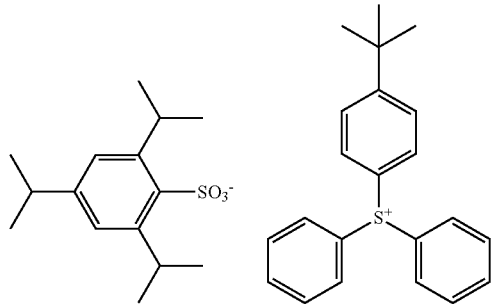

Q-1

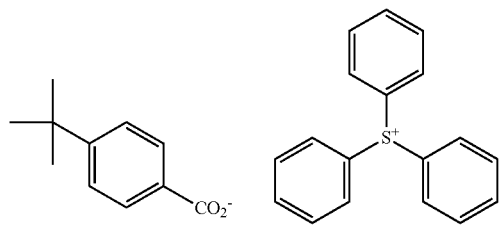

Q-2

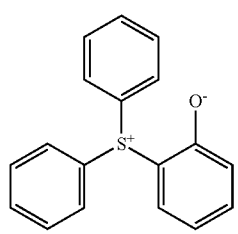 [SMILES: c1ccc([S+](c2ccccc2)c2ccccc2)cc1]

Q-3

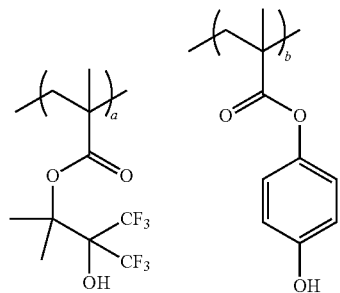

Polymer D1

(a - 0.80, b = 0.20, Mw = 6,000)

-continued

Polymer D2

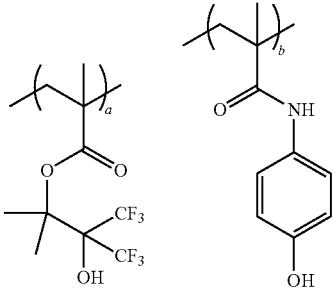

(a - 0.80, b = 0.20, Mw = 6,400)

Polymer D3

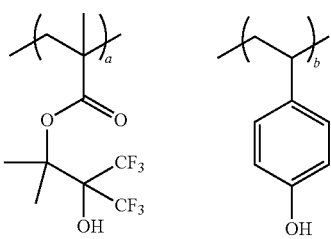

(a - 0.80, b = 0.20, Mw = 6,500)

[5] EB Writing Test

Examples 2-1 to 2-39 and Comparative Examples 2-1 to 2-7

Using a coater/developer system ACT-M (Tokyo Electron Ltd.), each of the negative resist compositions (R-1 to R-39 and CR-1 to CR-7) was spin coated onto a mask blank of 152 mm squares having the outermost surface of chromium and prebaked on a hot plate at 110° C. for 600 seconds to form a resist film of 80 nm thick. The thickness of the resist film was measured by an optical film thickness measurement system Nanospec (Nanometrics Inc.). Measurement was made at 81 points in the plane of the blank substrate excluding a peripheral band extending 10 mm inward from the blank periphery, and an average film thickness and a film thickness range were computed therefrom.

The coated mask blanks were exposed to electron beam using an EB writer system EBM-5000Plus (NuFlare Technology Inc., accelerating voltage 50 kV), then baked (PEB) at 120° C. for 600 seconds, and developed in a 2.38 wt % TMAH aqueous solution, thereby yielding negative patterns.

The patterned mask blank was observed under a top-down scanning electron microscope (TDSEM). The optimum exposure (Eop) was defined as the exposure dose ($\mu C/cm^2$) which provided a 1:1 resolution at the top and bottom of a 200-nm 1:1 line-and-space (LS) pattern. The maximum resolution of the resist was defined as the minimum line width of a LS pattern that could be resolved at the optimum exposure. The LER of a 200-nm LS pattern was measured under SEM. After a dot pattern with dots of 100 nm square was printed at the exposure dose which provides square resolution of 200 nm square, a loss of area (area loss, %) at the corner of the dot pattern was measured under SEM. On observation in cross section of the resist pattern under SEM, it was visually judged whether or not the pattern profile was rectangular. The results are shown in Tables 9 and 10.

TABLE 9

| | | Resist composition | Eop, μC/cm² | Maximum resolution, nm | LER, nm | Area loss, % | Dot pattern profile |
|---|---|---|---|---|---|---|---|
| Example | 2-1 | R-1 | 51 | 40 | 4.8 | 14.0 | rectangular |
| | 2-2 | R-2 | 51 | 40 | 4.9 | 14.1 | rectangular |
| | 2-3 | R-3 | 50 | 40 | 4.9 | 14.2 | rectangular |
| | 2-4 | R-4 | 50 | 40 | 4.9 | 14.2 | rectangular |
| | 2-5 | R-5 | 51 | 40 | 4.8 | 14.1 | rectangular |
| | 2-6 | R-6 | 50 | 35 | 4.6 | 13.5 | rectangular |
| | 2-7 | R-7 | 50 | 35 | 4.7 | 13.6 | rectangular |
| | 2-8 | R-8 | 50 | 35 | 4.7 | 13.6 | rectangular |
| | 2-9 | R-9 | 50 | 35 | 4.7 | 13.5 | rectangular |
| | 2-10 | R-10 | 49 | 40 | 4.6 | 13.4 | rectangular |
| | 2-11 | R-11 | 50 | 35 | 4.5 | 13.3 | rectangular |
| | 2-12 | R-12 | 50 | 35 | 4.5 | 13.4 | rectangular |
| | 2-13 | R-13 | 51 | 35 | 4.6 | 13.5 | rectangular |
| | 2-14 | R-14 | 51 | 35 | 4.7 | 13.6 | rectangular |
| | 2-15 | R-15 | 52 | 35 | 4.6 | 13.3 | rectangular |
| | 2-16 | R-16 | 51 | 35 | 4.6 | 13.2 | rectangular |
| | 2-17 | R-17 | 52 | 35 | 4.7 | 13.0 | rectangular |
| | 2-18 | R-18 | 49 | 35 | 4.7 | 13.1 | rectangular |
| | 2-19 | R-19 | 49 | 35 | 4.6 | 13.1 | rectangular |
| | 2-20 | R-20 | 50 | 35 | 4.6 | 13.2 | rectangular |
| | 2-21 | R-21 | 50 | 35 | 4.5 | 13.1 | rectangular |
| | 2-22 | R-22 | 51 | 35 | 4.6 | 13.2 | rectangular |
| | 2-23 | R-23 | 51 | 35 | 4.5 | 13.1 | rectangular |
| | 2-24 | R-24 | 51 | 35 | 4.6 | 13.4 | rectangular |
| | 2-25 | R-25 | 50 | 35 | 4.5 | 13.0 | rectangular |
| | 2-26 | R-26 | 51 | 35 | 4.5 | 13.1 | rectangular |
| | 2-27 | R-27 | 51 | 35 | 4.6 | 12.9 | rectangular |
| | 2-28 | R-28 | 51 | 35 | 4.7 | 13.1 | rectangular |
| | 2-29 | R-29 | 51 | 35 | 4.7 | 13.1 | rectangular |
| | 2-30 | R-30 | 50 | 35 | 4.6 | 12.9 | rectangular |
| | 2-31 | R-31 | 50 | 35 | 4.6 | 13.2 | rectangular |
| | 2-32 | R-32 | 51 | 35 | 4.5 | 12.8 | rectangular |
| | 2-33 | R-33 | 51 | 35 | 4.5 | 12.9 | rectangular |
| | 2-34 | R-34 | 51 | 35 | 4.6 | 13.0 | rectangular |
| | 2-35 | R-35 | 51 | 35 | 4.5 | 13 | rectangular |
| | 2-36 | R-36 | 50 | 40 | 4.8 | 13.5 | rectangular |
| | 2-37 | R-37 | 49 | 35 | 4.7 | 13.4 | rectangular |
| | 2-38 | R-38 | 48 | 35 | 4.7 | 13.3 | rectangular |
| | 2-39 | R-39 | 50 | 35 | 4.3 | 13.2 | rectangular |

TABLE 10

| | | Resist composition | Eop, μC/cm² | Maximum resolution, nm | LER, nm | Area loss, % | Dot pattern profile |
|---|---|---|---|---|---|---|---|
| Comparative Example | 2-1 | CR-1 | 49 | 45 | 5.2 | 23.5 | corner rounding |
| | 2-2 | CR-2 | 50 | 45 | 5.1 | 22.3 | corner rounding |
| | 2-3 | CR-3 | 51 | 40 | 4.8 | 21.4 | corner rounding |
| | 2-4 | CR-4 | 50 | 40 | 4.7 | 20.2 | corner rounding |
| | 2-5 | CR-5 | 51 | 40 | 4.6 | 19.5 | corner rounding |
| | 2-6 | CR-6 | 50 | 40 | 4.5 | 20.3 | corner rounding |
| | 2-7 | CR-7 | 50 | 50 | 5.8 | — | T-top profile, resist residues |

The results in Tables 9 and 10 are reviewed. The negative resist compositions of Examples 2-1 to 2-39 which contain onium salts of formula (A) within the scope of the invention, are satisfactory in all of resolution, LER, area loss, and dot pattern profile. In contrast, the resist compositions of Comparative Examples 2-1 to 2-7 are inferior in area loss and form dot patterns of unsatisfactory profile. This is probably because the acid generator used has a less dissolution inhibitory effect so that four corners of the pattern feature are dissolved, resulting in corner rounding. In Comparative Example 2-7 where the acid generator used is excessively lipophilic, T-top profile and resist residues after dissolution (development) are observed in an attempt to form a dot pattern having dots which are as fine as 100 nm and uncompliant to resolution, and measurement is difficult.

It has been demonstrated that the chemically amplified negative resist composition containing an onium salt of formula (A) within the scope of the invention has an appropriate dissolution inhibitory effect and is successful in restraining corner rounding and forming a dot pattern of satisfactory profile.

Japanese Patent Application No. 2018-100564 is incorporated herein by reference. Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A chemically amplified negative resist composition comprising (A) an acid generator containing an onium salt having the formula (A):

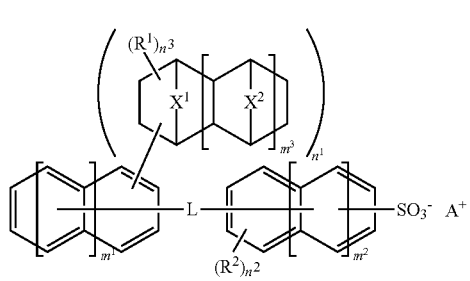

(A)

wherein $X^1$ and $X^2$ are each independently methylene, propane-2,2-diyl or ether bond, L is a single bond, ester bond, sulfonic acid ester bond, carbonate bond or carbamate bond, $R^1$ and $R^2$ are each independently a $C_1$-$C_{20}$ monovalent hydrocarbon group which may contain a heteroatom, $m^1$ and $m^2$ are each independently an integer of 0 to 2, $m^3$ is 0 or 1, $n^1$ is an integer satisfying $1 \leq n^1 \leq 5+2m^1$, $n^2$ is an integer satisfying $0 \leq n^2 \leq 4+2$ $m^2$, $n^3$ is an integer satisfying $0 \leq n^3 \leq 8+4$ $m^3$, $A^+$ is a sulfonium cation having the formula (A-A), an iodonium cation having the formula (A-B), or an ammonium cation having the formula (A-C):

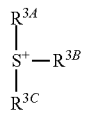

(A-A)

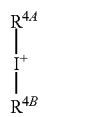

(A-B)

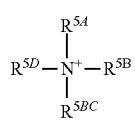

(A-C)

wherein $R^{3A}$, $R^{3B}$, $R^{3C}$, $R^{4A}$, $R^{4B}$, $R^{5A}$, $R^{5B}$, and $R^{5C}$ are each independently a $C_1$-$C_{20}$ monovalent hydrocarbon group which may contain a heteroatom, $R^{5D}$ is hydrogen or a $C_1$-$C_{20}$ monovalent hydrocarbon group which may contain a heteroatom, any two of $R^{3A}$, $R^{3B}$ and $R^{3C}$ or any two of $R^{5A}$, $R^{5B}$, $R^{5C}$ and $R^{5D}$ may bond together to form a ring with the sulfur or nitrogen atom to which they are attached, and (B) a base polymer containing a polymer comprising recurring units having the formula (B1):

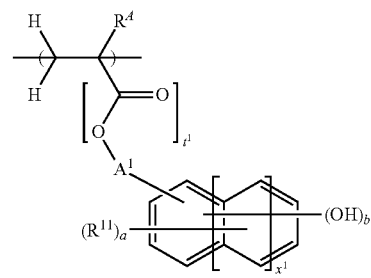

(B1)

wherein $R^A$ is hydrogen, fluorine, methyl or trifluoromethyl, $R^{11}$ is each independently halogen, an optionally halogenated $C_2$-$C_8$ acyloxy group, optionally halogenated $C_1$-$C_6$ alkyl group, or optionally halogenated $C_1$-$C_6$ alkoxy group, $A^1$ is a single bond or $C_1$-$C_{10}$ alkanediyl group in which an ether bond may intervene in a carbon-carbon bond, $t^1$ is 0 or 1, $x^1$ is an integer of 0 to 2, a is an integer satisfying $0 \leq a \leq 5+2x^1-b$, and b is an integer of 1 to 3.

2. The resist composition of claim 1 wherein the polymer further comprises recurring units of at least one type selected from recurring units having the formula (B2), recurring units having the formula (B3), and recurring units having the formula (B4):

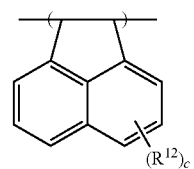

(B2)

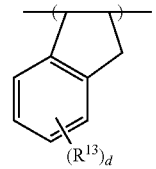

(B3)

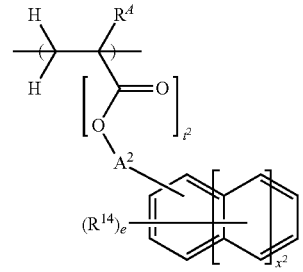

(B4)

wherein $R^A$ is as defined above, $R^{12}$ and $R^{13}$ are each independently hydroxyl, halogen, acetoxy, an optionally halogenated $C_1$-$C_8$ alkyl group, optionally halogenated $C_1$-$C_8$ primary alkoxy group, optionally halogenated $C_2$-$C_8$ secondary alkoxy group, optionally halogenated $C_2$-$C_8$ acyloxy group, or optionally halogenated $C_2$-$C_8$ alkylcarbonyloxy group, $R^{14}$ is an acetyl group, acetoxy group, $C_1$-$C_{20}$ alkyl group, $C_1$-$C_{20}$ primary alkoxy group, $C_2$-$C_{20}$ secondary alkoxy group, $C_2$-$C_{20}$ acyloxy group, $C_2$-$C_{20}$ alkoxyalkyl group, $C_2$-$C_{20}$ alkylthioalkyl group, halogen, nitro group or cyano group, $A^2$ is a single bond or $C_1$-$C_{10}$ alkanediyl group in which an ether bond may intervene in a carbon-carbon bond, c and d are each independently an integer of 0 to 4, e is an integer of 0 to 5, $x^2$ is an integer of 0 to 2, and $t^2$ is 0 or 1.

3. The resist composition of claim 1 wherein the polymer further comprises recurring units having the formula (B5):

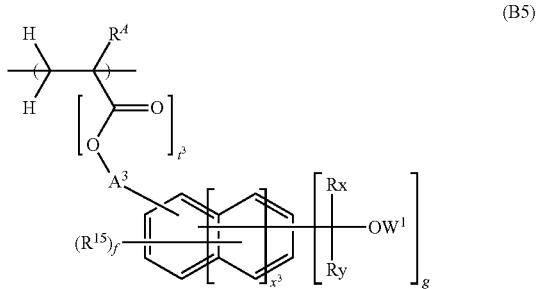
(B5)

wherein $R^A$ is as defined above, $A^3$ is a single bond or $C_1$-$C_{10}$ alkanediyl group in which an ether bond may intervene in a carbon-carbon bond, $R^{15}$ is each independently halogen, an optionally halogenated $C_2$-$C_8$ acyloxy group, optionally halogenated $C_1$-$C_6$ alkyl group, or optionally halogenated $C_1$-$C_6$ alkoxy group, $W^1$ is hydrogen, a $C_1$-$C_{10}$ aliphatic monovalent hydrocarbon group in which an ether bond, carbonyl moiety or carbonyloxy moiety may intervene in a carbon-carbon bond, or an optionally substituted monovalent aromatic group, Rx and Ry are each independently hydrogen, an optionally hydroxy or alkoxy-substituted $C_1$-$C_{15}$ alkyl group, or an optionally substituted monovalent aromatic group, excluding that both Rx and Ry are hydrogen at the same time, or Rx and Ry may bond together to form a ring with the carbon atom to which they are attached, $x^3$ is an integer of 0 to 2, $t^3$ is 0 or 1, f is an integer satisfying $0 \leq f \leq 5+2x^3-g$, and g is an integer of 1 to 3.

4. The resist composition of claim 3 wherein the polymer further comprises recurring units of at least one type selected from units having the formulae (B6) to (B11):

(B6)

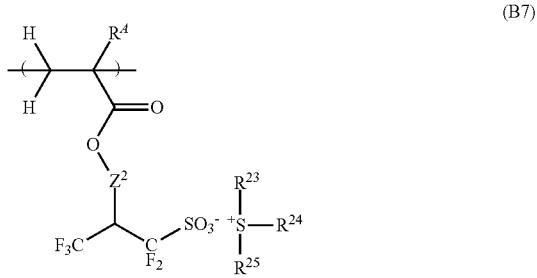
(B7)

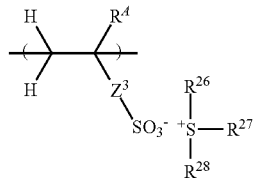
(B8)

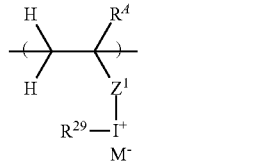
(B9)

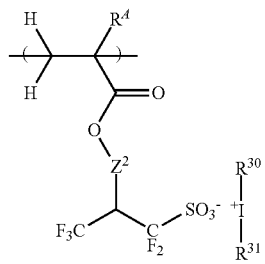
(B10)

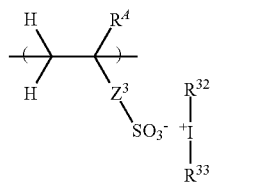
(B11)

wherein $R^A$ is as defined above, $Z^1$ is each independently a single bond, phenylene group, —O—$Z^{11}$—, —C(=O)—O—$Z^{11}$— or C(=O)—NH—$Z^{11}$—$Z^{11}$ is a $C_1$-$C_6$ alkanediyl, $C_2$-$C_6$ alkenediyl or phenylene group, which may contain a carbonyl, ester bond, ether bond or hydroxyl moiety, $Z^2$ is each independently a single bond or —$Z^{21}$—C(=O)—O—, $Z^{2'}$ is a $C_1$-$C_{20}$ divalent hydrocarbon group which may contain a heteroatom, $Z^3$ is each independently a single bond, methylene, ethylene, phenylene, fluorinated phenylene, —O—$Z^{31}$—, —C(=O)—O—$Z^{31}$—, or —C(=O)—NH—$Z^{31}$—, $Z^{31}$ is a $C_1$-$C_6$ alkanediyl, $C_2$-$C_6$ alkenediyl or phenylene group, which may contain a carbonyl, ester bond, ether bond or hydroxyl moiety, $R^{21}$ to $R^{33}$ are each independently a $C_1$-$C_{20}$ monovalent hydrocarbon group which may contain a heteroatom, or $R^{21}$ and $R^{22}$ may bond together to form a ring with the sulfur atom to which they are attached, or any two of $R^{23}$, $R^{24}$ and $R^{25}$ may bond together to form a ring with the sulfur atom to which they are attached, any two of $R^{26}$, $R^{27}$ and $R^{28}$ may bond together to form a ring with the sulfur atom to which they are attached, and $M^-$ is a non-nucleophilic counter ion.

5. The resist composition of claim 4 wherein the polymer comprises recurring units having the formula (B1-1), recurring units having the formula (B5-1), and recurring units having the formula (B7) or (B10):

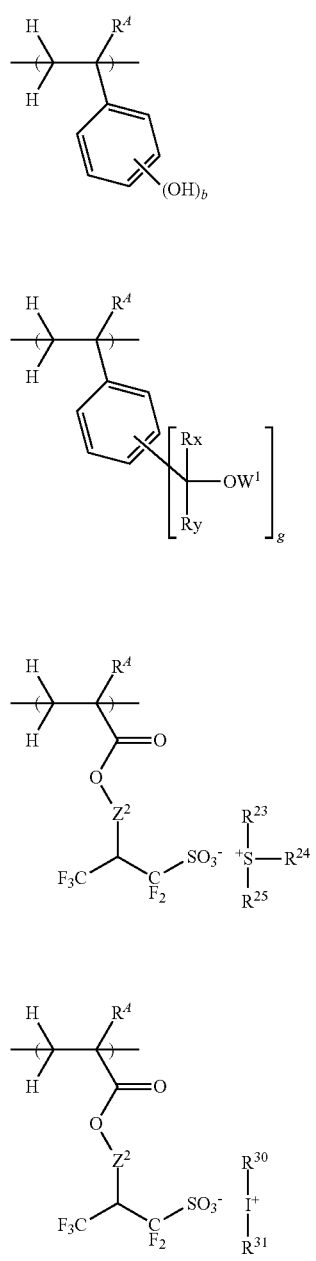
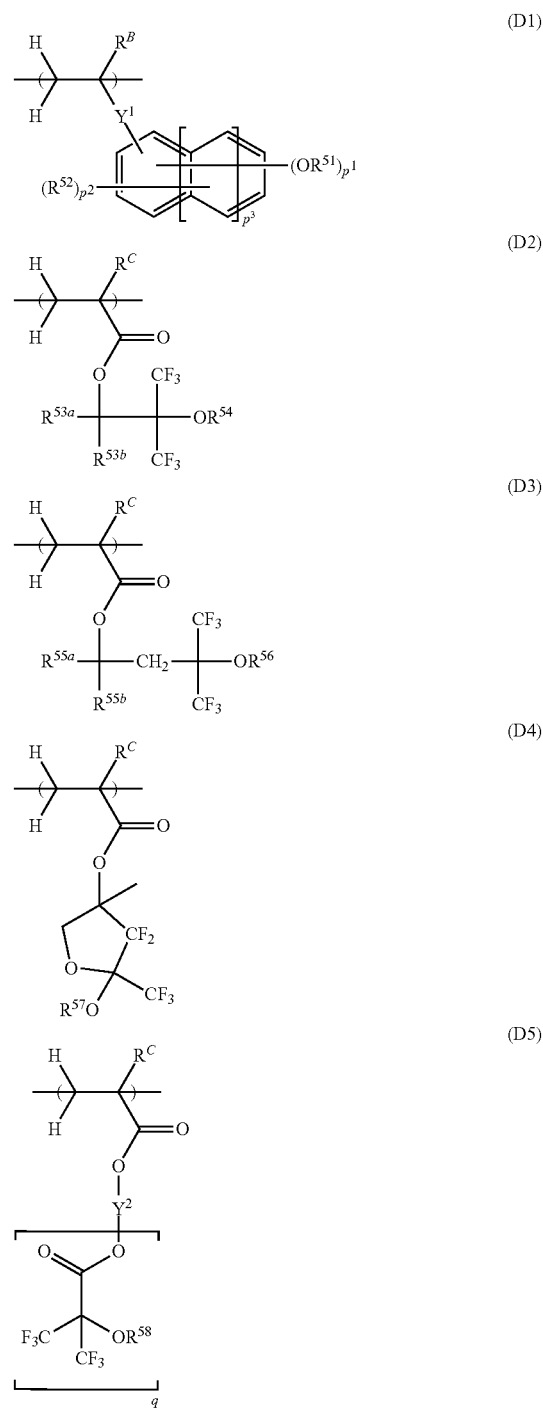

wherein $R^A$, $Z^2$, $R^{23}$, $R^{24}$, $R^{25}$, $R^{30}$, $R^{31}$, Rx, Ry, $W^1$, b, and g are as defined above.

6. The resist composition of claim 3 wherein the polymer comprises recurring units having the formula (B1) and recurring units having the formula (B5), but not recurring units having the formulae (B6) to (B11).

7. The resist composition of claim 3, which is free of a crosslinker.

8. The resist composition of claim 1, further comprising (C) a crosslinker.

9. The resist composition of claim 1, further comprising (D) a fluorinated polymer comprising recurring units having the formula (D1) and recurring units of at least one type selected from units having the formulae (D2), (D3), (D4), and (D5):

wherein $R^B$ is hydrogen or methyl,
$R^C$ is each independently hydrogen, fluorine, methyl or trifluoromethyl,
$R^{51}$ is hydrogen or a $C_1$-$C_5$ straight or branched monovalent hydrocarbon group in which a heteroatom-containing moiety may intervene in a carbon-carbon bond,
$R^{52}$ is a $C_1$-$C_5$ straight or branched monovalent hydrocarbon group in which a heteroatom-containing moiety may intervene in a carbon-carbon bond,
$R^{53a}$, $R^{53b}$, $R^{55a}$ and $R^{55b}$ are each independently hydrogen or a $C_1$-$C_{10}$ alkyl group, $R^{54}$, $R^{56}$, $R^{57}$ and $R^{58}$ are each independently hydrogen, a $C_1$-$C_{15}$ monovalent hydrocarbon group, $C_1$-$C_{15}$ monovalent fluorinated hydrocarbon group, or an acid labile group, with the proviso that an ether bond or carbonyl moiety may intervene in a carbon-carbon bond in the monovalent hydrocarbon groups or monovalent fluorinated hydrocarbon groups represented by $R^{54}$, $R^{56}$, $R^{57}$ and $R^{58}$, $Y^1$ is a single bond, —C(=O)—O— or —C(=O)—NH—, $Y^2$ is a $C_1$-$C_{20}$ (q+1)-valent hydrocarbon group or $C_1$-$C_{20}$ (q+1)-valent fluorinated hydrocarbon group, $p^1$ is an integer of 1 to 3, $p^2$ is an integer satisfying $0 \leq p^2 \leq 5+2p^3-p^1$, $p^3$ is 0 or 1, and q is an integer of 1 to 3.

10. The resist composition of claim 1, further comprising (E) an organic solvent.

11. The resist composition of claim 1, further comprising (F) a quencher.

12. The resist composition of claim 1 wherein the aromatic ring structure to which the bridged ring-containing group and L are attached is a structure having the formulae (1-1) to (1-13):

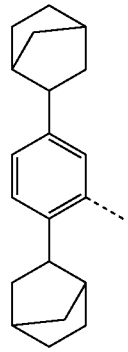
(1-1)

(1-2)

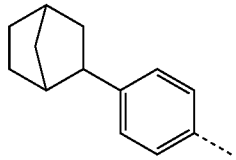
(1-3)

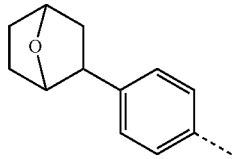
(1-4)

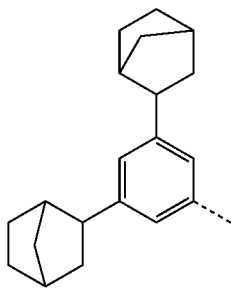
(1-5)

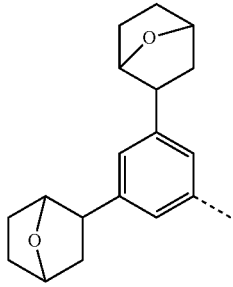
(1-6)

(1-7)

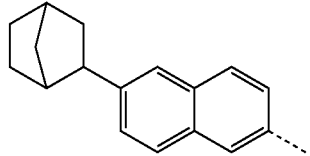
(1-8)

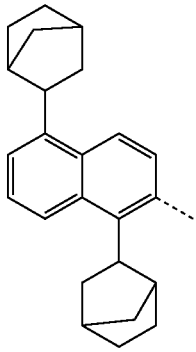
(1-9)

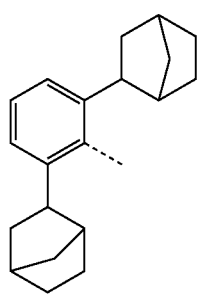

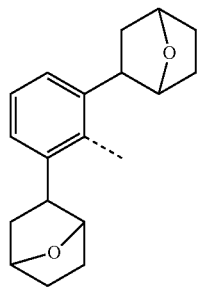

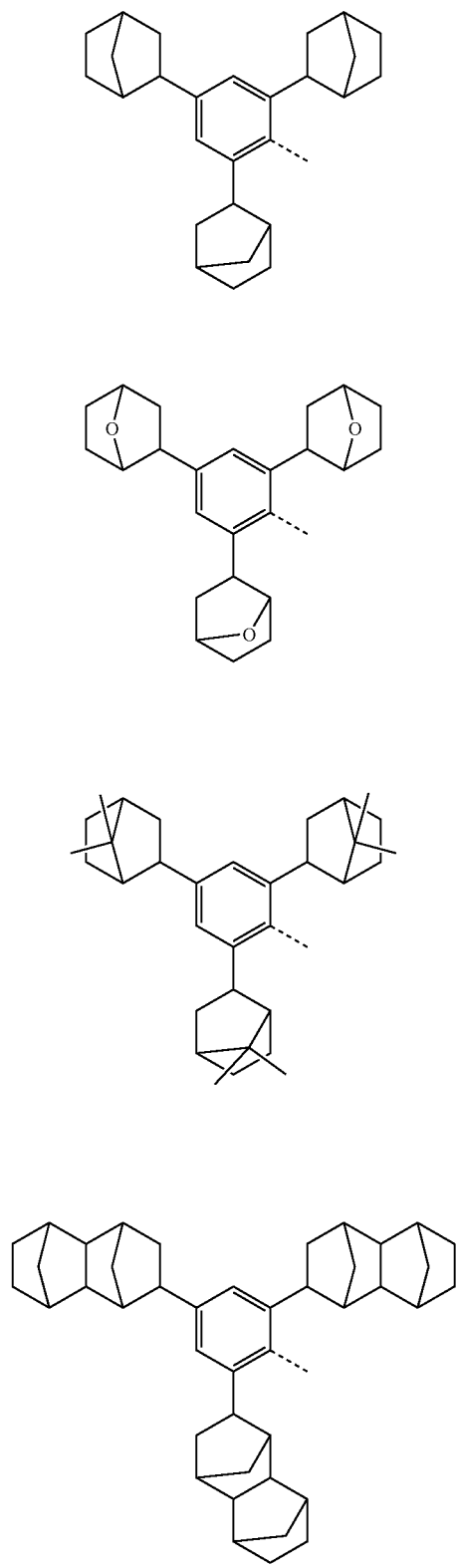
wherein the broken line designates a valence bond to L.
13. The resist composition of claim 1 wherein the anion of the onium salt having formula (1) is selected from the group consisting of the following formulae:
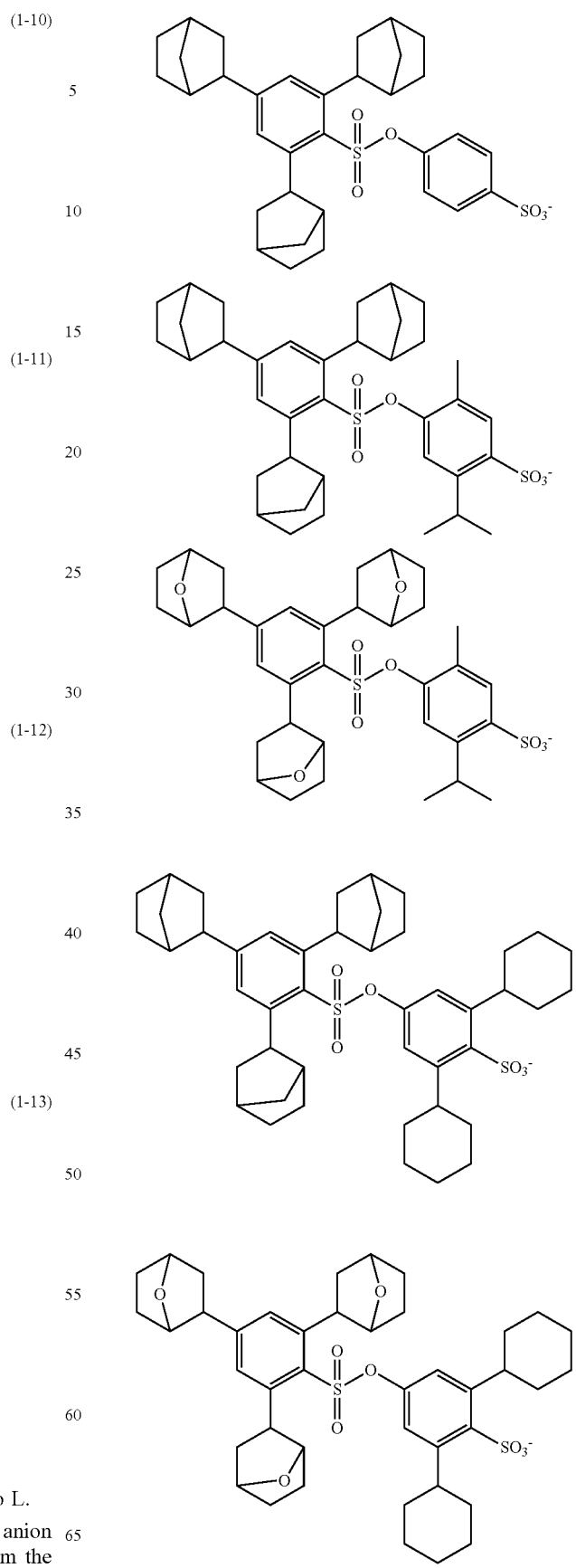

101
-continued
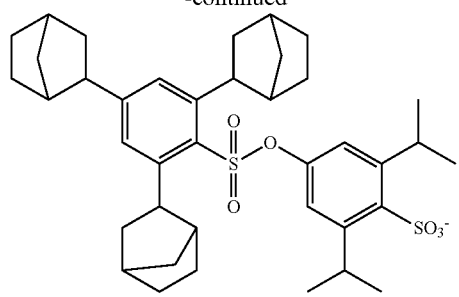
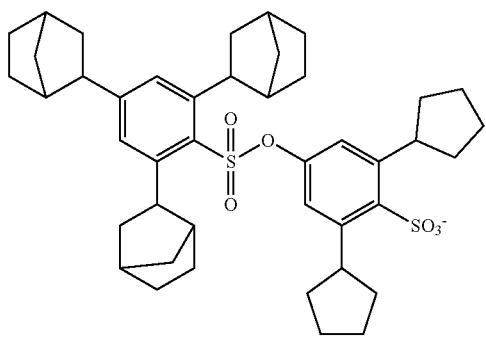
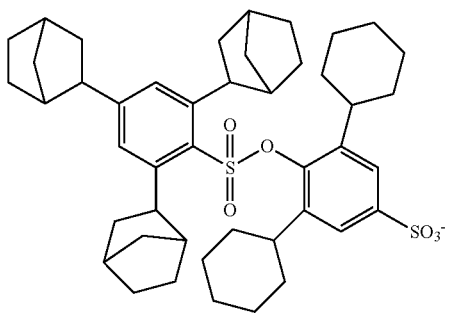
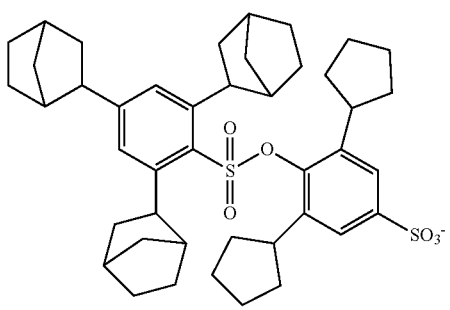
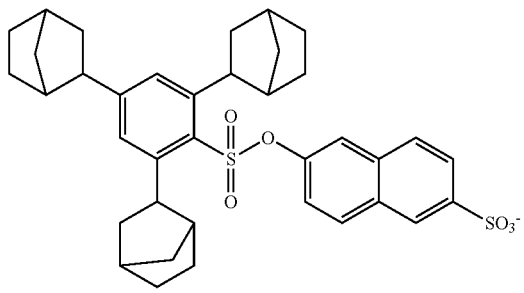
102
-continued
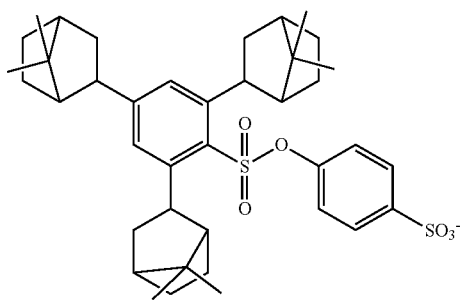
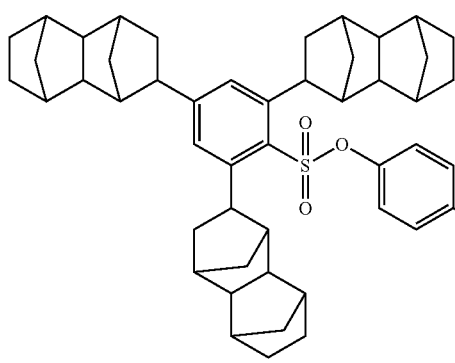
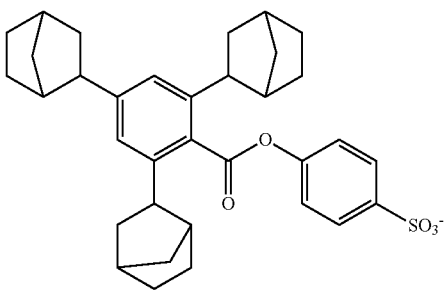
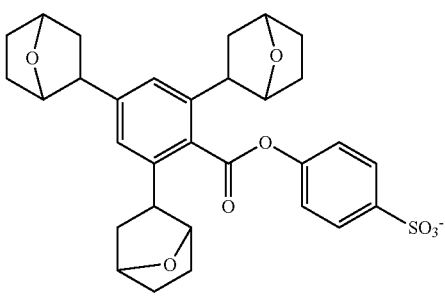

103
-continued

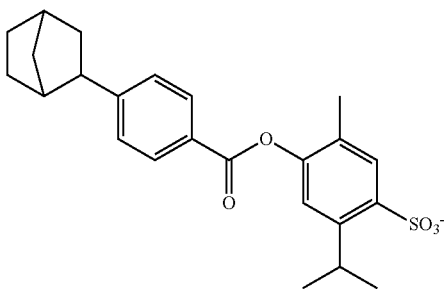

104
-continued

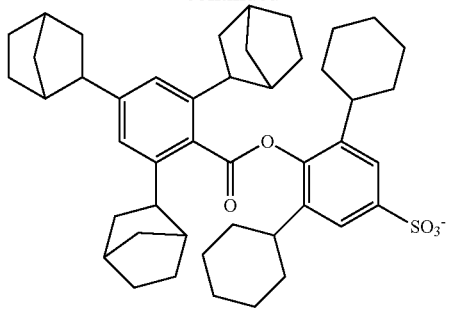

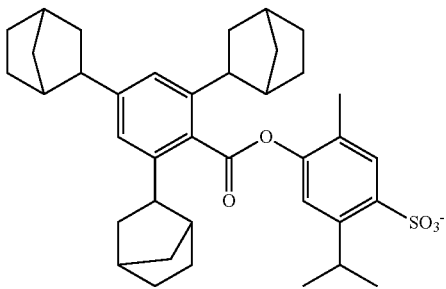

14. A resist pattern forming process comprising the steps of:
   applying the chemically amplified negative resist composition of claim 1 onto a substrate to form a resist film thereon,
   exposing the resist film patternwise to high-energy radiation, and
   developing the exposed resist film in an alkaline developer to form a resist pattern.

15. The process of claim 14 wherein the high-energy radiation is KrF excimer laser, EUV or EB.

16. The process of claim 14 wherein the substrate has an outermost surface of chromium-containing material.

17. The process of claim 14 wherein the substrate is a photomask blank.

* * * * *